(12) United States Patent
Shinohara

(10) Patent No.: US 8,432,033 B2
(45) Date of Patent: Apr. 30, 2013

(54) ELECTRONIC DEVICE AND MANUFACTURING METHOD THEREFOR

(75) Inventor: Minoru Shinohara, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 180 days.

(21) Appl. No.: 12/851,618

(22) Filed: Aug. 6, 2010

(65) Prior Publication Data

US 2011/0037170 A1 Feb. 17, 2011

(30) Foreign Application Priority Data

Aug. 12, 2009 (JP) ................................. 2009-187214

(51) Int. Cl.
*H01L 23/48* (2006.01)

(52) U.S. Cl.
USPC .................................. 257/737; 257/E23.021

(58) Field of Classification Search .......... 257/737–738, 257/E23.021, 777–781, 784, 685–686
See application file for complete search history.

(56) References Cited

U.S. PATENT DOCUMENTS 7,705,469 B2 * 4/2010 Yoshida ........................ 257/777

FOREIGN PATENT DOCUMENTS

| JP | 11-163249 A | 6/1999 |
|---|---|---|
| JP | 2008-91418 A | 4/2008 |

* cited by examiner

*Primary Examiner* — Hoa B Trinh
(74) *Attorney, Agent, or Firm* — Miles & Stockbridge P.C.

(57) ABSTRACT

Reduction of the size of and enhancement of the reliability, mounting strength, and mounting reliability of a semiconductor module are achieved. The semiconductor module includes: a wiring substrate; an electronic component placed over the upper surface of the wiring substrate; an electronic component placed over the under surface of the wiring substrate; a lead placed over the under surface of the wiring substrate; and encapsulation resin covering the under surface of the wiring substrate including the electronic component and the lead. The lead includes: a first portion coupled to an electrode pad via a joining material; a second portion bent from the first portion; and a third portion bent from the second portion. The third portion is positioned closer to the peripheral edge portion side of the under surface of the wiring substrate than the first portion. At the same time, the third portion is arranged at a position farther from the under surface of the wiring substrate than the first portion. The third portion of the lead is exposed from the main surface and side surface of the encapsulation resin and functions as a terminal for external coupling.

10 Claims, 36 Drawing Sheets

ELECTRONIC DEVICE AND MANUFACTURING METHOD THEREFOR

CROSS-REFERENCE TO RELATED APPLICATIONS

The disclosure of Japanese Patent Application No. 2009-187214 filed on Aug. 12, 2009 including the specification, drawings and abstract is incorporated herein by reference in its entirety.

BACKGROUND OF THE INVENTION

The present invention relates to electronic devices and manufacturing methods therefor and in particular to a technology effectively applicable to an electronic device obtained by placing an electronic component over a wiring substrate and a manufacturing method therefor.

For example, electronic equipment for carrying out wireless communication is formed by placing the following various components over a mounting board (mother board): an antenna member, a semiconductor device for controlling signals, a crystal resonator, a resistance element, a capacitive element, and the like.

Japanese Unexamined Patent Publication No. Hei 11 (1999)-163249 (Patent Document 1) describes a technology related to a semiconductor device including: a flat plate-like first wiring substrate; a second wiring substrate having an opening and lapped over the first wiring substrate; an electrical conducting means placed between the surfaces of the two wiring substrates and partly electrically coupling them together; and a semiconductor chip coupled to over the first wiring substrate within the opening in the second wiring substrate.

Japanese Unexamined Patent Publication No. 2008-91418 (Patent Document 2) describes a technology related to a semiconductor device including: a first resin body; a second resin body lapped over and integrated with the first resin body; a first electronic component located in the first resin body; and a second electronic component located in the second resin body.

[Patent Document 1]
Japanese Unexamined Patent Publication No. Hei 11 (1999)-163249
[Patent Document 2]
Japanese Unexamined Patent Publication No. 2008-91418

SUMMARY OF THE INVENTION

The investigation by the present inventors revealed the following:

Attempts have been made to incorporate a wireless communication device into various goods and in recent years, demands for incorporation into mobile goods have also risen. For this reason, the following has been considered to achieve the reduction of the size of a mounting board comprising wireless communication devices and the enhancement of communication speed: placing various components comprising a wireless communication device in one semiconductor device, or so-called modularization.

For this purpose, it is possible to adopt, for example, a configuration in which components are placed over the front and back surfaces of a wiring substrate (interposer) in BGA (Ball Grid Array) semiconductor devices. The components can be mounted over the mounting board via solder members (solder balls) as external terminals, formed in the back surface (mounting surface) of the wiring substrate.

When solder members (solder balls) are used as external terminals, however, it is required to make the height (thickness) of the solder members larger than a semiconductor chip or a chip component placed on the back surface side of the wiring substrate. To increase the height of solder members (solder balls), the quantity of solder used for the solder members could be increased. However, increase in the quantity of solder also increases the outside dimensions of the formed solder balls. In the back surface of a wiring substrate, there are formed multiple lands (electrodes for coupling solder balls). If the pitch between lands is reduced to reduce the size of a semiconductor device, there is a possibility that adjacent solder balls are brought into contact with each other. Solder balls become more prone to be brought into contact with one another with increase in the outside dimensions of each solder ball; therefore, it is required to increase the pitch between adjacent lands. For this reason, it is difficult to reduce the size (area) of the above BGA semiconductor device.

Consequently, the present inventors investigated the configuration described in Patent Document 1. However, there is the following possibility when external terminals are formed of a wiring substrate as described in Patent Document 1: only part of the wiring substrate is covered with encapsulation resin and thus the wiring substrate forming the external terminals can be released from the encapsulation resin. This leads to degraded reliability (guaranteed quality) of the semiconductor device.

Next, the present inventors investigated the configuration described in Patent Document 2. As described in Patent Document 2, the tips of leads that becomes external terminals are not exposed in the side surface of a resin body, that is, the tips of the leads are exposed from only one surface (mounting surface) of the resin body. With this configuration, it is difficult to enhance the mounting strength. Since part of the leads is not exposed in the side surface of the resin body, it is difficult to check whether a solder material used for mounting is reliably coupled to (wetted up) a lead. This makes it difficult to enhance the mounting reliability of a semiconductor device.

It is an object of the invention to provide a technology that enables reduction of the size of an electronic device even when a large number of semiconductor components required to build a wireless communication system or the like are incorporated into the one electronic device.

It is another object of the invention to provide a technology that enables enhancement of the reliability (guaranteed quality) of an electronic device.

It is further another object of the invention to provide a technology that enables enhancement of the mounting strength of an electronic device.

It is further another object of the invention to provide a technology that enables enhancement of the mounting reliability of an electronic device.

The above and other objects and novel features of the invention will be apparent from the description in this specification and the accompanying drawings.

The following is a brief description of the gist of the representative elements of the invention laid open in this application:

An electronic device in a representative embodiment is an electronic device in which: at least one second electronic component and multiple leads are placed over the under surface of a wiring substrate and sealed with a sealing body; and at least one first electronic component is placed over the upper surface of the wiring substrate. Each lead integrally includes: a first portion extended along the under surface of the wiring substrate; a second portion bent from the first portion in a direction away from the under surface of the wiring substrate; and a third portion bent from the second portion. The third portion of each lead is positioned closer to a peripheral edge portion of the under surface of the wiring substrate than the first portion of the under surface of the wiring substrate than the first portion. Each lead is covered with the sealing body such that its third portion is exposed from the front surface and side surface of the sealing body.

A manufacturing method for electronic devices in a representative embodiment is a manufacturing method for an electronic device in which: at least one second electronic component and multiple leads are placed over the under surface of a wiring substrate and sealed with a sealing body; and at least one first electronic component is placed over the upper surface of the wiring substrate. The manufacturing method includes: a first step for placing a lead frame having multiple leads and the second electronic component over the first main surface of a wiring substrate parent body; a second step for forming a resin sealing body sealing the second electronic component and the leads over the first main surface of the wiring substrate parent body; a third step for placing the first electronic component over the second main surface of the wiring substrate parent body; and a fourth step for cutting the resin sealing body, wiring substrate parent body, and lead frame. The first step includes a solder reflow step for soldering the leads of the lead frame to the first main surface of the wiring substrate parent body. This solder reflow step is carried out with the relative positions of the lead frame and the wiring substrate parent body fixed. At the second step, the resin sealing body is so formed that part of each lead is exposed from the resin sealing body.

The following is a brief description of the gist of effects obtained by the representative elements of the invention laid open in this application:

According to a representative embodiment, the size of an electronic device can be reduced.

The reliability (guaranteed quality) of an electronic device can be enhanced.

The mounting strength of an electronic device can be enhanced.

The mounting reliability of an electronic device can be enhanced.

DETAILED DESCRIPTION OF THE PREFERRED EMBODIMENTS

Figure 1:
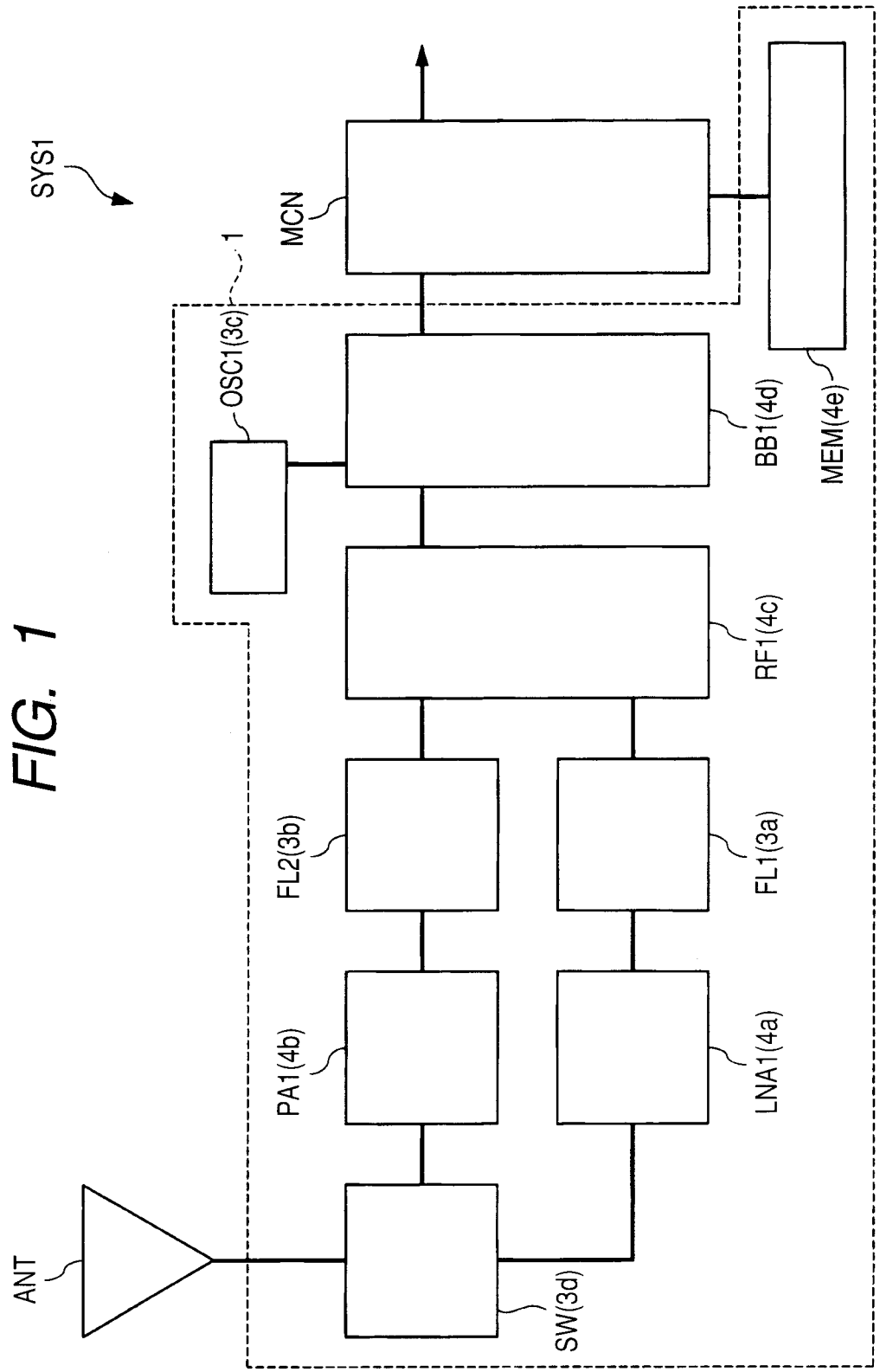
FIG. 1 is a block diagram illustrating an example of a wireless communication system.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number. In the following description of embodiments, needless to add, their constituent elements (including elemental steps and the like) are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the invention with reference to the drawings. In all the drawings for explaining embodiments, members having the same function will be marked with the same reference numerals and the repetitive description thereof will be omitted. With respect to the following embodiments, description will not be repeated about an identical or similar part unless necessary.

In every drawing used in the description of embodiments, hatching may be omitted to facilitate visualization even though it is a sectional view. Further, hatching may be provided to facilitate visualization even though it is a plan view.

First Embodiment

This embodiment is a semiconductor module for building a wireless communication system such as a wireless LAN.
<Configuration of Wireless Communication System>
FIG. 1 is a block diagram (circuit block diagram, explanatory drawing) illustrating an example of an ordinary wireless communication system (for example, wireless LAN) SYS1.

In the wireless communication system (wireless communication device) SYS1 illustrated in FIG. 1, a signal (radio frequency signal) received via an antenna ANT is passed via an antenna switch SW and is amplified by a low noise amplifier LNA1. It then goes via a filter FL1 for removing unwanted frequencies and is inputted to a high-frequency IC circuit portion RF1. It is there subjected to frequency conversion and demodulated to a base band signal and guided to a base band portion BB1. In the base band portion BB1, there are incorporated an A-D conversion circuit, a D-A conversion circuit, a channel CODEC, DSP (Digital Signal Processor), and the like. The base band signal inputted from the high-frequency IC circuit portion RF1 to the base band portion BB1 is subjected to A-D conversion (Analog-to-Digital conversion) via the A-D conversion circuit in the base band portion BB1 and varied digital signal processing is carried out. The A-D conversion circuit may be provided in the high-frequency IC circuit portion RF1. The base band portion BB1 is coupled to a control microcomputer (CPU) MCN and a memory MEM for storing various programs and data is coupled to this microcomputer MCN. The base band portion BB1 is also coupled with an oscillating element (oscillator) OSC1 for performing synchronous operation in the base band portion BB1.

The base band signal that underwent D-A conversion (Digital-to-Analog conversion) via the D-A conversion circuit in the base band portion BB1 is guided to the high-frequency IC circuit portion RF1. It is modulated via the high-frequency IC circuit portion RF1, subjected to frequency conversion, and converted into a transmit signal (radio frequency signal). Thereafter, it goes via a filter FL2 for removing unwanted frequencies and is amplified via a power amplifier (power amplifier circuit portion) PA1, and transmitted from the antenna ANT via the antenna switch SW. The D-A conversion circuit may be provided in the high-frequency IC circuit portion RF1. In the wireless communication system SYS1 in FIG. 1, the portion encircled with a broken line is comprised of a semiconductor module 1.

Figure 2:
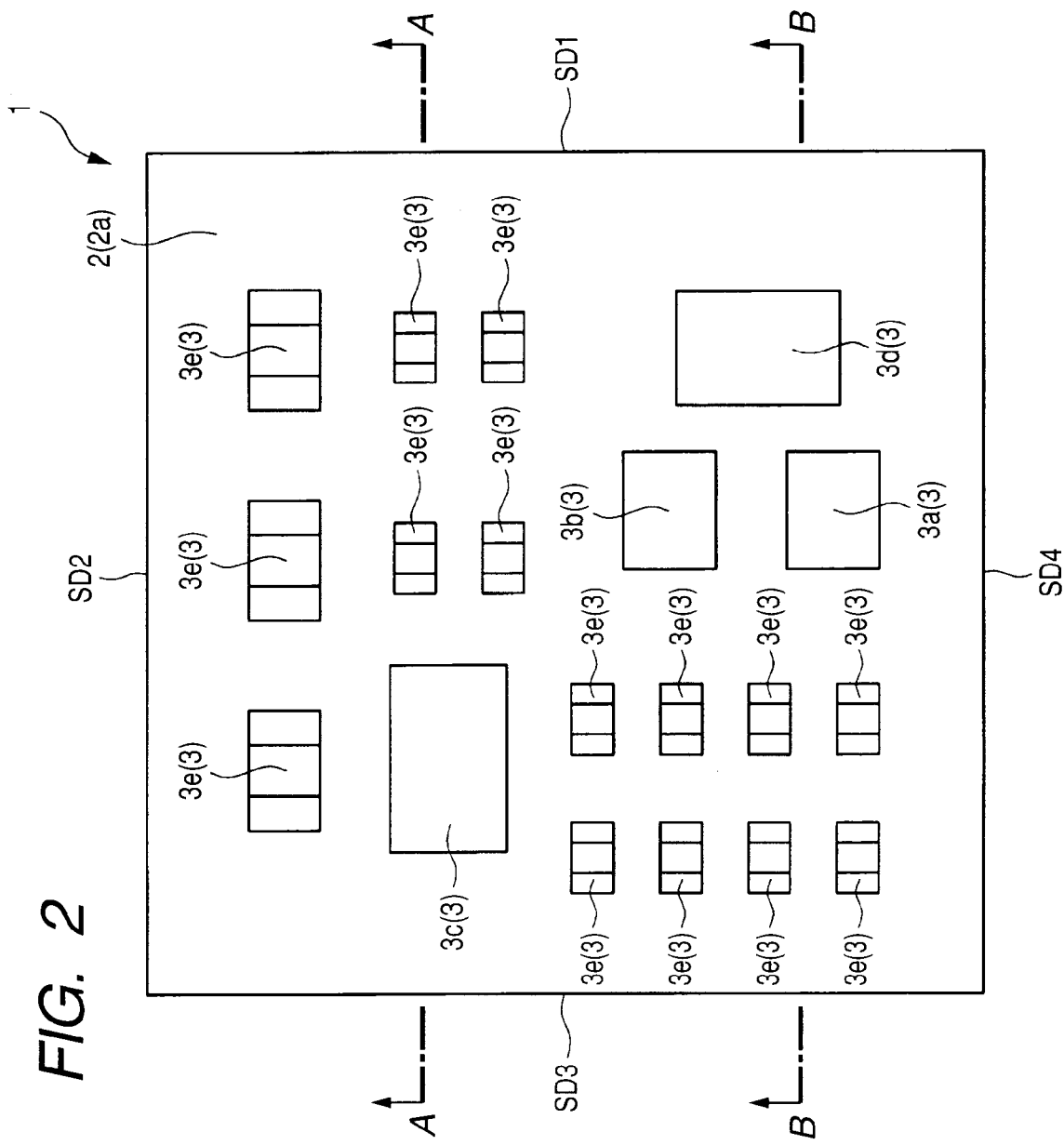
FIG. 2 is a top view of a semiconductor module in an embodiment of the invention.
Figure 3:
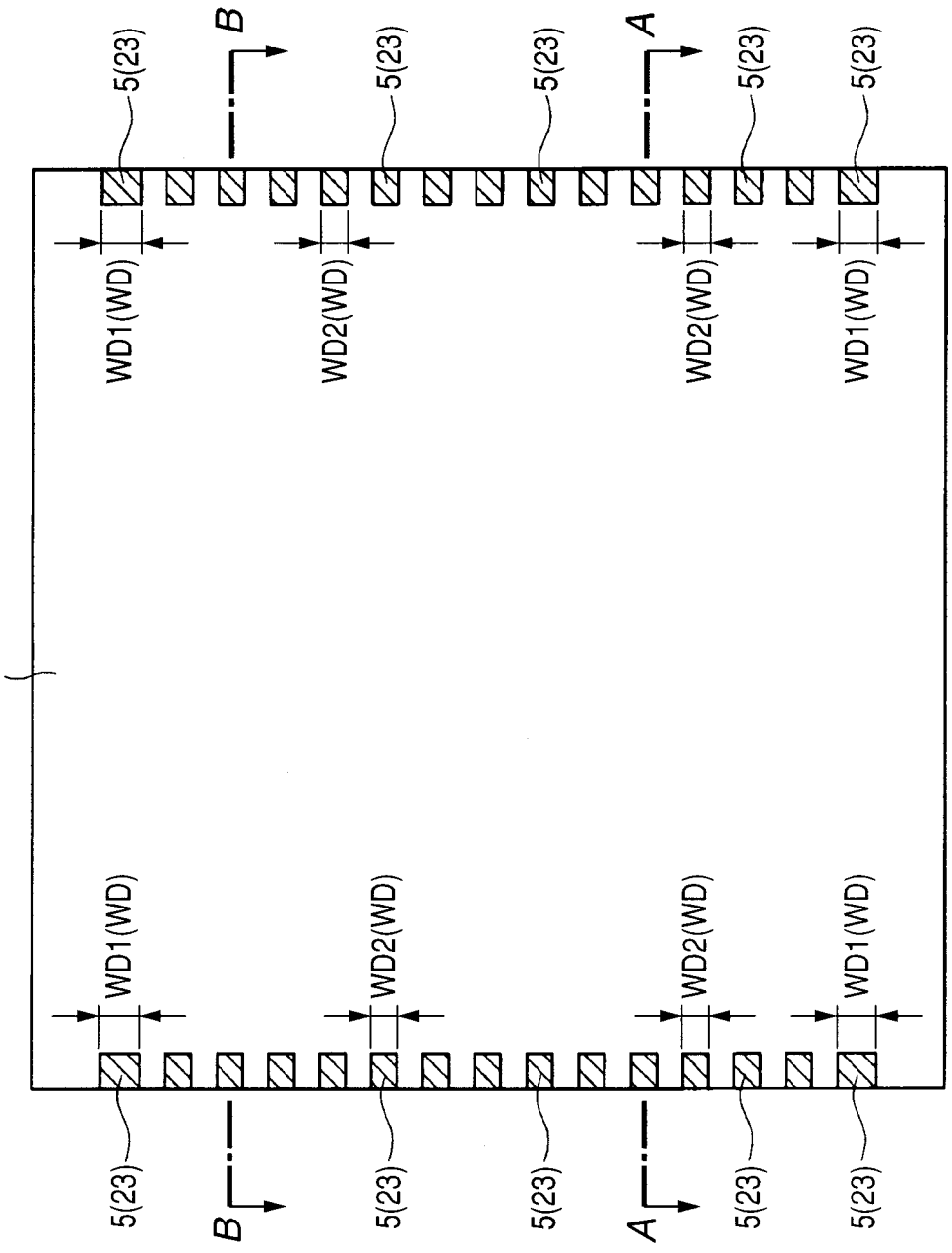
FIG. 3 is a bottom view of a semiconductor module in an embodiment of the invention.
Figure 4:
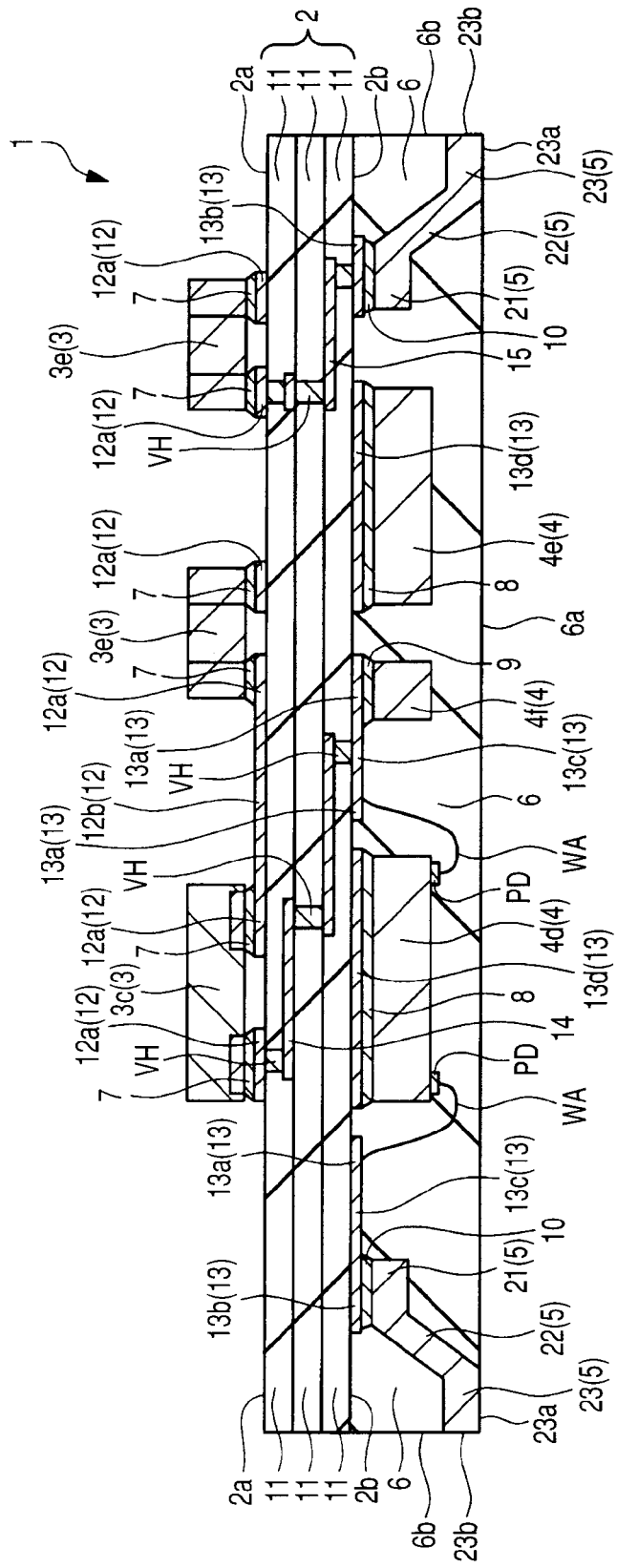
FIG. 4 is a sectional view of a semiconductor module in an embodiment of the invention.
Figure 5:
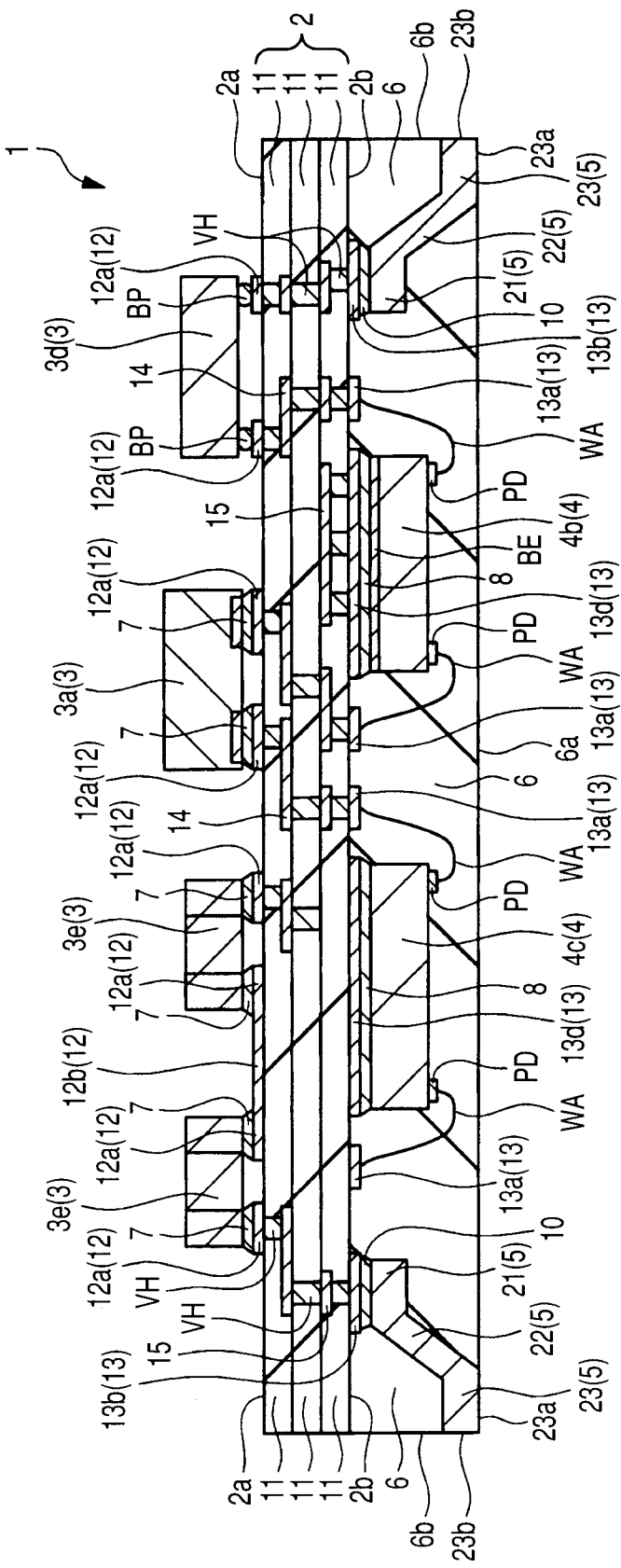
FIG. 5 is a sectional view of a semiconductor module in an embodiment of the invention.
Figure 6:
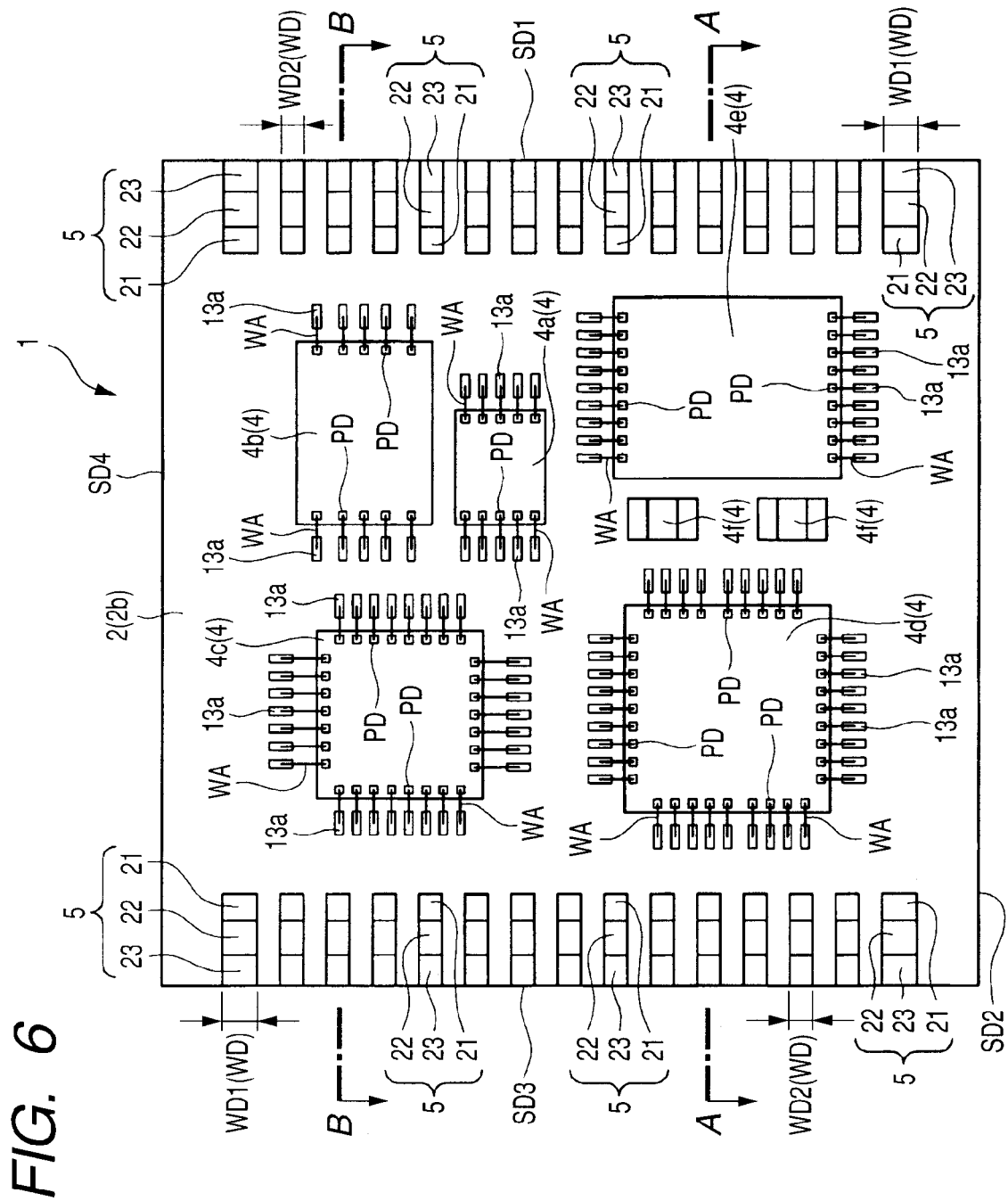
FIG. 6 is a transparent bottom view of a semiconductor module in an embodiment of the invention.
Figure 7:
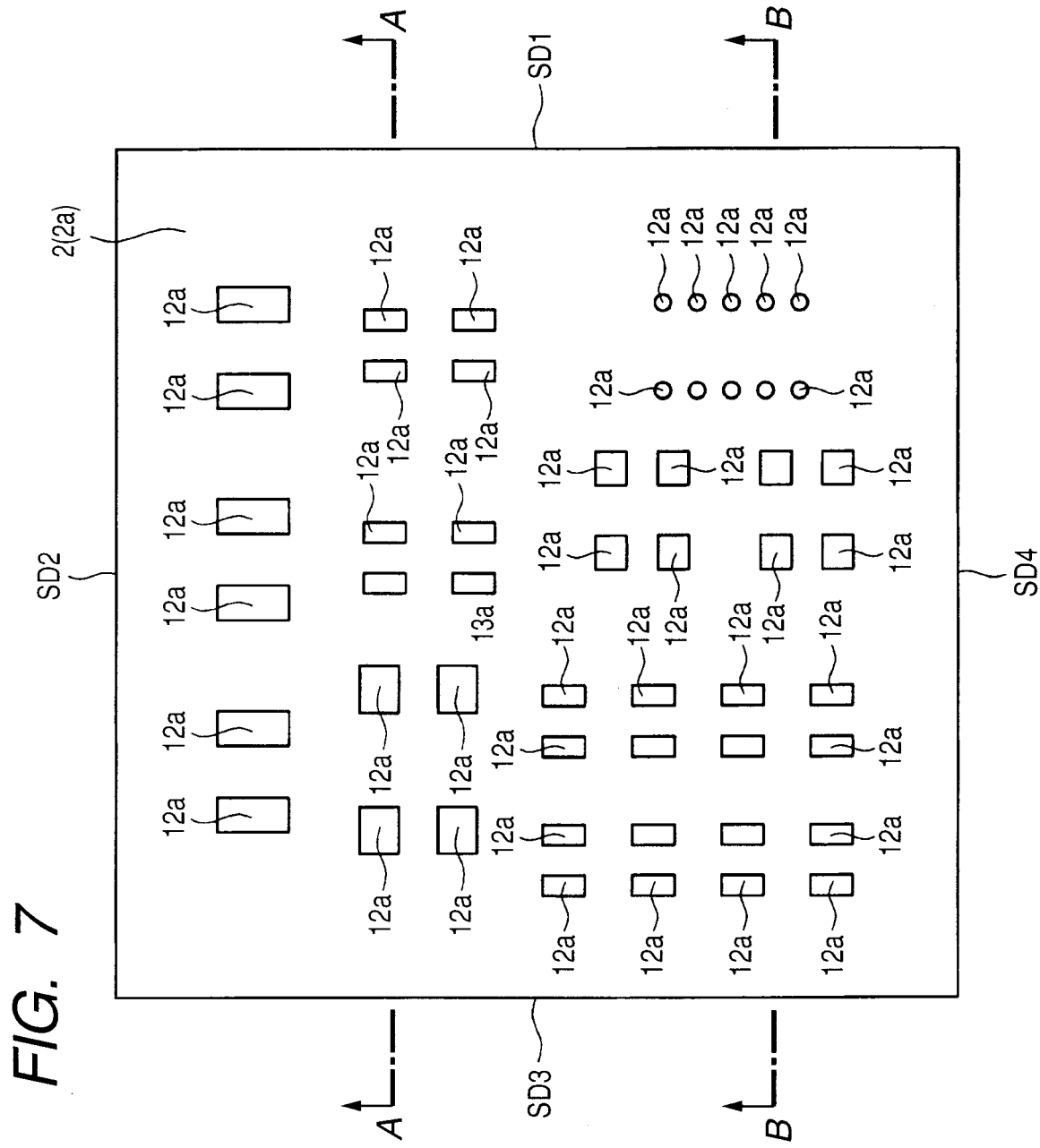
FIG. 7 is a top view of a wiring substrate used for a semiconductor module in an embodiment of the invention.
Figure 8:
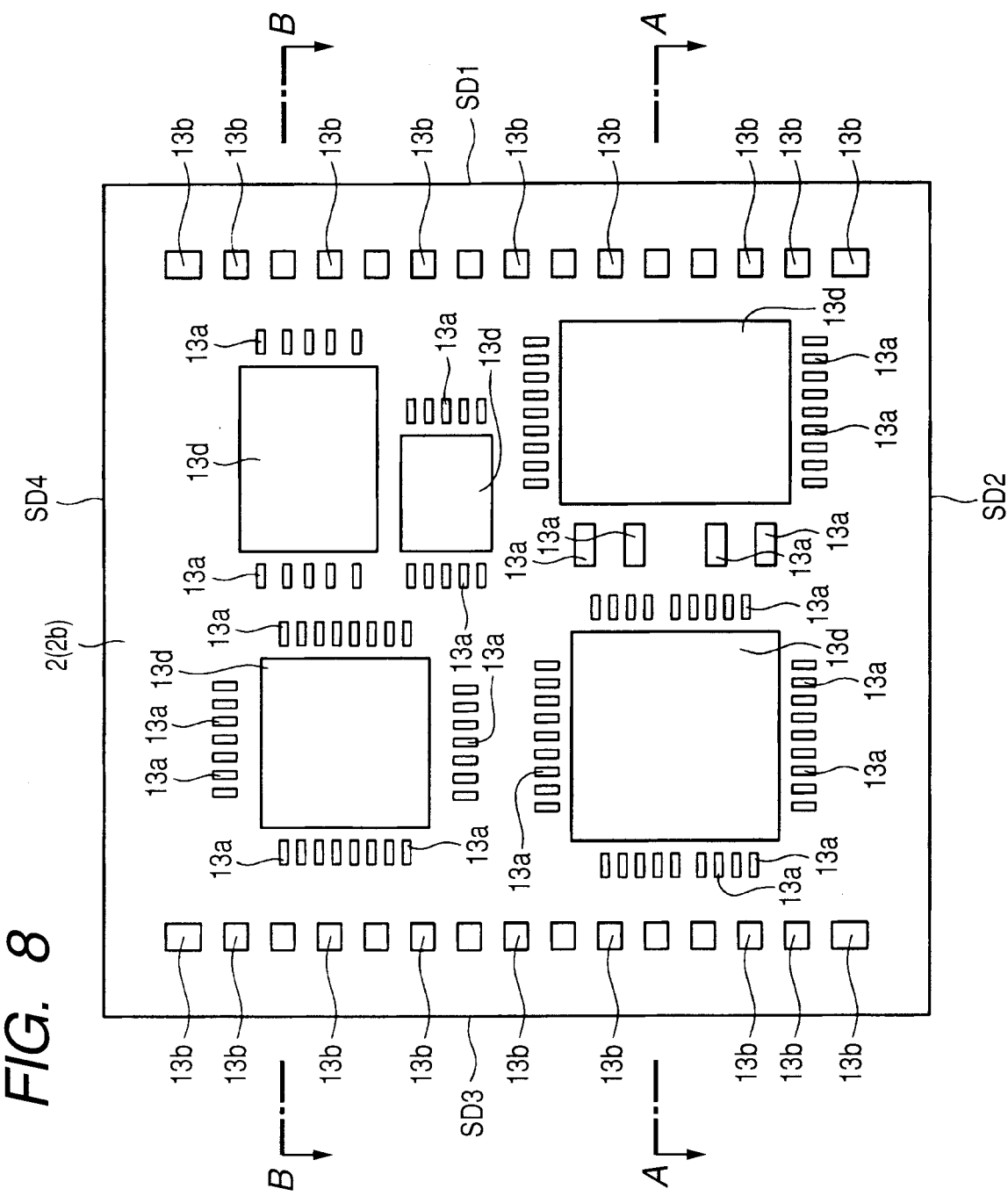
FIG. 8 is a bottom view of a wiring substrate used for a semiconductor module in an embodiment of the invention.

<Structure of Semiconductor Module>
FIG. 2 is a top view (plan view) illustrating the structure of the semiconductor module 1 in this embodiment; FIG. 3 is a bottom view (plan view) of the semiconductor module 1 in this embodiment; and FIG. 4 and FIG. 5 are sectional views (side surface sectional views) of the semiconductor module 1 in this embodiment. FIG. 6 is a transparent bottom view of the semiconductor module 1 in this embodiment and shows a bottom view of the semiconductor module 1 seen via encapsulation resin 6. FIG. 7 is a top view (plan view) of a wiring substrate 2 used for the semiconductor module 1 and FIG. 8 is a bottom view (plan view) of the wiring substrate 2 used for the semiconductor module 1. A sectional view of the semiconductor module 1 in a position corresponding to line A-A shown in FIG. 2, FIG. 3, and FIG. 6 to FIG. 8 substantially corresponds to FIG. 4. A sectional view of the semiconductor module 1 in a position corresponding to line B-B shown in FIG. 2, FIG. 3, and FIG. 6 to FIG. 8 substantially corresponds to FIG. 5. Though FIG. 3 is a plan view, leads 5 exposed from the encapsulation resin 6 are hatched to facilitate visualization.

The semiconductor module (semiconductor device, electronic device) 1 in this embodiment illustrated in FIG. 2 to FIG. 6 includes: a wiring substrate 2; electronic components 3 placed (mounted) over the upper surface 2a of the wiring substrate 2; electronic components 4 placed (mounted) over the under surface 2b of the wiring substrate 2; leads 5 placed over the under surface 2b of the wiring substrate 2; and encapsulation resin (sealing body, resin sealing body, sealing portion, encapsulation resin portion) 6 covering the under surface 2b of the wiring substrate 2 including the electronic components 4 and the leads 5.

Since the semiconductor module 1 is obtained by placing the electronic components 3, 4 over the upper surface 2a and under surface 2b of the wiring substrate, it may be considered as an electronic device. When a semiconductor chip is also included in the electronic components 3, 4, it can also be considered as a semiconductor device. In this embodiment, as described later, the electronic components 3, 4 include semiconductor chips 3d, 4a, 4b, 4c, 4d, 4e, the semiconductor module 1 can considered as both an electronic device and a semiconductor device.

The wiring substrate 2 illustrated in FIG. 2 and FIG. 4 to FIG. 8 is a multilayer wiring substrate (multilayer substrate) obtained by alternately laminating and integrating, for example, the following layers: multiple insulator layers (insulating layers, dielectric layers) 11 and multiple conductor layers (conductor layers corresponding to conductor patterns 12, 13, 14, 15). In the examples in FIG. 4 and FIG. 5, three insulator layers 11 are laminated to form the wiring substrate 2. However, the number of laminated insulator layers 11 is not limited to this and can be variously changed. As the material for forming the insulator layers 11 of the wiring substrate 2, for example, a resin material such as glass epoxy resin or a ceramic material such as alumina (aluminum oxide, $Al_2O_3$) can be used.

The wiring substrate 2 has the upper surface (front surface, main surface, mounting surface) 2a and the under surface (back surface, main surface, mounting surface) 2b which are main surfaces opposite to each other. Over the upper surface 2a of the wiring substrate 2, over the under surface 2b of the same, and between the insulator layers 11, there is formed a conductor layer (wiring layer, wiring pattern, conductor pattern) for wiring formation. A conductor pattern 12 formed of conductive material is formed over the upper surface 2a of the wiring substrate 2 by the uppermost conductor layer of the wiring substrate 2. A conductor pattern 13 formed of conductive material is formed over the under surface 2b of the wiring substrate 2 by the lowermost conductor layer of the wiring substrate 2. Conductor patterns 14, 15 are formed by conductor layers between insulator layers 11 of the wiring substrate 2.

The conductor pattern 12 over the upper surface 2a of the wiring substrate 2 includes: multiple electrode pads (terminals, electrodes, bonding leads, lands, first electrode pads) 12a as terminal portions to which electrodes of the electronic components 3 are coupled; and multiple wirings (wiring portions, wiring patterns) 12b coupling the electrode pads 12a or the like together. The conductor pattern 13 over the under surface 2b of the wiring substrate 2 includes: multiple electrode pads 13a as terminal portions to which electrodes of the electronic components 4 (or the wires WA described later coupled to electrodes of the electronic components 4); multiple electrode pads 13b as terminal portions to which leads 5 are coupled; and multiple wirings (wiring portions, wiring patterns) 13c coupling these electrode pads 13a, 13b or the like together. The conductor pattern 13 over the under surface 2b of the wiring substrate 2 also includes conductor patterns 13d for chip placement.

Over the upper surface 2a of the wiring substrate 2, there is formed a solder resist layer and the electrode pads 12a are exposed from openings formed in the solder resist layer. However, the wirings 12b are covered with this solder resist layer. In the top view (plan view) in FIG. 7, for this reason, the electrode pads 12a exposed from the solder resist layer are shown but the wirings 12b covered with the solder resist layer are not shown. In the sectional views in FIG. 4 and FIG. 5, meanwhile, both the electrode pads 12a and the wirings 12b are shown but the solder resist layer over the upper surface 2a of the wiring substrate 2 is omitted from the drawings.

Also over the under surface 2b of the wiring substrate 2, there is formed a solder resist layer and the following are exposed from openings formed in this solder resist layer: the electrode pads (terminals, electrodes, bonding leads, lands, second electrode pads) 13a, electrode pads (terminals, electrodes, bonding leads, lands, third electrode pads) 13b, and conductor patterns 13d for chip placement. However, the wirings 13c are covered with this solder resist layer. In the bottom view (plan view) in FIG. 8, for this reason, the electrode pads 13a, 13b and the conductor patterns 13d exposed from the solder resist layer are shown but the wirings 13c covered with the solder resist layer are not shown. In the sectional views in FIG. 4 and FIG. 5, meanwhile, both electrode pads 13a, 13b and the conductor patterns 13d for chip placement are shown but the solder resist layer over the under surface 2b of the wiring substrate 2 is omitted from the drawings.

In case of the semiconductor module 1b (Refer to FIG. 36 referred to later) described later, the conductor patterns 13 further include the electrode pads (terminals, electrodes, bonding leads, lands, third electrode pads) 13e described later. These electrode pads 13e are exposed from openings formed in the solder resist layer in the under surface 2b of the wiring substrate 2. In case of the semiconductor module 1b (Refer to FIG. 36 referred to later) described later, for this reason, the wiring substrate 2 includes: multiple electrode pads 12a formed over the upper surface 2a; and multiple electrode pads 13a, multiple electrode pads 13b, and multiple electrode pads 13e formed over the under surface 2b opposite to the upper surface 2a.

In the under surface 2b of the wiring substrate 2 in this embodiment, the electrode pads 13b are placed on the peripheral edge portion side of the under surface 2b; and the electrode pads 13a are placed inward of the under surface 2b (inside the arrangement areas of the electrode pads 13b). That is, the electrode pads 13b are positioned closer to the peripheral edge portion side of the under surface 2b of the wiring substrate 2 than the electrode pads 13a.

In the upper surface 2a of the wiring substrate 2, there are provided multiple electrode pads 12a; and in the under surface 2b of the wiring substrate 2, there are provided multiple electrode pads 13a and multiple electrode pads 13b as well. In the under surface 2b of the wiring substrate 2, therefore, the electrode pads 13b are placed along peripheral edge portions of the under surface 2b; and the electrode pads 13a are placed inward of the placement (arrangement) areas of the electrode pad 13b. (The electrode pads 13a are placed on the central part side.) In the under surface 2b of the wiring substrate 2, in other words, the electrode pads 13b are placed closer to the peripheral edge portion side than (outward of) the placement areas of the electrode pads 13a.

At least one electronic component (first electronic component) 3 is placed (mounted) over the upper surface 2a of the wiring substrate 2 and at least one electronic component (second electronic component) 4 is placed (mounted) over the under surface 2b of the wiring substrate 2. In this example, multiple electronic components 3 are placed (mounted) over the upper surface 2a of the wiring substrate 2 and multiple electronic components 4 are placed (mounted) over the under surface 2b of the wiring substrate 2. The electronic components 3, 4 used in the semiconductor module 1 includes a semiconductor chip, a chip component (chip resistor, chip capacitor, chip inductor, or the like), and the like.

More specific description will be given. The semiconductor module 1 comprises the wireless communication system SYS1 in FIG. 1. Therefore, it includes: a semiconductor chip 4a comprising the low noise amplifier LNA1; a semiconductor chip 4b comprising the power amplifier PA1; a semiconductor chip 4c comprising the high-frequency IC circuit portion RF1; a semiconductor chip 4d comprising the base band portion BB1; and a semiconductor chip 4e comprising the memory MEM. The semiconductor module 1 further includes: filters 3a, 3b respectively comprising the filters FL1, FL2; an oscillating element 3c comprising the oscillating element OSC1; a semiconductor chip 3d comprising the antenna switch SW; and multiple chip components 3e, 4f comprising peripheral circuits (for example, a capacitor, a coil, a resistor, or the like).

Of these components, the semiconductor chips 4a, 4b, 4c, 4d, 4e and the multiple chip components 4f are placed (mounted) as electronic components 4 over the under surface 2b of the wiring substrate 2; and the filters 3a, 3b, oscillating element 3c, semiconductor chip 3d, and multiple chip components 3e are placed (mounted) as electronic components 3 over the upper surface 2a of the wiring substrate 2.

The electronic components 3 placed over the upper surface 2a of the wiring substrate 2 are desirably surface-mount electronic components and it is desirable that they can be solder mounted or flip chip mounted. A wire-bonded electronic component is not placed over the upper surface 2a of the wiring substrate 2. That is, it is desirable that the electronic components 3 should not include a wire-bonded electronic component. In other words, a wire-bonded electronic component is not placed over the upper surface 2a of the wiring substrate 2.

In this example, the filters 3a, 3b, oscillating element 3c, semiconductor chip 3d, and chip components 3e are used as the electronic components 3. Of these components, the filters 3a, 3b are, for example, SAW (Surface Acoustic Wave) filters having a hollow structure; and the oscillating element 3c is a crystal oscillator or a ceramic oscillator; and the chip components 3e are comprised of, for example, a chip resistor, a chip capacitor, a chip inductor, or the like. The semiconductor chip 3d comprising the antenna switch SW is obtained by, for example the following procedure: an HEMT element and the like are formed in a semiconductor substrate (GaAs substrate or the like) formed of compound semiconductor (GaAs or the like); and then the semiconductor substrate (GaAs substrate or the like) is separated into individual semiconductor chips by dicing or the like.

Of the electronic components 3, the filters 3a, 3b, oscillating element 3c, and chip components 3e are solder mounted to over the upper surface 2a of the wiring substrate 2. That is, the respective electrodes of the filters 3a, 3b, oscillating element 3c, and chip components 3e are joined (mechanically coupled) and electrically coupled to electrode pads 12a in the upper surface 2a of the wiring substrate 2. This joining is carried out via solder (first conductive member) 7 as a conductive joining material. Of the electronic components 3, the semiconductor chip 3d is placed face down over the upper surface 2a of the wiring substrate 2 and is flip chip coupled (flip chip mounted) thereto; and the semiconductor chip 3d is joined (mechanically coupled) and electrically coupled to electrode pads 12a in the upper surface 2a of the wiring substrate 2 via bump electrodes (first conductive members) BP. The bump electrodes BP are desirably solder bumps. Since the solder 7 and the bumps BP are conductive, they can be considered as conductive members for electrically coupling the electronic components 3 to electrode pads 12a in the upper surface 2a of the wiring substrate 2.

Of the electronic components 4 placed over the under surface 2b of the wiring substrate 2, the semiconductor chips 4a, 4b, 4c, 4d, 4e and the chip components 4f in this example, the semiconductor chips 4a, 4b, 4c, 4d, 4e are processed as follows: they are die bonded face up to over the under surface 2b of the wiring substrate 2; and the back surface of each semiconductor chip 4a, 4b, 4c, 4d, 4e is joined (glued, anchored) to the under surface 2b of the wiring substrate 2 via joining material (die bonding material) 8. As this joining material 8, paste adhesive (silver paste, resin paste, or the like), film adhesive, solder, or the like can be used. Whichever joining material is used, the joining material 8 has already been hardened or cured in the semiconductor module 1.

Each semiconductor chip 4a, 4b, 4c, 4d, 4e is obtained by: forming a semiconductor integrated circuit comprised of MISFET and the like in a semiconductor substrate (semiconductor wafer) formed of single crystal silicon or the like; thereafter, grinding the back surface of the semiconductor substrate as required; and then separating the semiconductor substrate into individual semiconductor chips by dicing or the like. The semiconductor chips 4a, 4b, 4c, 4d, 4e can also be considered as silicon chips and in this embodiment, the electronic components 4 placed over the under surface 2b of the wiring substrate 2 includes a semiconductor chip (silicon chip).

The chip components 4f placed over the under surface 2b of the wiring substrate 2 are desirably surface-mount electronic components and it is desirable that they can be solder mounted. The chip components 4f are comprised of, for example, a chip resistor, a chip capacitor, a chip inductor, or the like and are solder mounted over the under surface 2b of the wiring substrate 2. That is, the respective electrodes of the chip components 4f are joined (mechanically coupled) and electrically coupled to electrode pads 13a in the under surface 2b of the wiring substrate 2 via solder (second conductive member) 9 as a conductive joining material.

Of the semiconductor chips 4a, 4b, 4c, 4d, 4e placed over the under surface 2b of the wiring substrate 2, the semiconductor chips 4a, 4b have a back surface electrode BE formed in their entire back surfaces. For this reason, the following measure is taken in the under surface 2b of the wiring substrate 2: the conductor patterns 13d for chip placement are provided in the placement areas for the semiconductor chips 4a, 4b; and each semiconductor chip 4a, 4b is placed and fixed over the conductor patterns 13d for chip placement via the joining material 8. Therefore, it is required that the joining material (die bonding material) 8 for die bonding the semiconductor chips 4a, 4b having the back surface electrodes BE should be conductive. As a result, the respective back surface electrodes BE of the semiconductor chips 4a, 4b are joined and electrically coupled to the conductor patterns 13d for chip placement in the under surface 2b of the wiring substrate 2. The conductor patterns 13d for chip placement can be supplied with reference potential (ground potential).

Meanwhile, in the areas in the under surface 2b of the wiring substrate 2 for placing the semiconductor chips 4c, 4d, 4e having no back surface electrode, a conductor pattern 13d for chip placement may be provided or not. Therefore, the following measure can be taken with respect to each semiconductor chip 4c, 4d, 4e: it is placed and fixed over a conductor pattern 13d for chip placement in the under surface 2b of the wiring substrate 2 via the joining material (die bonding material) 8; or it is placed and fixed onto the solder resist layer over the under surface 2b of the wiring substrate 2 via the joining material (die bonding material) 8. FIG. 4, FIG. 5, and FIG. 8 illustrate the former case. The joining material (die bonding material) 8 for die bonding the semiconductor chips 4c, 4d, 4e having no back surface electrode may be conductive or insulating.

The same type of conductive joining material (for example, conductive paste adhesive such as silver paste) can be used for both the following joining materials: the joining material 8 for die bonding the semiconductor chips 4a, 4b having a back surface electrode BE; and the joining material 8 for die bonding the semiconductor chips 4c, 4d, 4e having no back surface electrode. This makes it possible to simplify a die bonding step for the semiconductor chips 4a, 4b, 4c, 4d, 4e.

Solder may be used for the joining material 8 for die bonding the semiconductor chips 4a, 4b having a back surface electrode BE. In this case, it is possible to unify a reflow step for the solder for die bonding the semiconductor chips 4a, 4b and a solder reflow step for coupling the chip components 4f via the solder 9 and this makes is possible to reduce the number of manufacturing process steps. Solder is unsuitable as die bonding material with respect to the semiconductor chips 4c, 4d, 4e having no back surface electrode. In this case, therefore, paste adhesive (silver paste, resin paste, or the like)

can be used as the joining material 8 for die bonding the semiconductor chips 4c, 4d, 4e having no back surface electrode.

In the front surface of each semiconductor chip 4a, 4b, 4c, 4d, 4e, there are formed multiple electrodes (pad electrodes, bonding pads) PD. (The front surface of each semiconductor chip is the main surface opposite to the side where the semiconductor chip is opposed to the under surface 2b of the wiring substrate 2.) Each of the electrodes PD of each semiconductor chip 4a, 4b, 4c, 4d, 4e is electrically coupled to an electrode pad 13a in the under surface 2b of the wiring substrate 2 via a conductive wire (second conductive member) WA as a bonding wire. The wires WA are comprised of a thin metallic wire such as gold wire. That is, each wire WA has one end thereof bonded to an electrode PD and the other end thereof bonded to an electrode pad 13a. Since the wires WA and the solder 9 are conductive, they can be considered as conductive members for electrically coupling the electronic components 4 to electrode pads 13a in the under surface 2b of the wiring substrate 2.

Over the under surface 2b of the wiring substrate 2, there are placed multiple leads 5 and these leads 5 are formed of conductive material and are desirably formed of metal. It is more desirable that leads 5 should be formed of copper (Cu) or copper (Cu) alloy because it is easy to process, high in electrical conductivity and thermal conductivity, and relatively inexpensive.

The leads 5 are placed in the peripheral portion of the under surface 2b of the wiring substrate 2, not in the central portion of the under surface 2b of the wiring substrate 2. In this embodiment, the leads 5 are placed on two opposite sides (sides SD1, SD3) of the four sides (sides SD1, SD2, SD3, SD4) comprising the circumference of the wiring substrate 2 in a rectangular planar shape. Specifically, multiple leads 5 are placed (arranged) over the under surface 2b of the wiring substrate 2 along each of the side SD1 and the side SD3. The side SD1 and side SD3 of the wiring substrate 2 are opposed to each other; the side SD2 and the side SD4 are opposed to each other; the side SD1 is orthogonal to the side SD2 and the side SD4; and the side SD3 is orthogonal to the side SD2 and the side SD4.

Each lead 5 integrally includes the first portion 21, second portion 22, and third portion 23 described below.

As illustrated in FIG. 4 and FIG. 5, the first portion (substrate coupling portion) 21 is extended along the under surface 2b of the wiring substrate 2 (that is, in substantially parallel with the under surface 2b of the wiring substrate 2). The first portion 21 is joined (mechanically coupled) and electrically coupled to an electrode pad 13b in the under surface 2b of the wiring substrate 2 via joining material (third conductive member) 10. The joining material 10 for joining each first portion 21 to an electrode pad 13b in the under surface 2b of the wiring substrate 2 is conductive and is desirably solder.

As illustrated in FIG. 4 and FIG. 5, the second portion (bent portion) 22 is formed integrally with the first portion 21 and bent (folded) from the first portion 21. It is bent (folded) from the first portion 21 in a direction away from the under surface 2b of the wiring substrate 2. For this reason, each second portion 22 is extended in a direction in which it is inclined from the under surface 2b of the wiring substrate 2.

As illustrated in FIG. 4 and FIG. 5, the third portion (terminal portion) 23 is formed integrally with the second portion 22 and is bent (folded) from the second portion 22. As illustrated in FIG. 4 to FIG. 6, the third portion 23 is positioned closer to the peripheral edge portion side of the under surface 2b of the wiring substrate 2 than the first portion 21; and at the same time, it is placed in a position farther from the under surface 2b of the wiring substrate 2 than the first portion 21.

The third portion 23 is desirably extended in a direction substantially parallel with the first portion 21. That is, the third portion 23 is desirably bent (folded) from the second portion 22 in the same direction as (parallel with) the first portion 21. For this reason, each third portion 23 is extended in substantially parallel with the under surface 2b of the wiring substrate 2.

That is, each lead 5 has such a structure that it is folded at two points: a point of coupling between the first portion 21 and the second portion 22 and a point of coupling between the second portion 22 and the third portion 23. The first portion 21 and the third portion 23 are parallel with each other; and the second portion 22 joins (couples) the first portion 21 and the third portion 23 together and is inclined from both the first portion 21 and the third portion 23.

In other words, each lead is so formed that the following is implemented: one end of the second portion 22 is formed integrally with one end of the first portion 21 and the other end of the second portion 22 is formed integrally with one end of the third portion 23; the first portion 21 and the third portion 23 are parallel with each other and are extended in a direction substantially parallel with the under surface 2b of the wiring substrate 2; however, the third portion 23 is higher than the first portion 21 in height position from the under surface 2b of the wiring substrate 2. For this reason, the first portion 21 and the third portion 23 are integrally joined (coupled) with each other via the second portion 22 inclined from both of them.

Since the first portion 21 and the third portion 23 are parallel with each other but the second portion 22 is inclined from both the first portion 21 and the third portion 23. As seen from FIG. 6 as well, therefore, the first portion 21 and the third portion 23 do not planarly overlap with each other. When the wording of "planarly" or "as viewed in a plane" is used with respect to the leads 5, that indicates that something is viewed in a plane parallel with the under surface 2b of the wiring substrate 2.

The first portion 21 is placed in a position where it planarly overlaps with an electrode pad 13b in the under surface 2b of the wiring substrate 2. The surface of the first portion 21 on the side where it is opposed to the under surface 2b of the wiring substrate 2 is joined to the electrode pad 13b in the under surface 2b of the wiring substrate 2. This joining is carried out via the conductive joining material 10. The third portion 23 is placed (positioned) closer to the peripheral edge portion side of the under surface 2b of the wiring substrate 2 than the first portion 21. However, the third portion 23 is placed in the following position when viewed in the height direction (the direction perpendicular to the under surface 2b of the wiring substrate 2 is taken as the height direction): a position where it is farther (more distant) from the under surface 2b of the wiring substrate 2 than the first portion 21. For this reason, while the first portion 21 is placed in proximity to the under surface 2b of the wiring substrate 2, the third portion 23 is placed away from the wiring substrate 13b. The area between the third portion 23 and the under surface 2b of the wiring substrate 2 is filled with the material of the encapsulation resin 6. Since the joining material (desirably, solder) 10 is conductive, it can be considered as a conductive member for electrically coupling the leads 5 to electrode pads 13b in the under surface 2b of the wiring substrate 2.

Each lead 5 is covered with the encapsulation resin 6 such that the following is implemented: (the upper surface 23a and the side surface 23b of) the third portion 23 is exposed from the main surface (front surface, upper surface) 6a and side surface 6b of the encapsulation resin 6. More specific description will be given. While the first portion 21 and the second portion 22 are sealed in the encapsulation resin 6, the following measure is taken with respect to the third portion 23: a part thereof is exposed from (the main surface 6a and the side surface 6b of) the encapsulation resin 6 and the remaining part thereof is covered with the encapsulation resin 6. Specifically, the upper surface 23a of the third portion 23 is exposed from the main surface 6a of the encapsulation resin 6; the side surface 23b of the third portion 23 is exposed from the side surface 6b of the encapsulation resin 6; and the surface of the third portion 23, other than the upper surface 23a and the side surface 23b, is substantially covered with the encapsulation resin 6. The upper surface 23a and side surface 23b of the third portion 23 exposed from the encapsulation resin 6 are continuously exposed (exposed as a continuous surface) from the encapsulation resin portion 6. In other words, the surfaces of the third portion 23 of each lead 5 exposed from the main surface 6a and side surface 6b of the encapsulation resin 6 are a continuous surface. (In this example, the above surfaces are the upper surface 23a and the side surface 23b.) (The continuous surface refers to a surface that is not separated by the encapsulation resin 6 and continues.) That is, the upper surface 23a and the side surface 23b exposed from the encapsulation resin 6 intersect with each other but they are not separated from each other by the encapsulation resin 6 and continue to each other to form an exposed surface.

The main surface 6a of the encapsulation resin 6 is the main surface opposite to the surface of the encapsulation resin 6 in contact with the under surface 2b of the wiring substrate 2. It is a surface (flat surface) substantially parallel with the under surface 2b of the wiring substrate 2. The side surface 6b of the encapsulation resin 6 is a surface (in the direction in which it intersects with) intersecting with the main surface 6a of the encapsulation resin 6. The side surface 6b of the encapsulation resin 6 is desirably substantially orthogonal to the main surface 6a of the encapsulation resin 6. The side surface 23b of the third portion 23 is the end portion face (end face) opposite to the side where it is joined (coupled) to the second portion 22. It is also the side surface comprising one end of the lead 5 itself. The upper surface 23a of the third portion 23 is the surface opposite to the side where it is opposed to the under surface 2b of the wiring substrate 2.

The encapsulation resin 6 is formed over the under surface 2b of the wiring substrate 2 such that it covers the electronic component 4, bonding wires WA, and leads 5. (In this example, the electronic components 4 are the semiconductor chips 4a, 4b, 4c, 4d, 4e and the chip components 4f.) As mentioned above, the encapsulation resin is so formed that the upper surface 23a and side surface 23b of the third portion 23 of each lead 5 are exposed. The encapsulation resin 6 as a resin sealing body is formed of, for example, resin material, such as epoxy resin or silicone resin, and may contain filler or the like.

Since there is the encapsulation resin 6 formed over the under surface 2b of the wiring substrate 2, the electronic components 4 placed over the under surface 2b of the wiring substrate 2 are covered with the encapsulation resin 6. None of them is exposed. (In this example, the electronic components 4 are the semiconductor chips 4a to 4e and the chip components 4f.) To prevent the electronic components 4 from being exposed from the encapsulation resin 6, the thickness of the encapsulation resin 6 is larger than the height of every electronic component 4 placed over the under surface 2b of the wiring substrate 2. (The thickness of the encapsulation resin 6 corresponds to the distance from the under surface 2b of the wiring substrate 2 to the main surface 6a of the encapsulation resin 6.) (The height of every electronic component 4 corresponds to the height from the under surface 2b of the wiring substrate 2 to the top of each electronic component 4.)

Meanwhile, a sealing body (encapsulation resin, encapsulation resin portion) such as the encapsulation resin 6 is not formed over the upper surface 2a of the wiring substrate 2. The electronic components 3 (the filters 3a, 3b, oscillating element 3c, semiconductor chip 3d, and chip components 3e in this example) placed over the upper surface 2a of the wiring substrate 2 are exposed.

Figure 9:
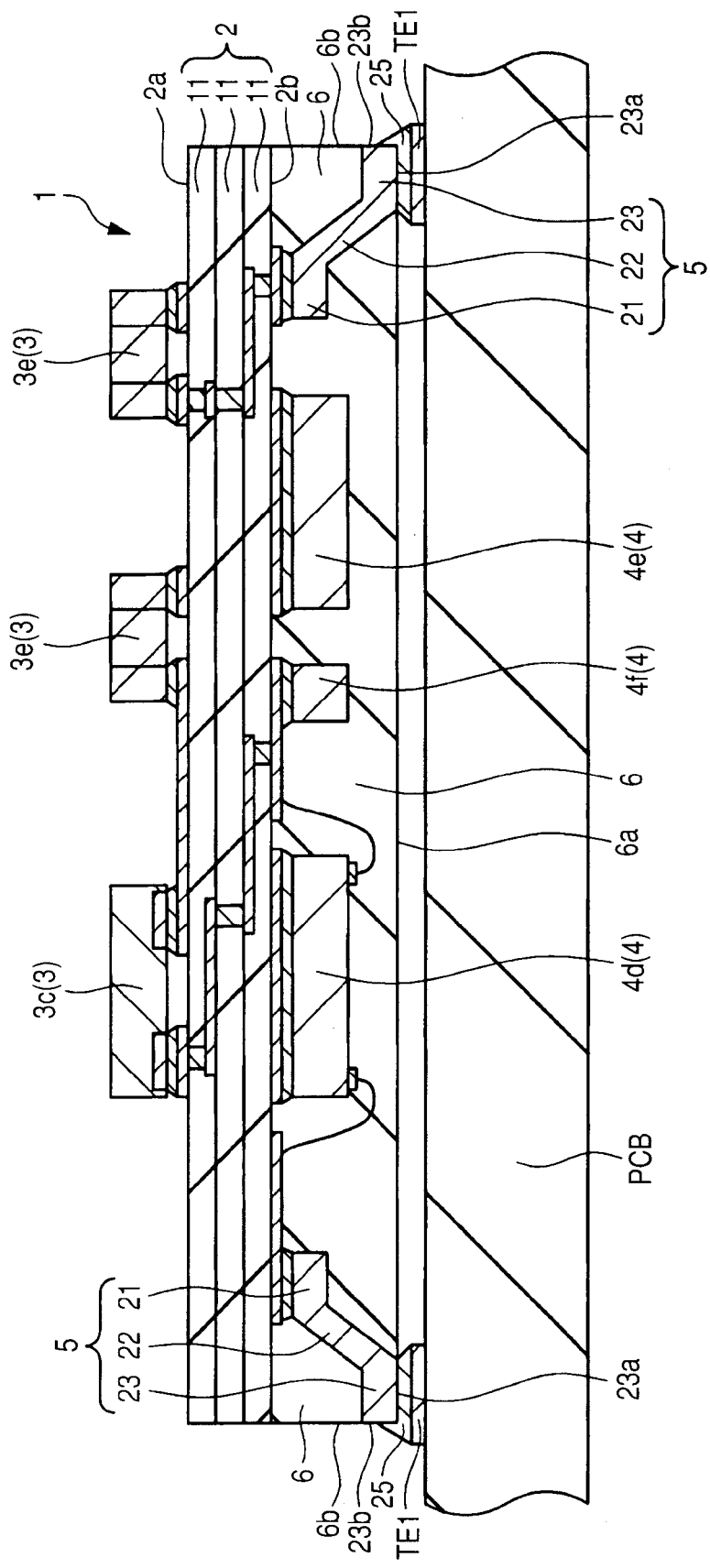
FIG. 9 is a sectional view of a semiconductor module in an embodiment of the invention as is mounted over a mounting board.

The portions of the leads 5 exposed from the encapsulation resin 6 (that is, the third portions 23 of the leads 5) function as terminals for external coupling of the semiconductor module 1. More specifically, the portions of the leads 5 exposed from the encapsulation resin 6 (that is, the third portions 23 of the leads 5) function as terminals for external coupling for solder mounting of the semiconductor module 1. For example, they can function as terminals for external coupling for implementing the following in the example in FIG. 1 after the semiconductor module 1 is solder mounted as illustrated in FIG. 9 referred to later: coupling (the base band portion BB1 and the memory MEM internal to) the semiconductor module 1 to the microcomputer MCN external to the semiconductor module 1; and coupling (the antenna switch SW internal to) the semiconductor module 1 to the antenna ANT external to the semiconductor module 1.

The width WD of (the third portion 23 of) each lead 5 exposed from the main surface 6a of the encapsulation resin 6 can be made equal in any one of the leads 5 provided in the semiconductor module 1. (In this case, WD1=WD2 in FIG. 3 and FIG. 6.) Since the leads 5 are identical in width WD with one another in this case, processing of the lead frame LF described later is facilitated.

Alternately, the width WD1 of (the third portion 23) of each of the leads 5 at both ends among the leads 5 arranged along each of the sides SD1, SD3 of the wiring substrate 2 may be made larger than the following width: the width WD2 of (the third portion 23 of) each of the leads 5 located inside both ends of the arrangement (that is, WD1>WD2). That is, the following measure is taken with respect to the leads 5 arranged along the sides SD1, SD3 of the wiring substrate 2: the width WD1 of (the third portion 23 of) the lead 5 closest to each corner of the wiring substrate 2 is made larger than the width WD2 of (the third portion 23 of) each of the other leads 5 (that is, WD1>WD2). FIG. 3 and FIG. 6 illustrate this case (the case where WD1>WD2). This makes it possible to further enhance the mounting strength when the semiconductor module 1 is mounted over the mounting board PCB described later or the like. The reason for this is as described below. When the semiconductor module 1 is mounted over the mounting board PCB described later or the like, stress is prone to be concentrated on the leads 5 positioned close to the corners of the wiring substrate 2. (These leads are the leads 5 positioned at both ends among the leads 5 arranged along each of the sides SD1, SD3.) As mentioned above, the WD1 of each lead 5 on which stress is prone to be concentrated is increased and this increases the strength of soldered joints. As a result, it is possible to suppress increase in the size (area) of the semiconductor module 1 and further enhance the mounting strength of the entire semiconductor module 1. In case of the semiconductor module 1d illustrated in FIG. 39 and FIG. 40 referred to later, the following measure can be taken with respect to the leads 5 arranged along each side SD1, SD2, SD3, SD4 of the wiring substrate 2: the width WD1 of (the third portion 23 of) each of the leads 5 arranged at both ends of each arrangement is made larger than the following width:

the width WD2 of (the third portion 23 of) each of the leads 5 located inside both ends of each arrangement (that is, WD1>WD2).

The electrode pads 12a, 13a, 13b provided in the upper surface 2a and under surface 2b of the wiring substrate 2 are electrically coupled together as required. This coupling is carried out via the following: the wirings 12b, 13c in the upper surface 2a and under surface 2b of the wiring substrate 2; the conductor patterns 14, 15 between insulator layers 11 of the wiring substrate 2; and vias (via holes) VH formed in the insulator layers 11 of the wiring substrate 2. That is, the electrode pads 12a, 13a, 13b of the wiring substrate 2 are electrically coupled together via the conductor layers (conductor patterns 12, 13, 14, 15 and vias VH) of the wiring substrate 2. For this reason, the leads 5 are electrically coupled to electrode pads 13b via the conductive joining material 10. Further, they are electrically coupled to the electronic components 3, 4 placed over the upper surface 2a and under surface 2b of the wiring substrate 2 by way of the following as required: the wirings 12b, 13c, conductor patterns 14, 15, vias VH, electrode pads 12a, 13a, wires WA, solder 7, 9, bump electrodes BP, or the like. That is, the leads 5 placed over the under surface 2b of the wiring substrate 2 are electrically coupled to the electronic components 3, 4 placed over the upper surface 2a and under surface 2b of the wiring substrate 2. When a via or a via hole (via VH in this example) in a wiring substrate is cited in this specification, that refers to not only a hole (through bore, opening, through hole) formed in an insulator layer 11 comprising the wiring substrate 2. It also refers to a conductor film or a conductor portion formed on the inner wall of the hole or so formed that the hole is filled therewith.

<Mounting of Semiconductor Module>

FIG. 9 is a sectional view illustrating the semiconductor module 1 in this embodiment as is mounted over a mounting board (wiring substrate, base board) PCB. FIG. 9 shows a section corresponding to FIG. 4.

As illustrated in FIG. 9, the semiconductor module 1 is mounted over the mounting board (wiring substrate) PCB. At this time, the under surface side of the semiconductor module 1, that is, the main surface 6a side of the encapsulation resin 6 becomes the mounting surface to the mounting board PCB. (The upper surface 23a of the third portion 23 of each of) the leads 5 exposed in the main surface 6a of the encapsulation resin 6 becomes an external coupling terminal of the semiconductor module 1. It is joined (mechanically coupled) and electrically coupled to a terminal (electrode) TE1 of the mounting board PCB via solder 25.

In the semiconductor module 1 in this embodiment, not only the upper surface 23a of the third portion 23 of each lead 5 is exposed in the main surface 6a of the encapsulation resin 6. The side surface 23b of the third portion 23 of each lead 5 is also exposed in the side surface 6b of the encapsulation resin 6. The upper surface 23a and side surface 23b of each third portion 23 exposed from the encapsulation resin 6 are continuously exposed from the encapsulation resin portion 6 (as a continuous surface that is not separated by the encapsulation resin 6). The upper surface 23a of the third portion 23 of each lead 5 exposed in the main surface 6a of the encapsulation resin 6 is joined to a terminal TE1 of the mounting board PCB via the solder 25. The semiconductor module 1 is thereby mounted over the mounting board PCB. At this time, as illustrated in FIG. 9, the following takes place for the above-mentioned reason: the solder 25 wets up to the side surface 23b of the third portion 23 of the lead 5 exposed in the side surface 6b of the encapsulation resin 6. As the result of the solder 25 wetting up to the side surface 23b of the third portion 23 of the lead 5 exposed in the side surface 6b of the encapsulation resin 6, the third portion 23 of the lead 5 is firmly joined to a terminal TE1 of the mounting board PCB by the solder 25; therefore, the mounting strength of the semiconductor module 1 can be enhanced. The following can be checked by checking the solder 25 wetting up to the side surface 23b of the third portion 23 of a lead 5 exposed in the side surface 6b of the encapsulation resin 6 (visually or in any other like manner): whether or not an external coupling terminal (the portion of a lead 5 exposed from the encapsulation resin 6 in this example) of the semiconductor module 1 is firmly coupled to a terminal TE1 of the mounting board PCB by the solder 25. Thus it is possible to enhance the reliability of mounting the semiconductor module 1 over the mounting board PCB (solder mounting reliability).

Though not shown in the drawing, aside from the semiconductor module 1, components corresponding to the antenna ANT, microcomputer MCN, and the like and other components required in the wireless communication system SYS1 can be mounted (placed) over the mounting board PCB.

<Main Features of Semiconductor Module>

More detailed description will be given to main features of the semiconductor module 1 in this embodiment.

In the semiconductor module 1 in this embodiment, as mentioned above, the wiring substrate 2 includes the following: multiple electrode pads 12a formed in the upper surface 2a of the wiring substrate 2 and multiple electrode pads 13a and multiple electrode pads 13b formed in the under surface 2b of the wiring substrate. Over the upper surface 2a of the wiring substrate 2, there is placed at least one electronic component 3 (the filters 3a, 3b, oscillating element 3c, semiconductor chip 3d, and chip components 3e in this example). They are electrically coupled to the electrode pads 12a over the upper surface 2a of the wiring substrate 2 via a conductive member (the solder 7 and the bump electrodes BP in this example). Over the under surface 2b of the wiring substrate 2, there is placed at least one electronic component 4 (the semiconductor chips 4a to 4e and the chip components 4f in this example). They are electrically coupled to the electrode pads 13a over the under surface 2b of the wiring substrate 2 via a conductive member (the wires WA and the solder 9 in this example).

As mentioned above, the electronic components 3, 4 included in the semiconductor module 1 are divided and placed on the upper surface 2a side and the under surface 2b side of the wiring substrate 2. This makes it possible to reduce the area of the semiconductor module 1 (wiring substrate 2) and thus reduce the size (area) of the semiconductor module 1. Further, it is possible to increase the number of used electronic components 3, 4 without increasing the area of the semiconductor module 1 (wiring substrate 2) and enhance the functionality of the semiconductor module 1. In addition, it is possible to reduce the overall size of a system (the wireless communication system SYS1 in this example) configured using the semiconductor module 1.

In the semiconductor module 1 in this embodiment, multiple leads 5 are placed over the under surface 2b of the wiring substrate 2 and electrically coupled to multiple third electrode pads over the under surface 2b of the wiring substrate 2 via a conductive member. Over the under surface 2b of the wiring substrate 2, there is formed the encapsulation resin 6 as a sealing body sealing the electronic components 4 and the leads; however, the third portion 23 of each lead 5 is exposed from the main surface 6a and side surface 6b of the encapsulation resin 6.

If solder balls provided over the under surface of a wiring substrate are used as terminals for external coupling without use of the lead 5 unlike this embodiment, it is required to take the following measure: the height of each solder ball is made larger than each electronic component placed on the under surface side of the wiring substrate. When the outside dimensions of each solder ball is increased to increase the height of the solder ball, the solder balls becomes prone to be brought into contact with one another. To cope with this, it is required to increase the pitch between adjacent lands (lands for solder ball joining). This makes it difficult to reduce the size (area) of a semiconductor module. If solder balls are used as terminals for external, coupling of a module, the following problem can arise: when the module once mounted over a mounting board is stripped (detached), solder members (solder balls) comprising terminals for external coupling are damaged. Therefore, it is difficult to re-place this removed module over the same mounting board or a different mounting board and this degrades the versatility of the module.

In this embodiment, meanwhile, the leads 5 are used as terminals for external coupling of the semiconductor module 1. Since the lead 5 can be processed into a desired shape, the height of the lead 5 can be increased without increasing the width WD of the lead 5. (The height of the lead 5 is the height from the under surface 2b of the wiring substrate 2 to the upper surface 23a of the third portion 23 of the lead 5.) For this reason, it is possible to reduce the size (area) of the semiconductor module 1. Further, it is possible to increase the number of the terminals of the semiconductor module 1 without increasing the area of the semiconductor module 1 (wiring substrate 2). The leads 5 except their third portions 23 are sealed in the encapsulation resin 6. Even though the semiconductor module 1 is once mounted over the mounting board PCB or the like and then stripped (detached), the leads 5 comprising terminals for external coupling are hardly damaged. For this reason, it is possible to re-place the removed semiconductor module 1 over the same mounting board or a different mounting board and this enhances the versatility of the semiconductor module.

In the semiconductor module 1 in this embodiment, each lead 5 integrally includes the following portions: a first portion 21 extended along the under surface 2b of the wiring substrate 2; a second portion 22 bent from the first portion 21 in a direction away from the under surface 2b of the wiring substrate 2; and a third portion 23 bent from the second portion 22. Since the leads 5 are bent inside the encapsulation resin 6, it is possible to prevent a lead 5 from coming off from the encapsulation resin 6. For this reason, it is possible to prevent the leads 5 to be external terminals from being stripped off from the encapsulation resin 6 and thus it is possible to enhance the reliability (guaranteed quality) of the semiconductor module 1. Since each lead 5 has a bent structure, it is prone to warp at the manufacturing process (assembling step) for the semiconductor module 1. Therefore, pressure produced when it is clamped in a molding die (between the upper die 54 and lower die 55 described later) at a molding step for forming the encapsulation resin 6 can be absorbed by warpage in the leads 5. Thus it is possible to suppress or prevent the application of stress to the wiring substrate 31 described later arising from clamping of the dies. For this reason, it is possible to prevent a crack or the like from being produced in the wiring substrate 31 described later (that is, the wiring substrate 2).

In the semiconductor module 1 in this embodiment, the third portion 23 of each lead 5 is exposed from the main surface 6a and side surface 6b of the encapsulation resin 6. This configuration can be implemented by taking the following measure in each lead 5: the third portion 23 is positioned closer to the peripheral edge portion side of the under surface 2b of the wiring substrate 2 than the first portion 21; and at the same time, the third portion 23 is positioned farther from the under surface 2b of the wiring substrate 2 than the first portion 21.

Leads to be terminals for external coupling could be exposed only in a surface corresponding to the main surface 6a of the encapsulation resin 6 and a lead could be not exposed in a surface corresponding to the side surface 6b unlike this embodiment. With this configuration, however, it is difficult to enhance the solder mounting strength of the module. Further, it is difficult to check whether solder material used for mounting is reliably coupled (wetted up) to a lead and this makes it difficult to enhance the mounting reliability of the module.

In this embodiment, meanwhile, the third portion 23 of each lead 5 is exposed not only from the main surface 6a of the encapsulation resin 6 but also from its side surface 6b. For this reason, the following can be implemented when the semiconductor module 1 is solder mounted over the mounting board PCB or the like: the solder material (corresponding to the solder 25) for mounting can wet up to (the side surface 23b of) the third portion 23 of each lead 5 exposed in the side surface 6b of the encapsulation resin 6. This makes it possible to enhance the mounting strength (solder mounting strength) of the semiconductor module 1. It is possible to check the following (visually or in any other like manner): whether or not the solder material (corresponding to the solder 25) has wetted up to (the side surface 23b of) the third portion 23 of each lead 5 exposed in the side surface 6b of the encapsulation resin 6. Therefore, it is possible to enhance the mounting reliability (solder mounting reliability) of the semiconductor module 1.

In this embodiment, as seen from FIG. 4, FIG. 5, and FIG. 8 as well, the electrode pads 13b are positioned as follows: they are positioned closer to the peripheral edge portion side of the under surface 2b than the electrode pads 13a in the under surface 2b of the wiring substrate 2. This makes it possible to implement the following in the under surface 2b of the wiring substrate 2: the leads 5 can be placed on the peripheral edge portion side and the electronic components 4 can be placed inside the arrangement areas of the leads 5. As a result, the leads 5 and the electronic components 4 can be placed such that they do not interfere with each other. Therefore, the under surface 2b of the wiring substrate 2 can be efficiently used and this is advantageous to reduction of the area of the semiconductor module 1 (wiring substrate 2).

<Component Placement in Semiconductor Module>

There are following ones among the electronic components included in the semiconductor module 1: electronic components 3 placed on the upper surface 2a side of the wiring substrate 2; and electronic components 4 placed on the under surface 2b side of the wiring substrate 2. Whether an electronic component should be placed on the upper surface 2a of the wiring substrate 2 or the under surface 2b of the wiring substrate 2 can be determined from the following viewpoint:

In the semiconductor module 1, the encapsulation resin 6 is formed over the under surface 2b of the wiring substrate 2 such that it covers (seals) the electronic components 4 and the leads 5. Meanwhile, a sealing body such as the encapsulation resin 6 is not formed over the upper surface 2a of the wiring substrate 2 and the electronic components 3 over the upper surface 2a of the wiring substrate 2 are exposed. For this reason, electronic components desired to be sealed with a sealing body (encapsulation resin 6) are placed as the electronic components 4 over the under surface 2b of the wiring substrate 2; and electronic components desired not to be sealed with a sealing body (encapsulation resin 6) are placed as the electronic components 3 over the upper surface 2a of the wiring substrate 2.

Electronic components desired to be sealed with a sealing body (encapsulation resin 6) include a wire-bonded electronic component. The reason for this is as follows: with bonding wires remaining exposed, there is a possibility of a break in a bonding wire or short-circuiting; and a break in a bonding wire and short-circuiting can be prevented by sealing them with a sealing body (encapsulation resin 6). For this reason, when there is a wire-bonded electronic component among the electronic components included in the semiconductor module 1, it is desirable to take the following measure: this wire-bonded electronic component is placed as an electronic component 4 over the under surface 2b of the wiring substrate 2. Since the semiconductor chips 4a, 4b, 4c, 4d, 4e are wire-bonded electronic components, they are placed as electronic components 4 over the under surface 2b of the wiring substrate 2. The wire-bonded electronic component cited here is defined as an electronic component of such a type that the following processing is carried out when the electronic component is placed over a wiring substrate: the electrodes of the electronic component and electrode pads in the wiring substrate are electrically coupled together via a wire (bonding wire).

Electronic components desired not to be sealed with a sealing body (encapsulation resin 6) include an electronic component of a hollow structure. The reason for this is as follows: if an electronic component of a hollow structure is sealed with a sealing body (encapsulation resin 6), there is a possibility that the sealing body gets into the hollow structure and the intended functionality of the electronic component is not carried out. For this reason, when there is an electronic component of a hollow structure among the electronic components included in the semiconductor module 1, the following measure is taken: the electronic component of a hollow structure is placed as an electronic component 3 over the upper surface 2a of the wiring substrate 2. Since the filters 3a, 3b are electronic components of a hollow structure, they are placed as electronic components 3 over the upper surface 2a of the wiring substrate 2.

When an electronic component comprised of a silicon chip is sealed with a sealing body (encapsulation resin 6), its reliability can be enhanced. (This electronic component corresponds to a semiconductor chip obtained by forming a semiconductor element and the like in a silicon wafer and separating it into individual chips by dicing or the like.) For this reason, when there is a silicon chip among the electronic components included in the semiconductor module 1, it is desirable to take the following measure: the silicon chip is placed as an electronic component 4 over the under surface 2b of the wiring substrate 2. Since the semiconductor chips 4a, 4b, 4c, 4d, 4e are silicon chips, they are placed as electronic components 4 over the under surface 2b of the wiring substrate 2.

As mentioned above, at least one electronic component 3 is placed over the upper surface 2a of the wiring substrate 2 and at least one electronic component 4 is placed over the under surface 2b of the wiring substrate 2. However, it is desirable that the electronic components should be placed over the upper surface 2a and under surface 2b of the wiring substrate 2 evenly as much as possible. This makes it possible to reduce the area of the semiconductor module 1 (wiring substrate).

It is desirable that solder mounted electronic components should be preferentially placed over the upper surface 2a of the wiring substrate 2. Solder mounted electronic components may be sealed with a sealing body (encapsulation resin 6) or not. However, since wire-bonded electronic components and silicon chips desired to be sealed with a sealing body are placed over the under surface 2b of the wiring substrate 2, solder mounted electronic components are preferentially placed over the upper surface 2a of the wiring substrate 2. As a result, the electronic components can be evenly placed over the upper surface 2a and under surface 2b of the wiring substrate 2 and this is advantageous to reduction of the area of the semiconductor module 1 (wiring substrate). A solder mounted electronic component that cannot be placed over the upper surface 2a of the wiring substrate 2 because of too large a number of electronic components may be placed over the under surface 2b of the wiring substrate 2. In the example in FIG. 4 to FIG. 6, the chip components 4f as solder mounted electronic components are placed over the under surface 2b of the wiring substrate 2. If there is room in the space of the upper surface 2a of the wiring substrate 2, instead, the chip components 4f may be placed as electronic components 3 over the upper surface 2a of the wiring substrate 2.

The electronic components are placed over the upper surface 2a and under surface 2b of the wiring substrate 2 such that the coupling path of each electronic component included in the semiconductor module 1 is shortened as much as possible. (The electronic components are placed such that the resistance of the coupling path of each electronic component included in the semiconductor module 1 is reduced as much as possible.) In the example in FIG. 1, it is desirable that the coupling line coupling the following should be routed in the shortest distance with a detour avoided as much as possible: the lead 5 coupled to the antenna ANT; the antenna switch SW (semiconductor chip 3d); the low noise amplifier LNA1 (semiconductor chip 4a); the filter FL1 (filter 3a); and the high-frequency IC circuit portion RF1 (semiconductor chip 4c). In the example in FIG. 1, further, it is desirable that the coupling line coupling the following should be routed in the shortest distance with a detour avoided as much as possible: the high-frequency IC circuit portion RF1 (semiconductor chip 4c); the filter FL2 (filter 3b); the power amplifier PA1 (semiconductor chip 4b); the antenna switch SW (semiconductor chip 3d); and the lead 5 coupled to the antenna ANT.

To shorten the wiring distance between the semiconductor chip 4c comprising the high-frequency IC circuit portion RF1 and the semiconductor chip 4d comprising the base band portion BB1, it is desirable to place them such that they adjoin each other. In the example in FIG. 6, the following measure is taken in the under surface 2b of the wiring substrate 2: the semiconductor chip 4c comprising the high-frequency IC circuit portion RF1 and the semiconductor chip 4d comprising the base band portion BB1 are placed such that they adjoin each other.

In the semiconductor module 1, the type and number of the electronic components 3, 4 placed over the upper surface 2a and under surface 2b of the wiring substrate 2 can be variously changed. This change is made according to a system (device) to be configured by the semiconductor module 1. However, at least one electronic component is placed over each of the upper surface 2a and under surface 2b of the wiring substrate 2. In this case, it is desirable to design also the arrangement of the electronic components from the above viewpoint. (The arrangement of the electronic components refers to which electronic component should be placed on each of the upper surface 2a side and the under surface 2b side of the wiring substrate 2.)

<Manufacturing Process for Semiconductor Module>

Description will be given to an example of the manufacturing process (assembling step) for the semiconductor module 1 in this embodiment with reference to drawings.

FIG. 10 to FIG. 30 are plan views or sectional views of the semiconductor module 1 in this embodiment in manufacturing process (at an assembling step). The semiconductor module 1 in this embodiment can be manufactured, for example, as described below:

In the following description of this embodiment, a case where individual semiconductor modules 1 are manufactured using a multiple wiring substrate (wiring substrate parent body) 31 will be taken as an example. In a multiple wiring substrate, multiple wiring substrates 2 are formed such that they are tied together in line or in an array pattern.

Figure 10:
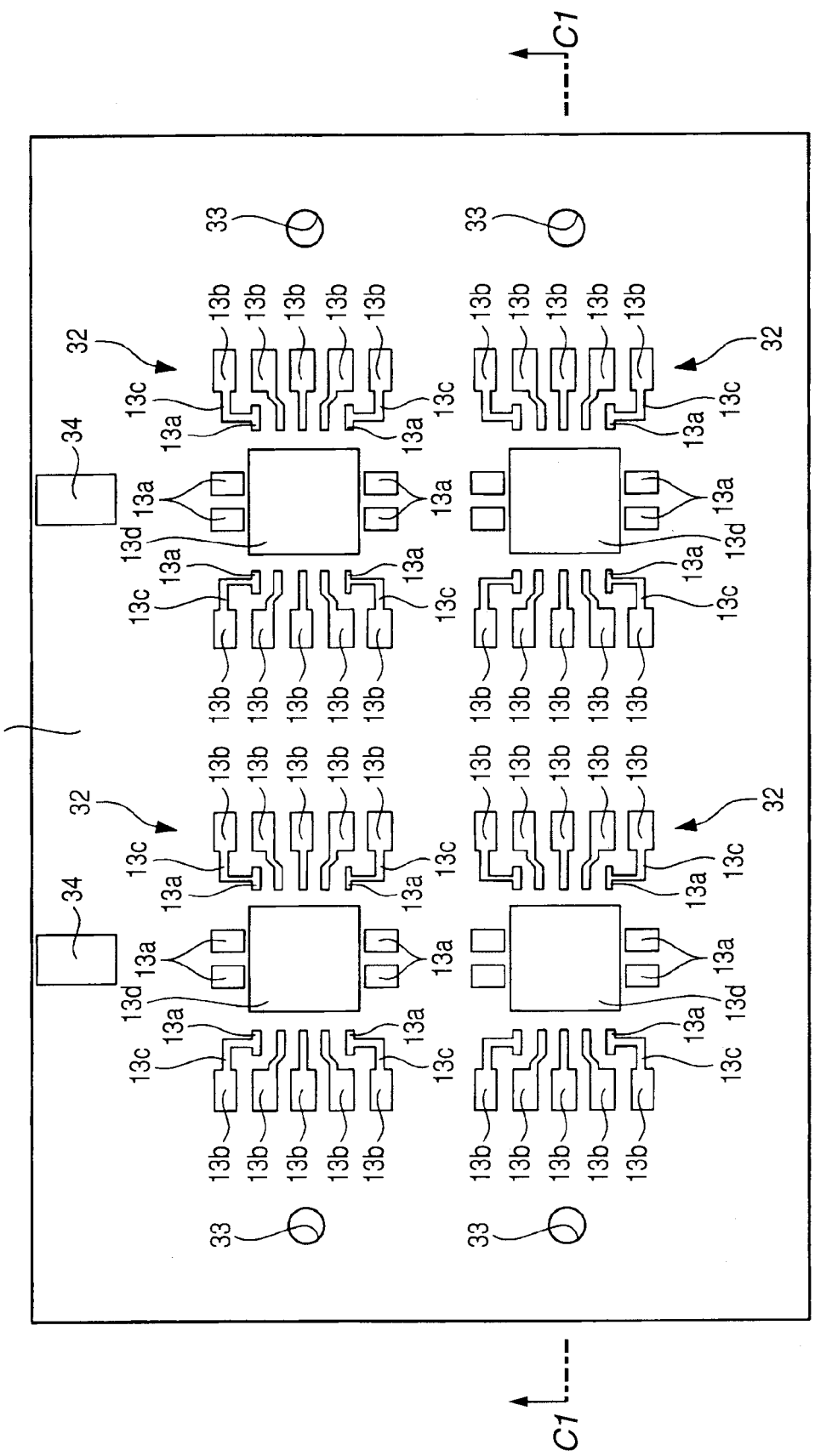
FIG. 10 is a bottom view of a wiring substrate used for the manufacture of a semiconductor module in an embodiment of the invention.
Figure 11:
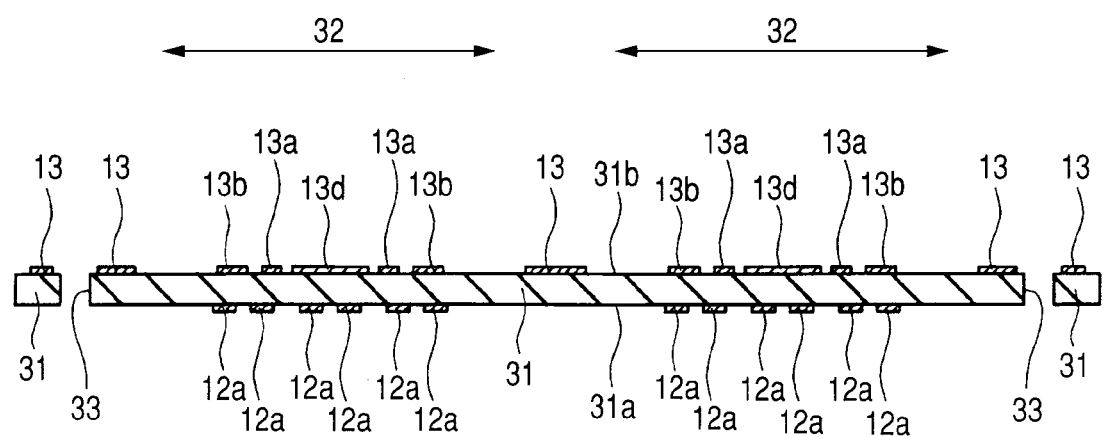
FIG. 11 is a sectional view of the wiring substrate in FIG. 10.
Figure 12:
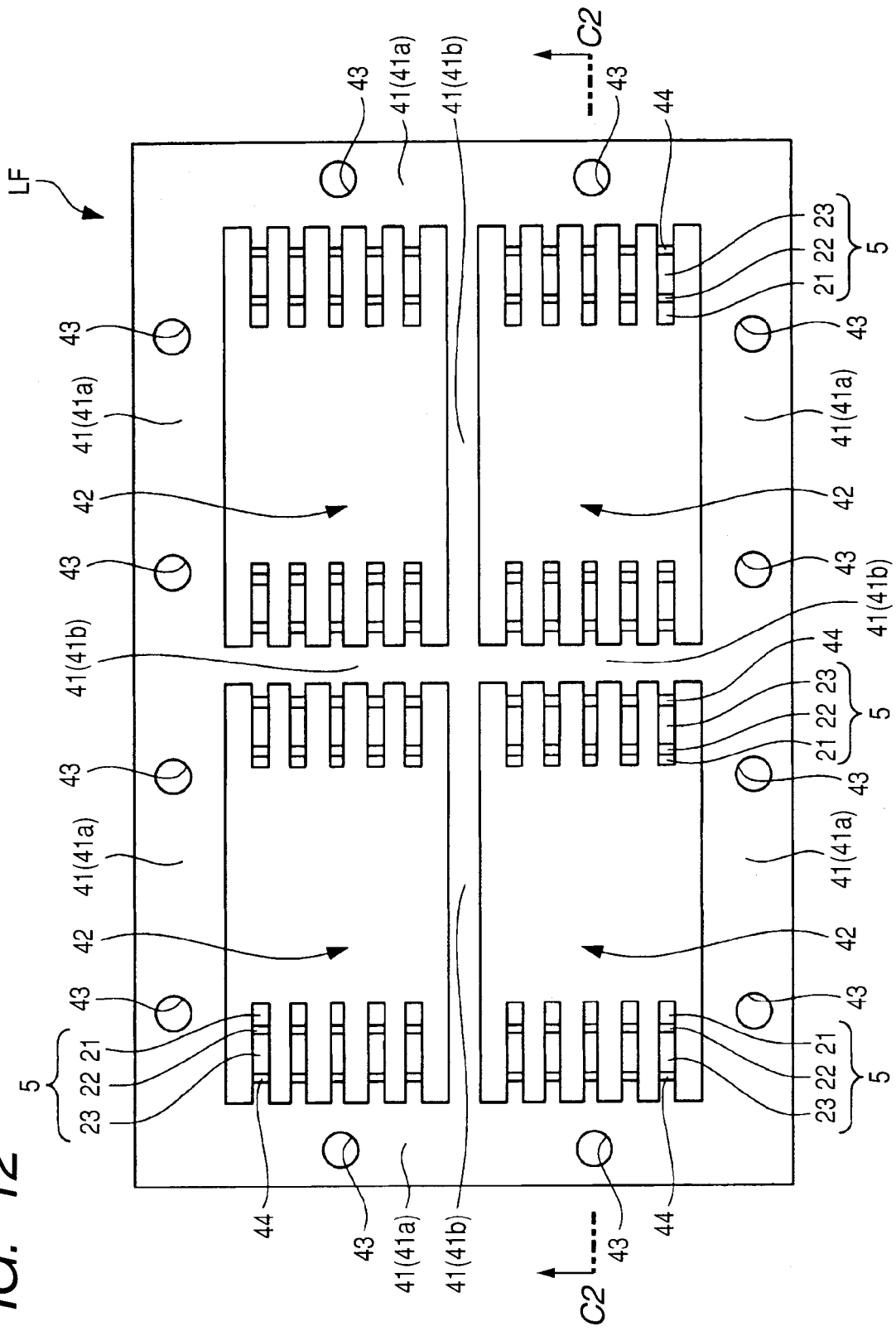
FIG. 12 is a bottom view of a lead frame used for the manufacture of a semiconductor module in an embodiment of the invention.
Figure 13:
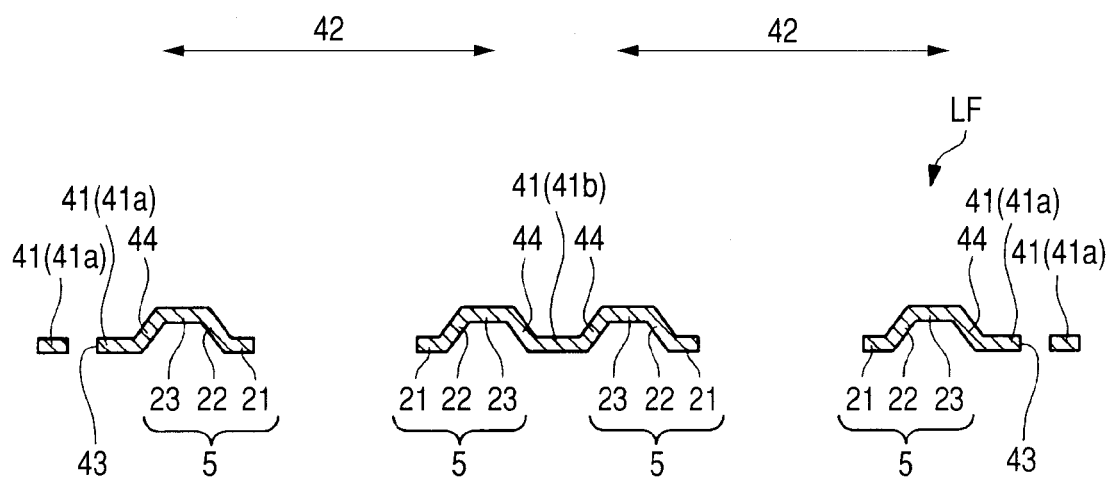
FIG. 13 is a sectional view of the lead frame in FIG. 12.

First, a wiring substrate 31 and a lead frame LF for the manufacture of the semiconductor module 1 are provided (prepared). FIG. 10 is a plan view of the wiring substrate 31; FIG. 11 is a sectional view of the wiring substrate 31; FIG. 12 is a plan view of the lead frame LF; FIG. 13 is a sectional view of the lead frame LF. FIG. 10 illustrates the main surface 31b of the wiring substrate 31 corresponding to the under surface 2b of each wiring substrate 2. FIG. 12 illustrates the main surface of the lead frame LF opposite to the side where it is opposed to the main surface 31b of the wiring substrate 31 when the lead frame LF is placed over the main surface 31b of the wiring substrate 31. The plan view of the wiring substrate 31 on the main surface 31a side is identical with FIG. 26 referred to later and it is omitted here. A sectional view taken along line C1-C1 of FIG. 10 substantially corresponds to FIG. 11 and a sectional view taken along line C2-C2 of FIG. 12 substantially corresponds to FIG. 13. However, when the lead frame LF is placed over the main surface 31b of the wiring substrate 31 as described later, line C1-C1 and line C2-C2 planarly agree with each other.

The wiring substrate 31 is the parent body (wiring substrate parent body) of the wiring substrate 2. What is obtained by cutting the wiring substrate 31 at the cutting step described later and separating it into individual semiconductor module regions (substrate regions, unit substrate regions) 32 corresponds to the wiring substrate 2 of the semiconductor module 1. In the wiring substrate 31, multiple semiconductor module regions 32 each of which is a region where one semiconductor module 1 is formed are arranged in line or in a matrix pattern. The wiring substrate 31 has a main surface 31a and a main surface 31b opposite to each other. The main surface 31a becomes the upper surface 2a of each wiring substrate 2 later and the main surface 31b becomes the under surface 2b of each wiring substrate 2 later. Therefore, in each semiconductor module region 32 in the main surface 31a of the wiring substrate 31, there are formed the electrode pads 12a and the wiring patterns 12b; and in each semiconductor module region 32 in the main surface 31b of the wiring substrate 31, there are formed the electrode pads 13a, 13b, wiring patterns 13c, and conductor patterns 13d for chip placement. The wiring substrate 31 includes hole portions (openings, through bores) 33 for positioning and gates (gate conductor patterns) 34 for injecting resin material at a molding step.

FIG. 10 and FIG. 11 illustrate an example in which four semiconductor module regions 32, two in rows×two in columns, are arranged to form the wiring substrate 31. However, the number of rows or columns of the semiconductor module regions 32 is not limited to two×two, needless to add.

In FIG. 10 to FIG. 30, the following measure will be taken for the sake of simplicity: only one semiconductor chip 4b and two chip components 4f will be representatively shown as electronic components 4 placed in each semiconductor module region 32 in the main surface 31b of the wiring substrate 31; and only nine chip components 3e will be representatively shown as electronic components 3 placed in each semiconductor module region 32 in the main surface 31a of the wiring substrate 31. In FIG. 10 and FIG. 11, for this reason, the following are schematically depicted in each semiconductor module region 32 of the wiring substrate 31: a conductor pattern 13d for chip placement where one semiconductor chip 4b is to be placed; electrode pads 13a to which the semiconductor chip 4b is to be electrically coupled via the wire WA; the electrode pads 13a to which the chip components 4f are to be coupled; and electrode pads 13b to which leads 5 are to be coupled. In the plan view in FIG. 26 referred to later, the electrode pads 12a to which nine chip components 3e are to be coupled are schematically depicted in each semiconductor module region 32 of the wiring substrate 31. In actuality, however, each semiconductor module region 32 in the main surface 31b (FIG. 10) of the wiring substrate 31 has the same configuration as in FIG. 8; and each semiconductor module region 32 in the main surface 31a (FIG. 26) of the wiring substrate 31 has the same configuration as in FIG. 7. In actuality, the semiconductor chips 4a, 4b, 4c, 4d, 4e and the chip components 4f are placed as the electronic components 4 in each semiconductor module region 32 in the main surface 31b of the wiring substrate 31 as illustrated in FIG. 6; and the filters 3a, 3b, oscillating element 3c, semiconductor chip 3d, and chip components 3e are placed as the electronic components 3 in each semiconductor module region 32 in the main surface 31a of the wiring substrate 31 as illustrated in FIG. 2.

The lead frame LF illustrated in FIG. 12 and FIG. 13 is formed of conductive material (metal material) such as copper or copper alloy. The lead frame LF includes a frame 41 and multiple leads (lead portions) 5 integrally tied to the frame 41. The thickness of the lead frame LF can be set to, for example, 0.15 mm or so.

In the lead frame LF, multiple semiconductor module regions 42 each of which is a region where one semiconductor module 1 is formed are arranged in line or in a matrix pattern. The numbers of rows and columns of arranged semiconductor module regions 32 in the wiring substrate 31 are identical with the numbers of rows and columns of arranged semiconductor module regions 42 in the lead frame LF. A number of leads 51 required to manufacture one semiconductor module 1 are placed in each semiconductor module region 42 of the lead frame LF.

The frame 41 integrally includes frame portions 41a comprising the periphery of the lead frame LF and coupling portions 41b that couple opposite frame portions 41a together (in the middle region of each frame portion 41a). There are the following leads 5: those integrally coupled to a frame portion 41a and those integrally coupled to a coupling portion 41b. Each coupling portion 41b is extended between adjacent semiconductor module regions 42. In the frame portions 41a of the frame 41, there are formed hole portions (openings, through bores) 43 used both for positioning and for transportation.

In the lead frame LF, the frame portions 41a and coupling portions 41b of the frame 41 and the first portion 21 of each lead 5 are located at the same height position. That is, in the lead frame LF, the under surfaces of the frame portions 41a and coupling portions 41b of the frame 41 are flush with the under surface of the first portion 21 of each lead 5. When the lead frame LF is placed over the main surface 31b of the wiring substrate 31 as described later, the following takes place: the under surfaces of the frame portions 41a and coupling portions 41b of the frame 41 and the under surface of the first portion 21 of each lead 5 are opposed to the main surface 31b of the wiring substrate 31. For this reason, in the lead frame LF, the third portion 23 of each lead 5 is positioned higher than the frame 41. As mentioned above, the first portion 21 and the third portion 23 are integrally tied to each other via the second portion 22 bent (folded) from them. (The end portion opposite to the side where it is joined to the second portion 22 of) the third portion 23 of each lead 5 is integrally coupled as follows: it is integrally coupled to (a frame portion 41a or a coupling portion 41b of) the frame 41 via a bent portion 44 bent (folded) from the third portion 23 in a direction close to the frame 41. In the lead frame LF, the frame 41, bent portions 44, and leads 5 are integrally formed.

Figure 14:
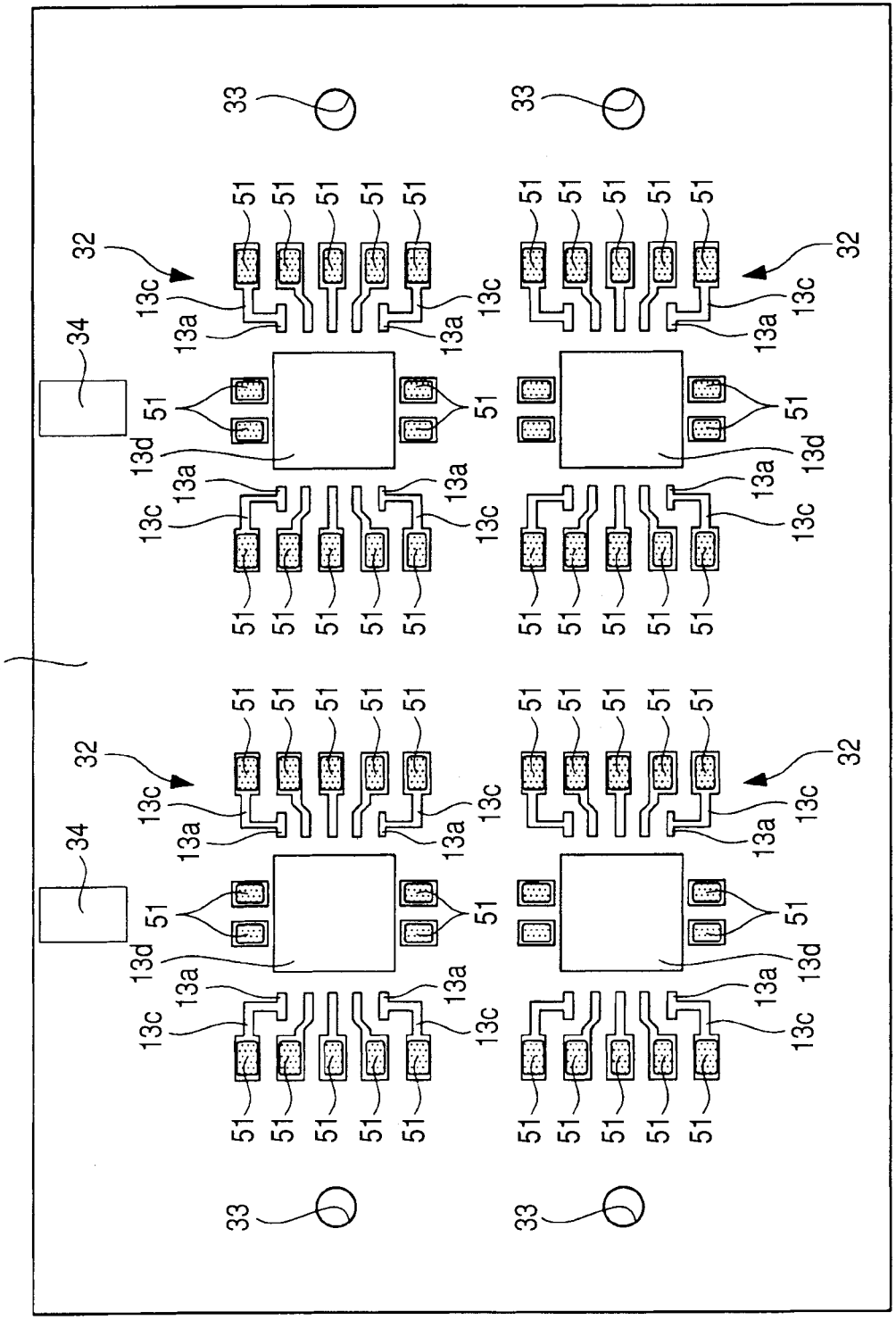
FIG. 14 is a plan view of a semiconductor module in an embodiment of the invention in manufacturing process.
Figure 15:
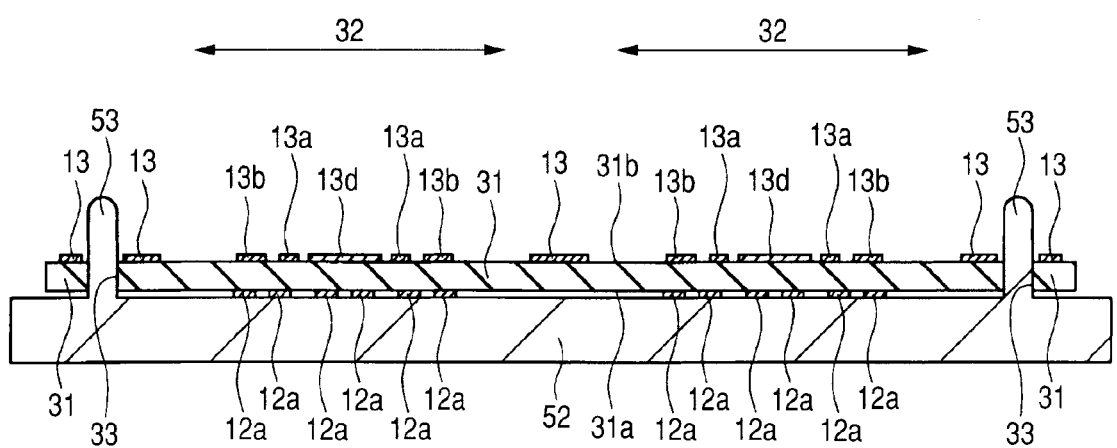
FIG. 15 is a sectional view of the semiconductor module in manufacturing process, following FIG. 14.

After the preparation of the above-mentioned wiring substrate 31 and lead frame LF, the main surface 31b of the wiring substrate 31 is directed upward. Then solder is printed on the main surface 31b of the wiring substrate 31 as illustrated in FIG. 14 (plan view). Specifically, solder paste 51 is applied to (printed, placed) over the electrode pads 13a, 13b in each semiconductor module region 32 in the main surface 31b of the wiring substrate 31 by a print process or the like. At this time, the solder paste 51 is not applied to all the electrode pads 13a in each semiconductor module region 32 in the main surface 31b of the wiring substrate 31. The solder paste 51 is applied to the electrode pads 13a where the solder mounted electronic components (the chip components 4f in this example) of the electronic components 4 should be placed (coupled); however, the solder paste 51 is not applied to any of the electrode pads 13a to which the wire WA is bonded later. The solder paste 51 is applied to the electrode pads 13b to which the leads 5 of the lead frame LF should be soldered. Though FIG. 14 is a plan view, the solder paste 51 is hatched with dots to facilitate visualization. In FIG. 15 (sectional view) referred to later, the solder paste 51 is omitted.

Subsequently, the wiring substrate 31 with the solder paste 51 printed thereon is set (placed) over a transport carrier 52 as illustrated in FIG. 15 (sectional view). More specific description will be given. The upper surface (the main surface on the side where the wiring substrate 31 is placed) of the transport carrier 52 is provided with pins (pin portions, projected portions) 53 for positioning. The wiring substrate 31 is placed over the transport carrier 52 such that the pins 53 of the transport carrier 52 are inserted (fit)) into the hole portions 33 in the wiring substrate 31. At this time, the wiring substrate 31 is placed over the transport carrier 52 such that the following is implemented: the main surface 31b of the wiring substrate 31 faces upward and the main surface 31a of the wiring substrate 31 is opposed to the upper surface of the transport carrier 52.

Figure 16:
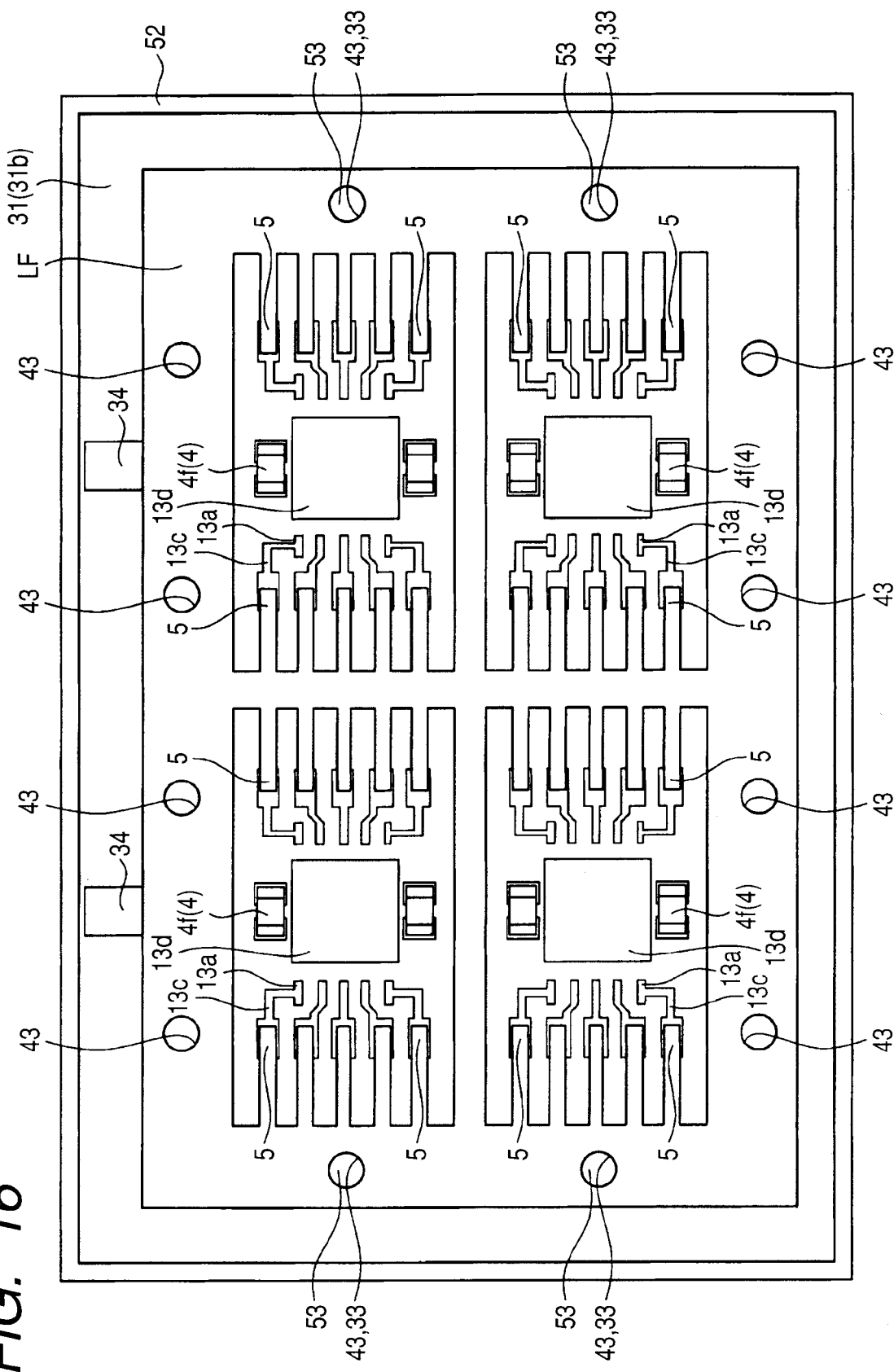
FIG. 16 is a plan view of the semiconductor module in manufacturing process, following FIG. 15.

Subsequently, the following processing is carried out as illustrated in FIG. 16 (plan view) and FIG. 17 (sectional view): the solder mounted electronic components (the chip components 4f in this example) of the electronic components 4 are placed (set) over each semiconductor module region 32 in the main surface 31b of the wiring substrate 31 set over the transport carrier 52; and the lead frame LF is set (placed) over the main surface 31b of the wiring substrate 31. At this time, positioning is carried out such that the electrodes of the chip components 4f planarly overlap with the areas directly above the electrode pads 13a with the solder paste 51 applied thereto and the chip components 4f are set. The lead frame LF is set over the main surface 31b of the wiring substrate 31 such that the following is implemented: the pins 53 of the transport carrier 52 are inserted (fit) into the hole portions 43 in the lead frame LF. (The pins 53 refer to their portions that penetrate the hole portions 33 in the wiring substrate 31 and protruded upward from the main surface 31b of the wiring substrate 31.) As a result, the hole portions 33 in the wiring substrate 31 and the hole portions 43 in the lead frame LF planarly overlap with each other and the pins 53 of the transport carrier 52 are inserted thereinto. Placement (setting) of the solder mounted electronic components (the chip components 4f in this example) over the main surface 31b of the wiring substrate 31 or placement (setting) of the lead frame LF may be carried out first. Or, they may be simultaneously carried out. When the lead frame LF is set over the main surface 31b of the wiring substrate 31, adhesive or the like may be used to glue at least part of the frame 41 of the lead frame LF to the main surface 31b of the wiring substrate 31. This makes it possible to more appropriately prevent the lead frame LF from being displaced or lifted from the wiring substrate 31.

Figure 17:
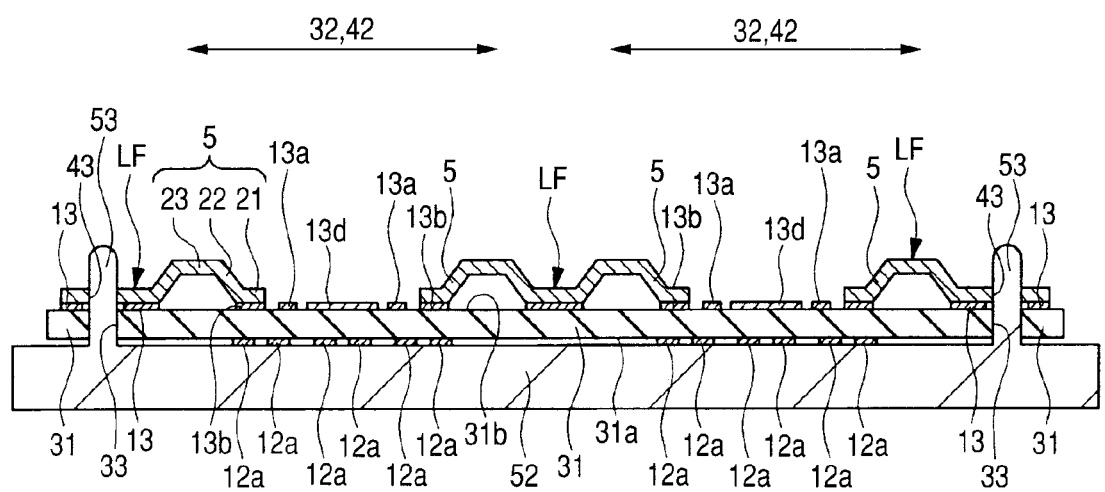
FIG. 17 is a sectional view of the semiconductor module in FIG. 16 in manufacturing process.

As illustrated in FIG. 16 and FIG. 17, the common pins 53 are inserted into the hole portions 33 provided in the wiring substrate 31 and the hole portions 43 provided in the lead frame LF. As a result, it is possible to fix the relative positional relation between the lead frame LF and the wiring substrate 31. As mentioned above, the pins 53 of the transport carrier 52 are inserted into the hole portions 33 in the wiring substrate 31 and the corresponding hole portions 43 in the lead frame LF. The hole portions 33 in the wiring substrate 31 and the corresponding hole portions 43 in the lead frame LF are so formed that the following is implemented at this time: (the first portions 21 of) the leads 5 of the lead frame LF planarly overlap with the areas directly above the electrode pads 13b with the solder paste 51 applied thereto. For this reason, the following takes place when the lead frame LF is placed over the wiring substrate 31 as illustrated in FIG. 16 and FIG. 17: the first portions 21 of the leads 5 of the lead frame LF are set over the electrode pads 13b with the solder paste 51 applied thereto. Since the relative positional relation between the lead frame LF and the wiring substrate 31 is fixed by the pins 53 of the transport carrier 52, the following can be prevented during the solder reflow step or the like carried out later: the lead frame LF and the wiring substrate 31 can be prevented from getting out of alignment; and (the first portions 21 of) the leads 5 of the lead frame LF can be prevented from being displaced from the electrode pads 13b of the wiring substrate 31.

In the lead frame LF, as mentioned above, the under surfaces of the frame portions 41a and coupling portions 41b of the frame 41 and the under surface of the first portion 21 of each lead 5 are flush with each other. For this reason, when the lead frame LF is set (placed) over the main surface 31b of the wiring substrate 31 as illustrated in FIG. 16 and FIG. 17, the following can be brought into contact with the main surface 31b of the wiring substrate 31: the under surfaces of the frame portions 41a and coupling portions 41b of the frame 41 of the lead frame LF and the under surface of the first portion 21 of each lead 5. This makes it possible to stably hold the lead frame LF over the main surface 31b of the wiring substrate 31.

It is desirable that the step (the step in FIG. 14) for printing the solder paste 51 over the main surface 31b of the wiring substrate 31 should be carried out before the wiring substrate 31 is set over the transport carrier 52. The reason for this is as follows: when the pins 53 for positioning are inserted into the hole portions 33 for positioning in the wiring substrate 31, the pins 53 are protruded to above the main surface 31b of the wiring substrate 31; and this makes it difficult to place a mask (solder printing mask) used at a step for printing the solder paste 51 over the wiring substrate 31. In cases where the mask (solder printing mask) used at the step for printing the solder paste 51 is so configured that it can avoid the pins 53 protruded to above the main surface 31b of the wiring substrate 31, the following procedure may be taken: after the wiring substrate 31 is set over the transport carrier 52, the step (the step in FIG. 14) for printing the solder paste 51 over the main surface 31b of the wiring substrate 31 may be carried out.

Subsequently, with the lead frames LF and the chip components 4f placed over the wiring substrate 31 set over the transport carrier 52 as illustrated in FIG. 16 and FIG. 17, solder reflow processing (heat treatment) is carried out. The solder paste 51 is thereby melted and hardened to carry out the following in each semiconductor module region 32 in the main surface 31b of the wiring substrate 31: (the electrodes of) the chip components 4f are joined (soldered) to the electrode pads 13a in the main surface 31b of the wiring substrate 31 via the solder 9; and (the first portions 21 of) the leads 5 are joined (soldered) to the electrode pads 13b in the main surface 31b of the wiring substrate 31 via the solder comprising the joining material 10. The solder 9 and the solder comprising the joining material 10 are the melted and hardened solder paste 51. This solder reflow step can be considered as a solder reflow step for soldering the multiple leads 5 of the lead frame LF to (the multiple electrode pads 13b in) the main surface 31b of the wiring substrate 31. This solder reflow step is carried out as mentioned above. That is, the common pins 53 are inserted into the hole portions 33 in the wiring substrate 31 and the hole portions 43 in the lead frame LF; and the solder reflow step is carried out with the relative position between the lead frame LF and the wiring substrate 31 thereby fixed. Therefore, it is possible to prevent the leads 5 from being displaced from the electrode pads 13b and appropriately solder each lead 5 to an electrode pad 13b in the main surface 31b of the wiring substrate 31.

Subsequently, the wiring substrate 31 with the lead frame LF and the chip components 4f placed thereover is removed from the transport carrier 52. (The first portion 21 of) each lead 5 is soldered to an electrode pad 13b and the lead frame LF is thereby fixed on the wiring substrate 31. Therefore, even though the wiring substrate 31 is removed from the transport carrier 52, it is possible to prevent the lead frame LF from coming off from the wiring substrate 31. As another embodiment, the following measure may be taken in addition to soldering (the first portions 21 of) the leads 5 of the lead frame LF to the electrode pads 13b: part of the frame 41 of the lead frame LF may be soldered to the main surface 31b of the wiring substrate 31. This makes it possible to more reliably fix the lead frame LF on the wiring substrate 31.

Figure 18:
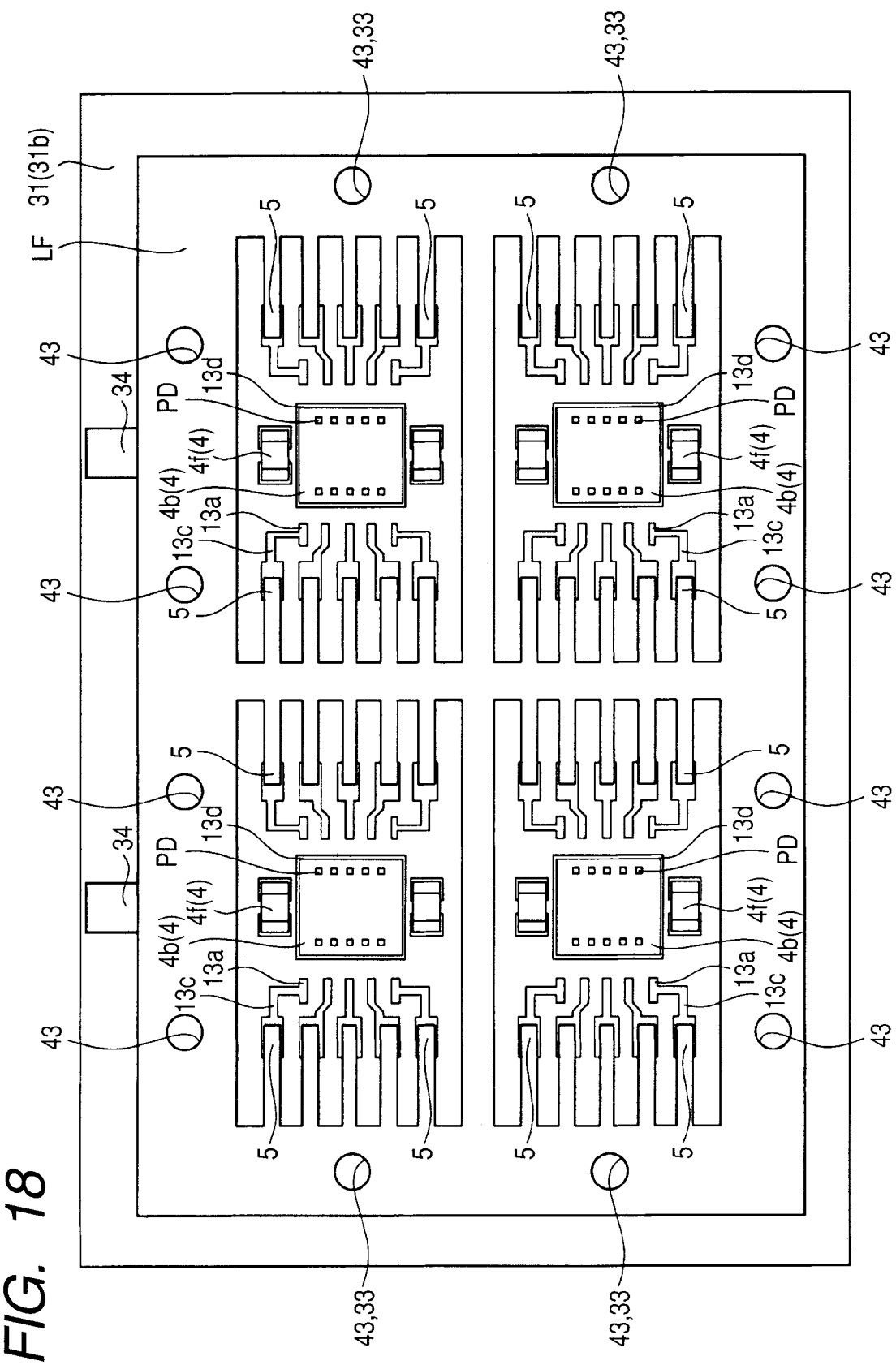
FIG. 18 is a plan view of the semiconductor module in manufacturing process, following FIG. 16.
Figure 19:
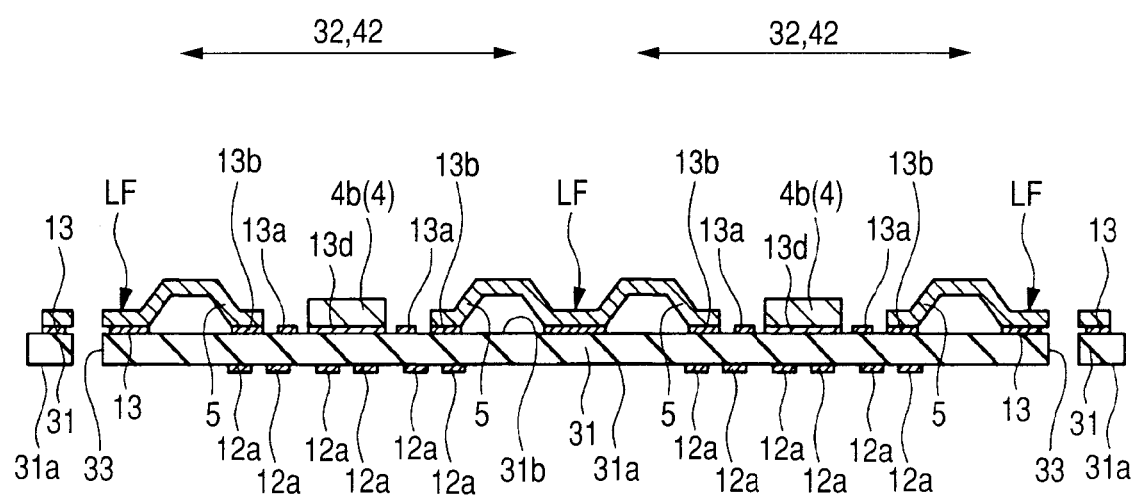
FIG. 19 is a sectional view of the semiconductor module in FIG. 18 in manufacturing process.

Subsequently, as illustrated in FIG. 18 (plan view) and FIG. 19 (sectional view), the following electronic components of the electronic components 4 are placed (set) over each semiconductor module region 32 in the main surface 31b of the wiring substrate 31: electronic components that are not solder mounted, the semiconductor chips 4a, 4b, 4c, 4d, 4e in this example. In FIG. 18 and FIG. 19, only the semiconductor chip 4b is depicted as a representative of the semiconductor chips 4a, 4b, 4c, 4d, 4e. In actuality, however, the semiconductor chips 4a, 4b, 4c, 4d, 4e are placed as illustrated in FIG. 6. At this time, the following procedure is used: die bonding material, such as silver paste, is applied to or set in areas where the semiconductor chips 4a, 4b, 4c, 4d, 4e are to be placed in each semiconductor module region 32 in the main surface 31b of the wiring substrate 31; and thereafter the semiconductor chips 4a, 4b, 4c, 4d, 4e are set thereover. Then the die bonding material is cured by thermal curing processing or the like and the semiconductor chips 4a, 4b, 4c, 4d, 4e are thereby fixed in the main surface 31b of the wiring substrate 31. The cured die bonding material is the joining material 8 and the joining material 8 is omitted in FIG. 19 for the sake of simplicity.

Of the semiconductor chips 4a, 4b, 4c, 4d, 4e, the semiconductor chips 4a, 4b having a back surface electrode BE may be soldered (that is, solder may be used as die bonding material). In this case, the following procedure is used: at the solder paste 51 printing step in FIG. 14, the solder paste 51 is applied (printed) also over the conductor patterns 13d for chip placement where the semiconductor chips 4a, 4b are to be placed; at the same step as for the chip components 4f, the semiconductor chips 4a, 4b are also set over the main surface 31b of the wiring substrate 31; and at the solder reflow step, the chip components 4f, leads 5, and semiconductor chips 4a, 4b are soldered to the wiring substrate 31. At the die bonding step in FIG. 18 and FIG. 19, the semiconductor chips 4c, 4d, 4e can be die bonded to over the main surface 31b of the wiring substrate 31 by paste adhesive or the like.

Some of the electronic components 4 are electronic components that are not solder mounted. (In this example, these electronic components include the semiconductor chips 4c, 4d, 4e and, in some cases, the semiconductor chips 4a, 4b as well.) The others of the electronic components 4 are solder mounted electronic components. (In this example, the solder mounted electronic components include the chip components and, in some cases, the semiconductor chips 4a, 4b as well.) It is desirable that a step for placing (mounting) the electronic components that are not solder mounted over the main surface 31b of the wiring substrate 31 should be carried out after the following step: a step for placing (mounting) the solder mounted electronic components over the main surface 31b of the wiring substrate 31. The reason for this is as follows: if electronic components that are not solder mounted are placed over the main surface 31b of the wiring substrate 31 first, it is difficult to place a solder printing mask over the main surface 31b of the wiring substrate 31; and this makes it difficult to print the solder paste 51 over the main surface 31b of the wiring substrate 31.

Figure 20:
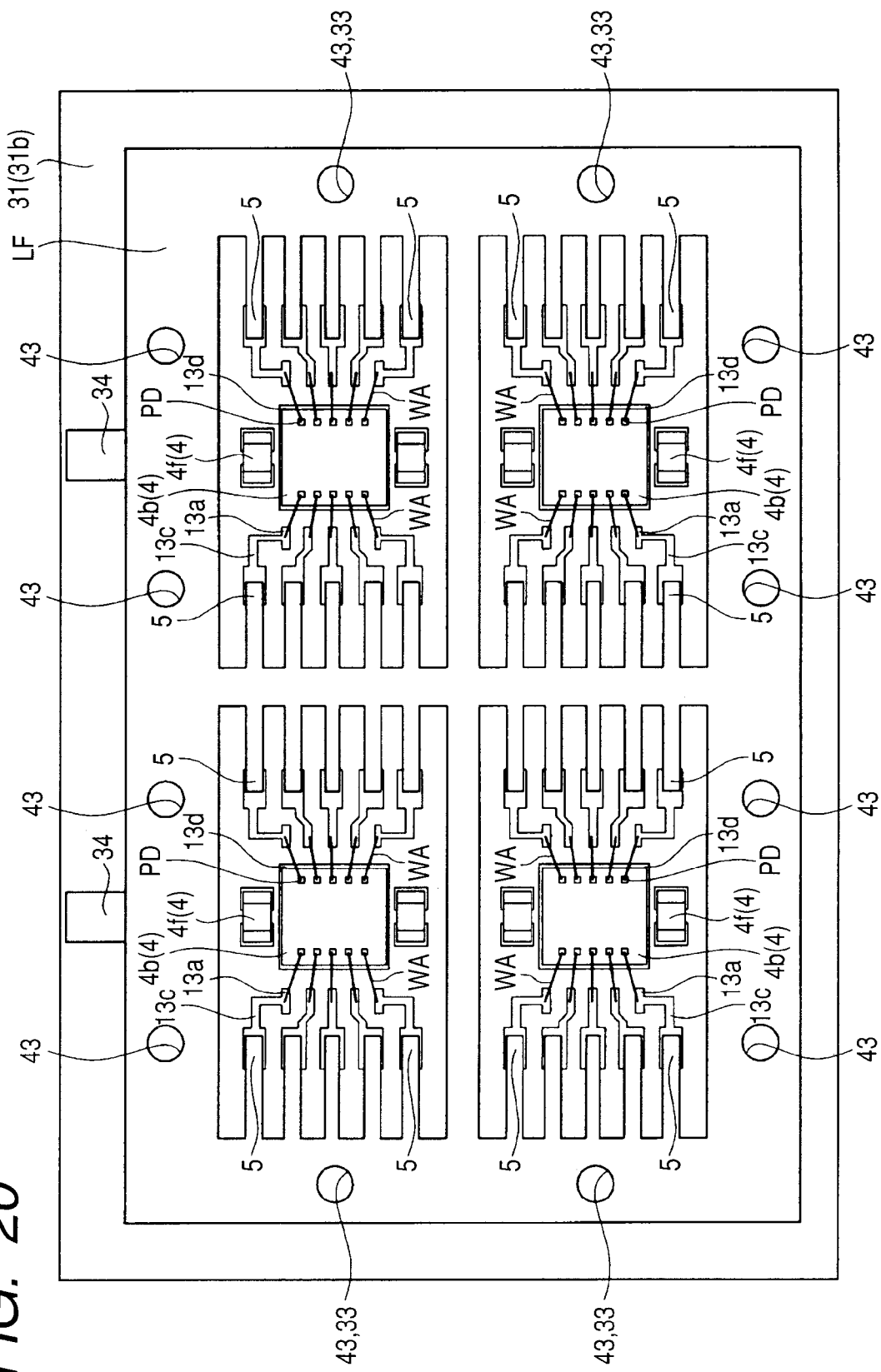
FIG. 20 is a plan view of the semiconductor module in manufacturing process, following FIG. 18.
Figure 21:
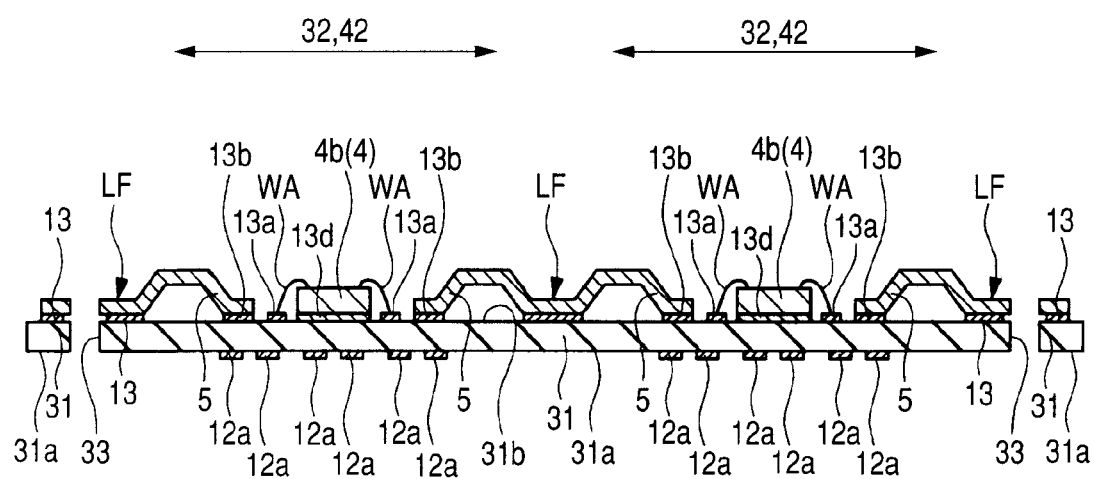
FIG. 21 is a sectional view of the semiconductor module in FIG. 20 in manufacturing process.

Subsequently, as illustrated in FIG. 20 (plan view) and FIG. 21 (sectional view), a wire bonding step is carried out to implement the following in each semiconductor module region 32 in the main surface 31b of the wiring substrate 31: the multiple electrodes PD of the semiconductor chips 4a, 4b, 4c, 4d, 4e and the multiple electrode pads 13a in the main surface 31b of the wiring substrate 31 are respectively electrically coupled together via multiple wires WA. In FIG. 20 and FIG. 21, only the semiconductor chip 4b is depicted as a representative of the semiconductor chips 4a, 4b, 4c, 4d, 4e. In actuality, however, the respective electrodes PD of the semiconductor chips 4a, 4b, 4c, 4d, 4e are respectively electrically coupled to the electrode pads 13a via the wires WA as illustrated in FIG. 6. Plasma processing may be carried out to clean the electrode pads 13a and the like before the wire bonding step is carried out. This makes it possible to further enhance the bonding reliability of the wire WA.

The process for placing the electronic components 4 and the lead frame over the main surface 31b of the wiring substrate 31 is carried out by the following steps: the steps from the solder paste 51 printing step (FIG. 14) to the wire WA bonding step (FIG. 20 and FIG. 21).

Figure 22:
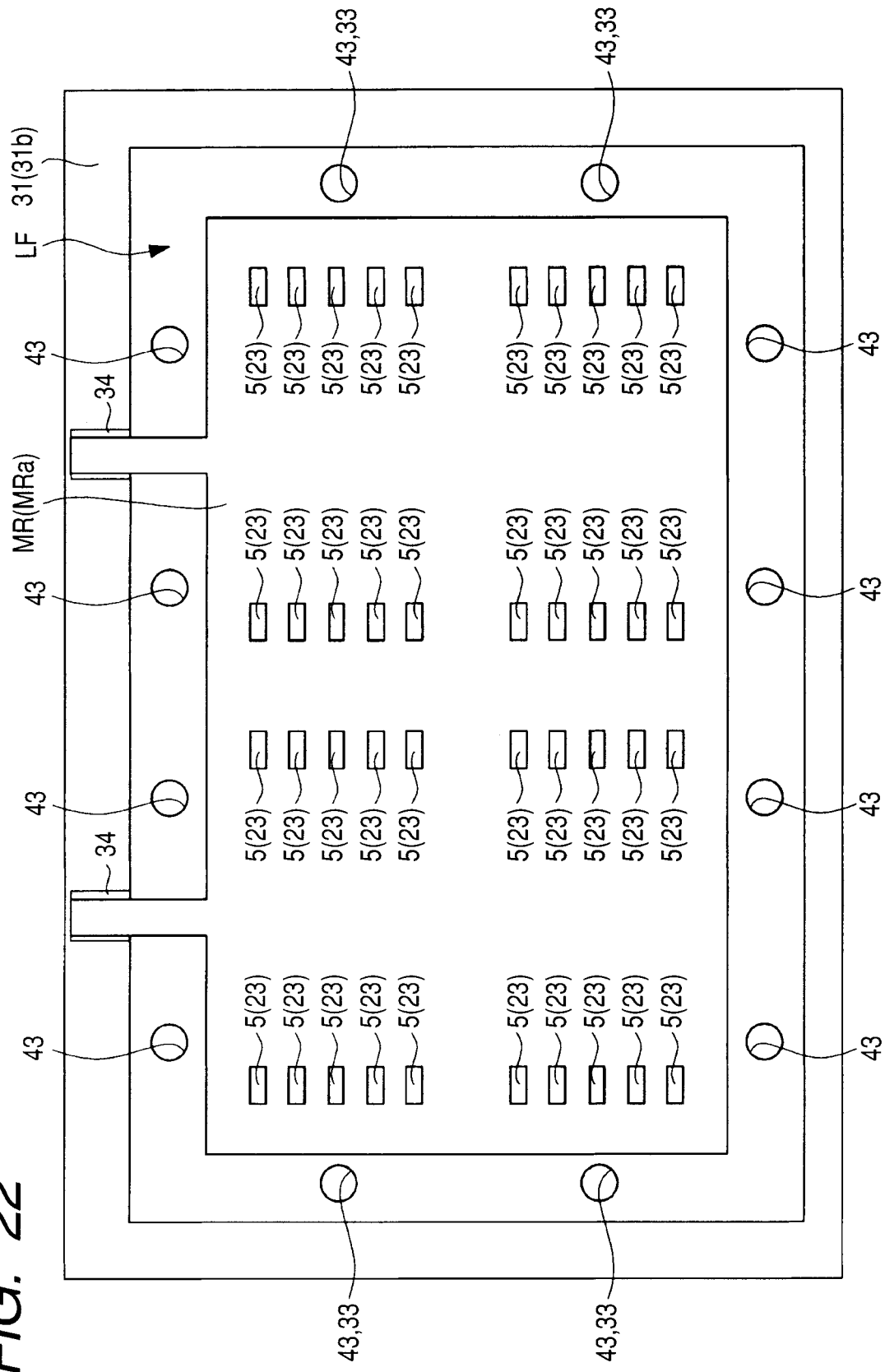
FIG. 22 is a plan view of the semiconductor module in manufacturing process, following FIG. 20.
Figure 23:
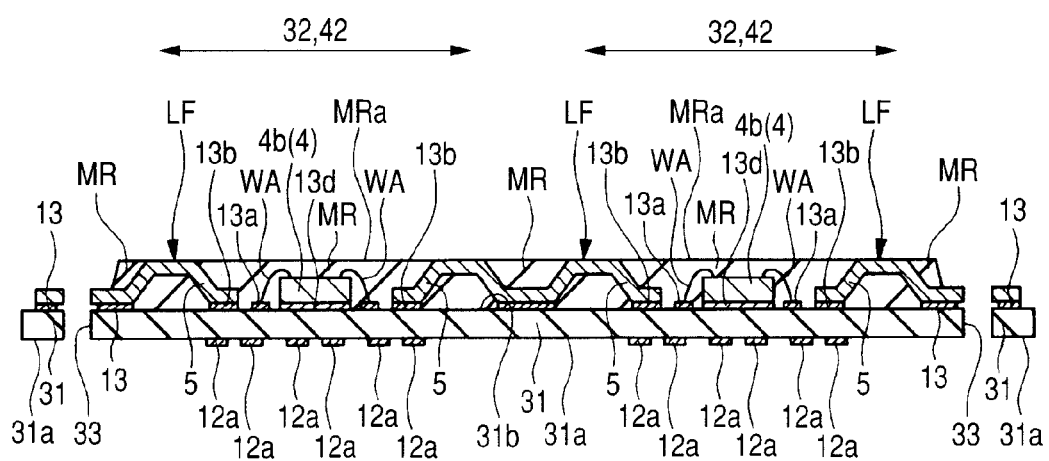
FIG. 23 is a sectional view of the semiconductor module in FIG. 22 in manufacturing process.
Figure 24:
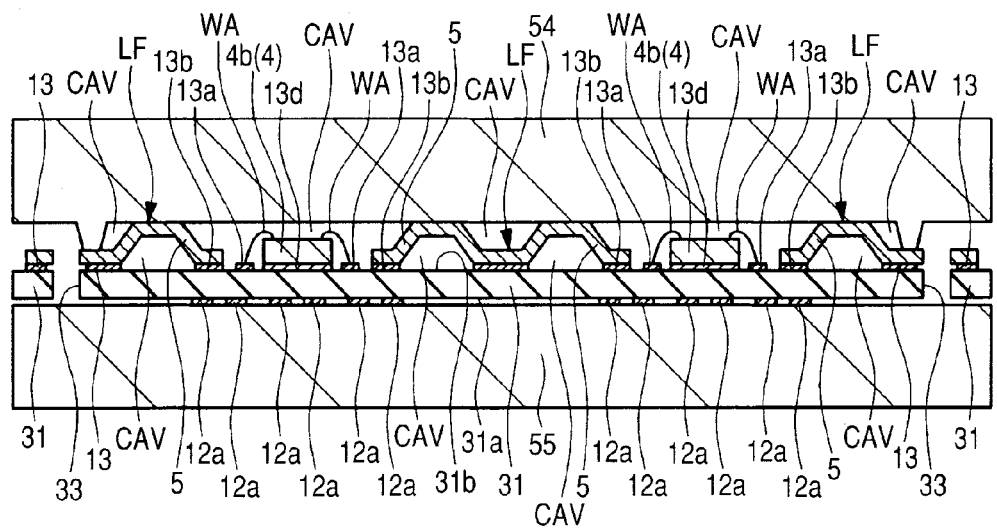
FIG. 24 is an explanatory drawing of a molding step.
Figure 25:
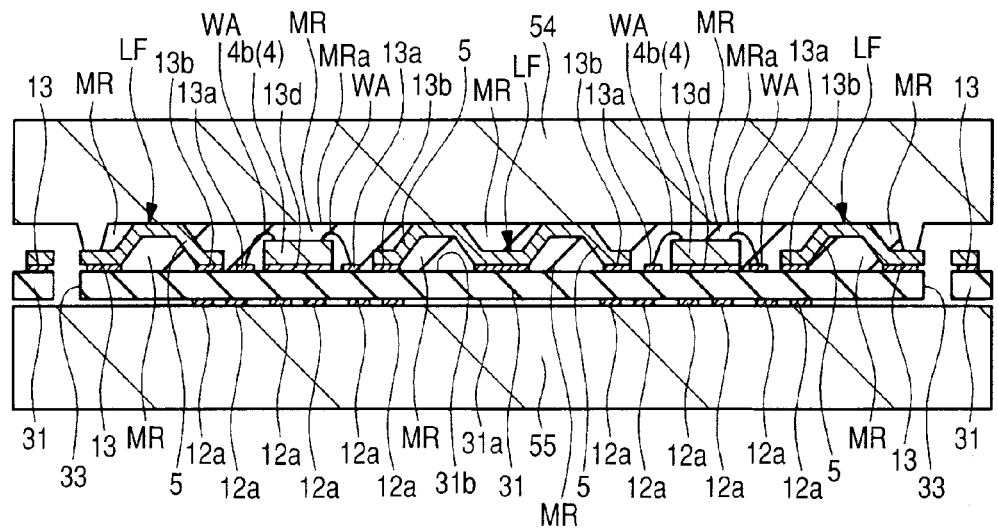
FIG. 25 is an explanatory drawing of a molding step.

Subsequently, as illustrated in FIG. 22 (plan view) and FIG. 23 (sectional view), a molding step (for example, transfer molding) is carried out to form encapsulation resin (sealing body) MR. The encapsulation resin MR is a resin sealing body that is formed over the main surface 31b of the wiring substrate 31 and seals the electronic components 4 and the leads 5 and becomes the encapsulation resin 6 later. The molding step for forming the encapsulation resin MR can be carried out, for example, as described below. FIG. 24 and FIG. 25 are explanatory drawings (sectional views) of the molding step.

As illustrated in FIG. 24, the wiring substrate 31 with the electronic components 4 and the lead frame LF placed thereover is clamped between an upper die 54 and a lower die 55 from above and below. Resin material for forming the encapsulation resin MR is injected (introduced) into the cavity CAV formed between the upper die 54 and the lower die 55 and then this resin material is cured (by, for example, thermal curing). As a result, the encapsulation resin MR can be formed as illustrated in FIG. 25. Thereafter, the upper die 54 and the lower die 55 are released from each other and the wiring substrate 31 with the encapsulation resin MR formed thereon is taken out. Thus the structure illustrated in FIG. 22 and FIG. 23 is obtained.

At this molding step, as seen from FIG. 22 as well, the encapsulation resin MR is so formed that part (that is, the third portion 23) of each lead 5 is exposed from the main surface MRa of the encapsulation resin MR. To implement this, for example, the following measure can be taken when the wiring substrate 31 is clamped between the upper die 54 and the lower die 55 as illustrated in FIG. 24: the under surface of the upper die 54 is brought into contact with the upper surface of the third portion 23 of each lead 5 of the lead frame LF. (This upper surface becomes the upper surface 23a later.) Thus the encapsulation resin MR is prevented from being formed over the upper surface of the third portion 23 of each lead 5 of the lead frame LF.

Figure 26:
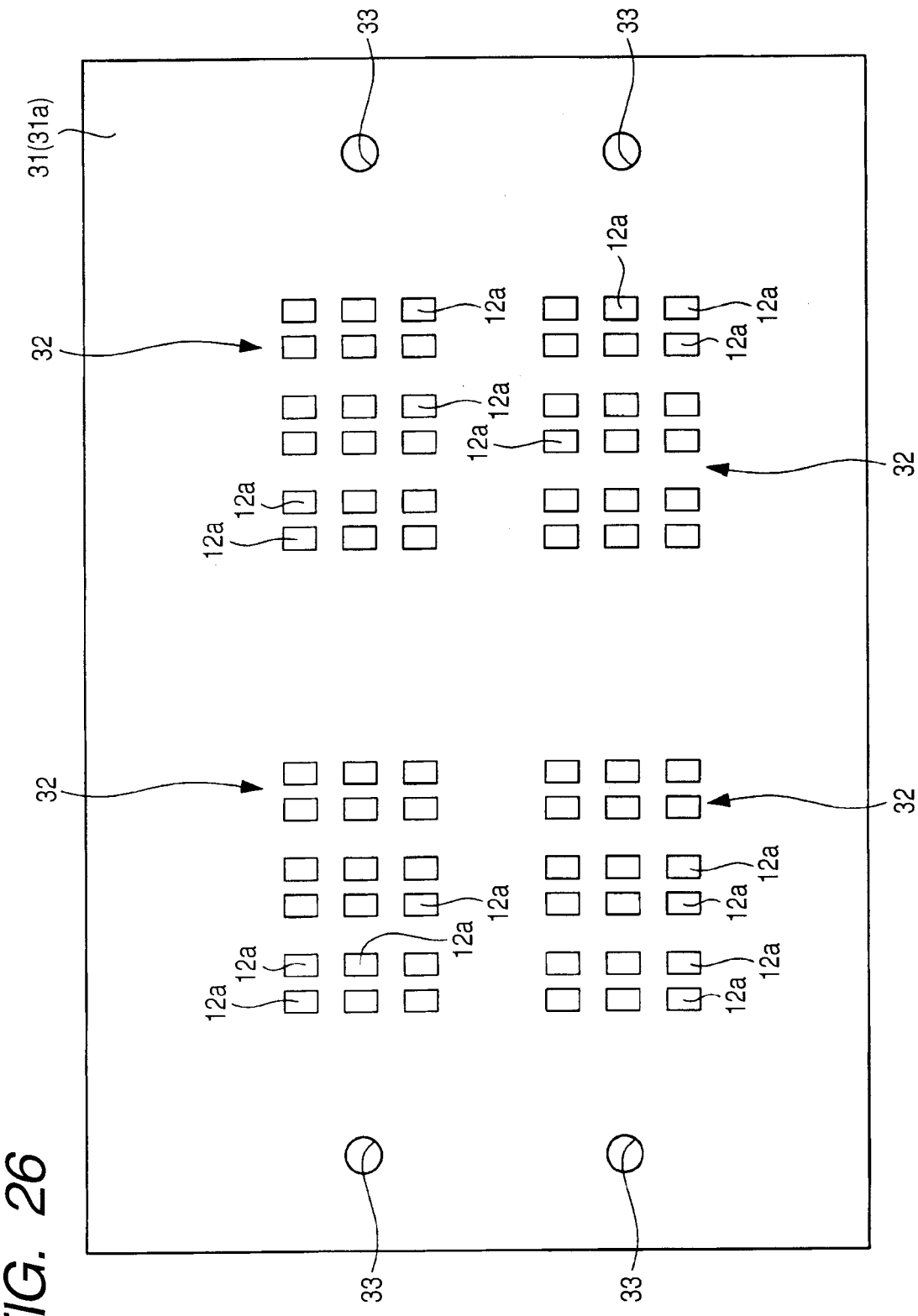
FIG. 26 is a plan view of the semiconductor module in manufacturing process, following FIG. 22.
Figure 27:
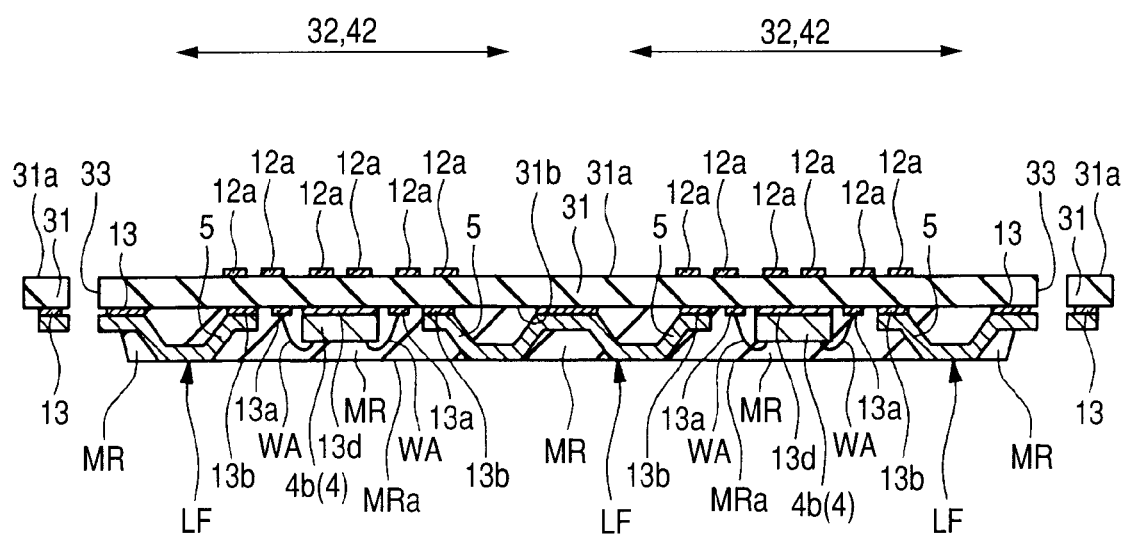
FIG. 27 is a sectional view of the semiconductor module in FIG. 26 in manufacturing process.
Figure 28:
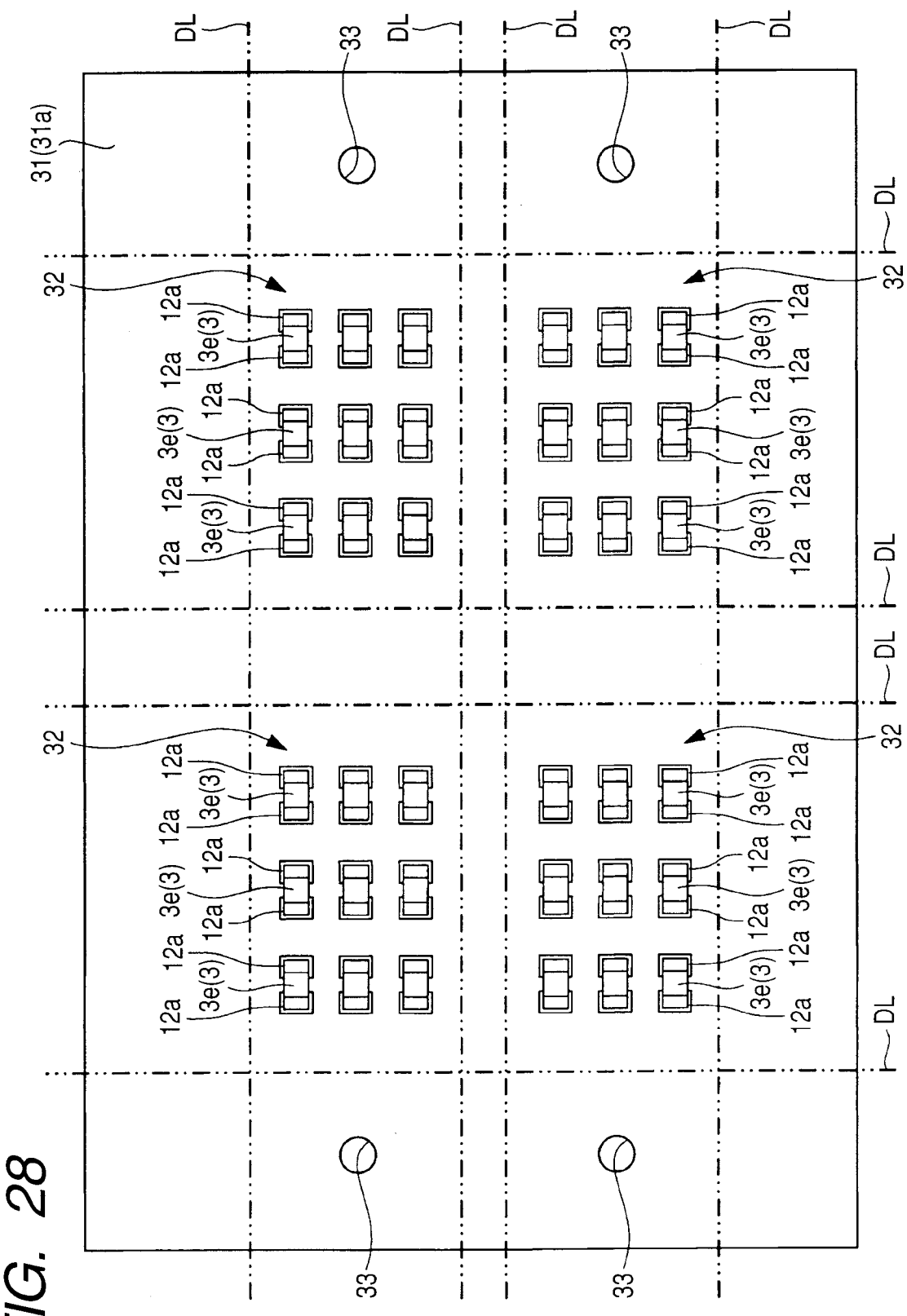
FIG. 28 is a plan view of the semiconductor module in manufacturing process, following FIG. 26.
Figure 29:
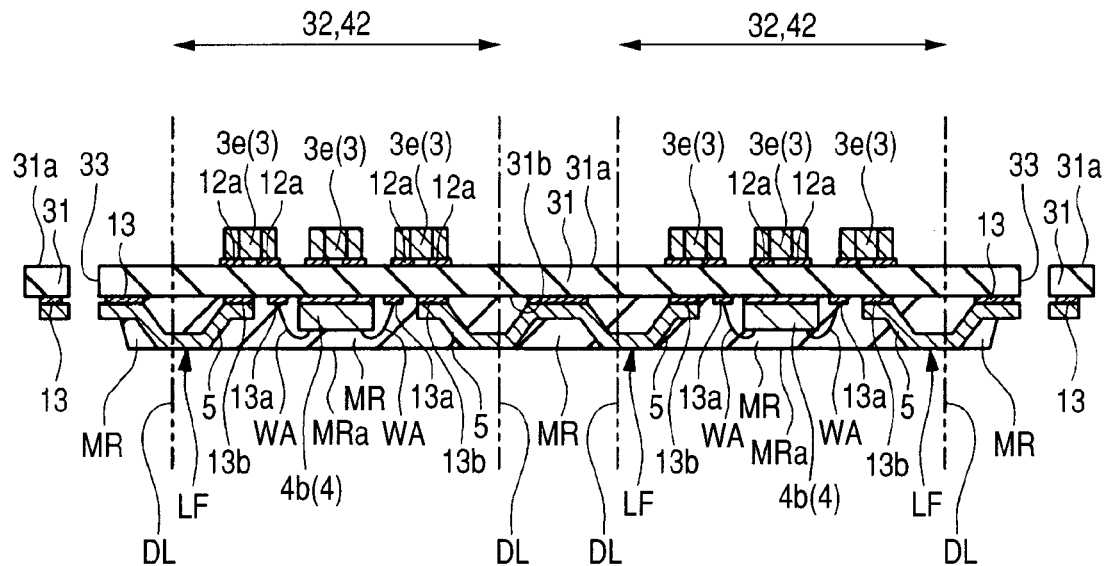
FIG. 29 is a sectional view of the semiconductor module in FIG. 28 in manufacturing process.

After the formation of the encapsulation resin MR, the main surface 31a of the wiring substrate 31 is directed upward as illustrated in FIG. 26 (plan view) and FIG. 27 (sectional view). Then solder is printed to the main surface 31a of the wiring substrate 31 and thereafter, the following processing is carried out as illustrated in FIG. 28 (plan view) and FIG. 29 (sectional view): at least one electronic component 3 is placed (set) over each semiconductor module region 32 in the main surface 31a of the wiring substrate 31. In this example, the filters 3a, 3b, oscillating element 3c, semiconductor chip 3d, and chip components 3e are placed (set). More specific description will be given. Solder paste (that becomes the solder 7 later) is applied over the electrode pads 12a in each semiconductor module region 32 in the main surface 31a of the wiring substrate 31 by a print process or the like. Thereafter, positioning is carried out such that the electrodes of each electronic component 3 planarly overlap with the areas directly above the electrode pads 12a with the solder paste applied thereto and the filters 3a, 3b, oscillating element 3c, and chip components 3e are set. In FIG. 28 and FIG. 29, only the chip components 3e are depicted as a representative of the electronic components 3. In actuality, however, the filters 3a, 3b, oscillating element 3c, semiconductor chip 3d, and chip components 3e are placed as illustrated in FIG. 2. As seen from FIG. 5 as well, the semiconductor chip 3d is bonded face down to the main surface 31a of the wiring substrate 31; and positioning is carried out such that the solder bumps (that become the bump electrodes BP later) provided over the front surface of the semiconductor chip 3d is opposed to the electrodes 12a to which the semiconductor chip 3d is to be coupled.

Subsequently, solder reflow processing (heat treatment) is carried out. The solder paste applied to over the electrode pads 12a in the main surface 31a of the wiring substrate 31 is thereby melted and hardened. Thus the following is implemented in each semiconductor module region 32 in the main surface 31a of the wiring substrate 31: (the electrodes of) the filters 3a, 3b, oscillating element 3c, and chip components 3e are coupled (soldered) to the electrode pads 12a via the solder 7 and fixed. Further, the solder bumps of the semiconductor chip 3d are melted and hardened and the semiconductor chip 3d is thereby coupled to the electrode pads 12a via the bump electrodes (solder bumps) BP and fixed.

In this embodiment, a wire-bonded electronic component is not placed on the main surface 31a side of the wiring substrate 31. Therefore, the wire bonding step is not carried out for the main surface 31a of the wiring substrate 31.

Figure 30:
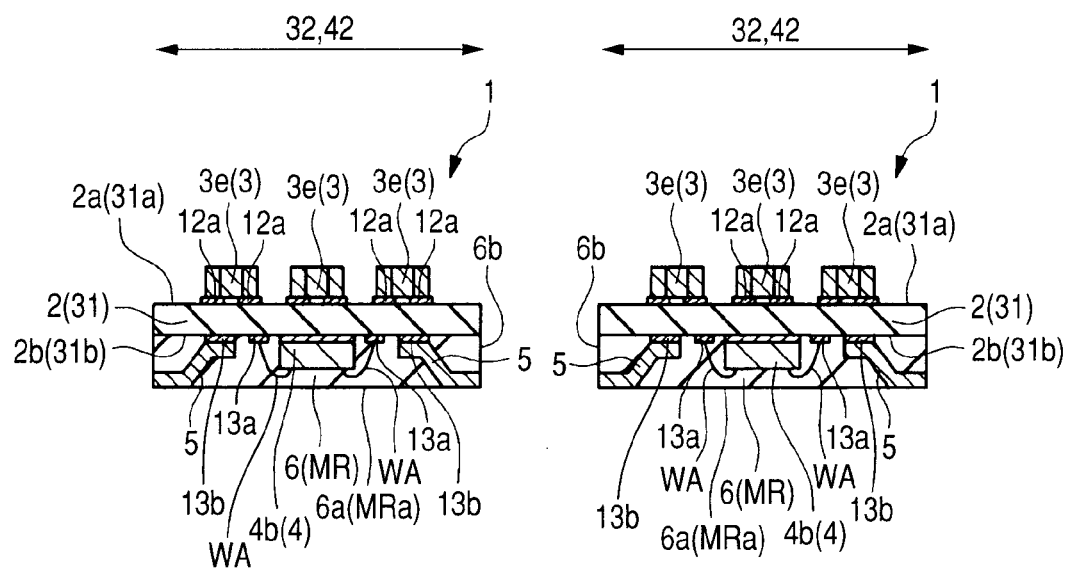
FIG. 30 is a sectional view of the semiconductor module in FIG. 29 in manufacturing process.

Subsequently, the wiring substrate 31, lead frame LF, and encapsulation resin MR are cut and separated (divided) into the individual semiconductor module regions 32, 42. Thus the semiconductor module 1 as each segmented piece is obtained as illustrated in FIG. 30 (sectional view). At this time, the wiring substrate 31, lead frame LF, and encapsulation resin MR are cut along cutting positions (cutting lines, dicing lines) DL indicated by alternate long and two short dashes lines in FIG. 28 and FIG. 29. This cutting step can be carried out by dicing. At this cutting step, the lead frame LF is so cut that the following is implemented: the frame 41 or the bent portions 44 are not left in each semiconductor module 1 and only the leads 5 each comprised of the first portion 21, second portion 22, and third portion 23 are left on the semiconductor module 1 side. Each piece obtained by cutting and separating (dividing) the wiring substrate 31 becomes the wiring substrate 2 of each semiconductor module 1; the leads 5 cut and separated (divided) from (the frame 41 of) the lead frame LF becomes the leads 5 of the semiconductor module 1; and each piece obtained by cutting and separating (dividing) the encapsulation resin MR becomes the encapsulation resin 6 of the semiconductor module 1. The cut surface of each lead 5 at this cutting step corresponds to the side surface 23b of the third portion 23 of each lead 5 in each semiconductor module 1; a cut surface of the encapsulation resin MR corresponds to the side surface 6b of the encapsulation resin 6 in each semiconductor module 1; and a cut surface of the wiring substrate 31 corresponds to the side surface of the wiring substrate 2 in each semiconductor module 1. In this case, the side surface 23b of the third portion 23 of each lead 5, the side surface 6b of the encapsulation resin 6, the side surface of the wiring substrate 2 are flush with one another. The actual structure of the semiconductor module 1 in FIG. 30 is the same as the structure illustrated in FIG. 1 to FIG. 6.

A mounting step for mounting the manufactured semiconductor module 1 over a mounting board PCB as illustrated in FIG. 9 can be carried out, for example, as described below:

After the mounting board PCB illustrated in FIG. 9 is prepared, solder paste that becomes the solder 25 later is applied to (printed, placed) over the multiple terminals TE1 in the upper surface of the mounting board PCB using a print process or the like. Thereafter, the semiconductor module 1 is set over the upper surface (the main surface on the terminal TE1 formation side) of the mounting board PCB. At this time, positioning is carried out such that (the third portions 23 of) the leads 5 exposed from the encapsulation resin 6 planarly overlap with the terminals TE1 with the solder paste applied thereto and then the semiconductor module 1 is set. Thereafter, solder reflow processing (heat treatment) is carried out to melt and harden the solder paste. (The third portions 23 of) the leads 5 of the semiconductor module 1 are thereby joined (soldered) to the terminals TE1 of the mounting board PCB via the hardened solder 25 as illustrated in FIG. 9.

As a manufacturing process for the semiconductor module 1, a case where the semiconductor module 1 is obtained by the following processing has been described: the electronic components 4 and the lead frame LF are placed over the main surface 31b of the wiring substrate 31 and then the encapsulation resin MR is formed; and thereafter, the electronic components 3 are placed over the main surface 31a of the wiring substrate 31 and then the wiring substrate 31, lead frame LF, and encapsulation resin MR are cut. As another embodiment, the following procedure may be used: the steps up to the encapsulation resin MR formation step are carried out to obtain the structure in FIG. 22 and FIG. 23; thereafter, the step for placing the electronic components 3 over the main surface 31a of the wiring substrate 31 (the step in FIG. 28 and FIG. 29) is not carried out; instead, the step for cutting the wiring substrate 31, lead frame LF, and encapsulation resin MR (the step for cutting at the cutting positions DL) is carried out. In this case, in the semiconductor module 1 segmented at the cutting step, there are no electronic components 3 placed over the upper surface 2a of the wiring substrate 2. The semiconductor module 1 having the structure in FIG. 2 to FIG. 6 may obtained by using the following procedure: the semiconductor module 1 in this state is shipped; and the electronic components 3 are placed over the upper surface 2a of the wiring substrate 2 of the semiconductor module 1 at the destination of shipment (on the customer side).

<Modifications of Semiconductor Module>

Figure 31:
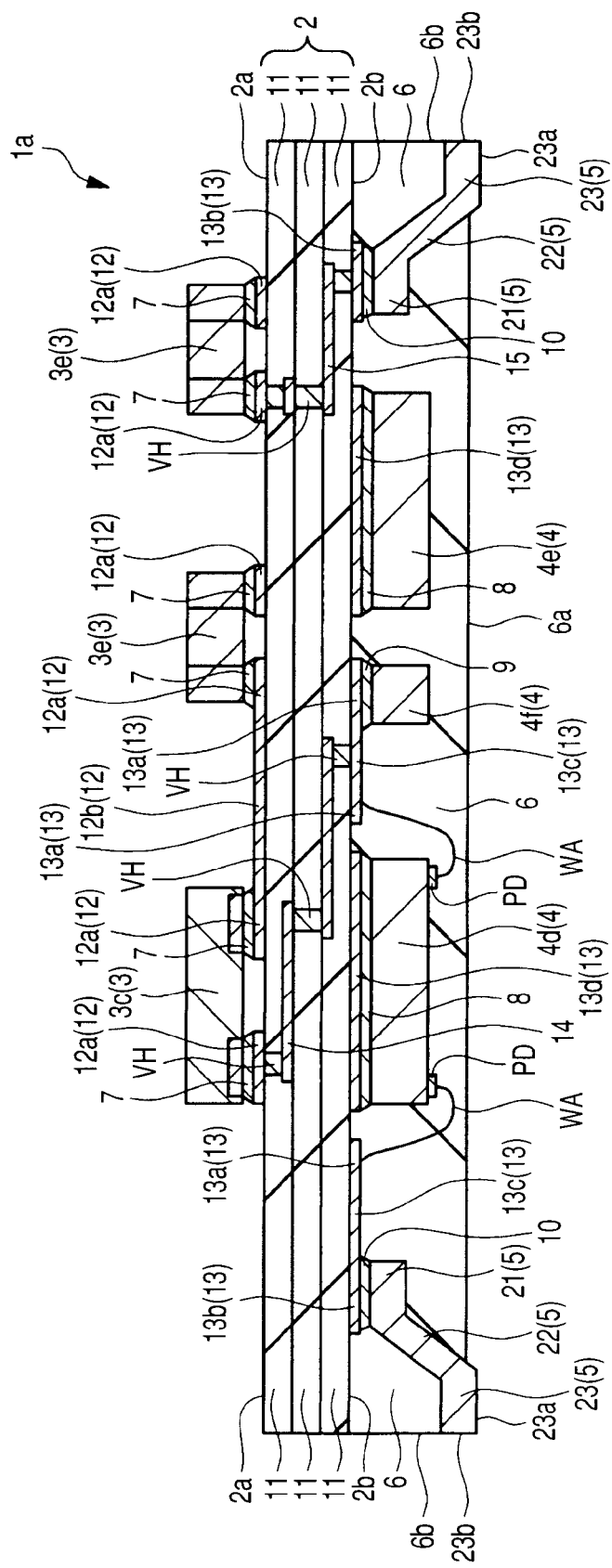
FIG. 31 is a sectional view of a first modification to a semiconductor module in an embodiment of the invention.

FIG. 31 is a sectional view (side surface sectional view) of a first modification (another embodiment) of the semiconductor module 1 in this embodiment and corresponds to FIG. 4. The semiconductor module in the first modification to this embodiment illustrated in FIG. 31 will be marked with reference code 1a and will be designated as semiconductor module 1a.

The semiconductor module 1a illustrated in FIG. 31 is different from the semiconductor module 1 in that: part (upper part, top) of the third portion 23 of each lead 5 is protruded from the main surface 6a of the encapsulation resin 6; that is, the upper surface 23a of the third portion 23 of each lead 5 is protruded from the main surface 6a of the encapsulation resin 6. In other words, the height (distance) from the under surface 2b of the wiring substrate 2 to the upper surface 23a of the third portion 23 of each lead 5 is higher (larger, longer) than the following: the height (distance) from the under surface 2b of the wiring substrate 2 to the main surface 6a of the encapsulation resin 6. The other respects in the configuration of the semiconductor module 1a illustrated in FIG. 31 are the same as those of the semiconductor module 1 and the description thereof will be omitted.

In the semiconductor module 1a illustrated in FIG. 31, as mentioned above, part (the upper surface 23a of) the third portion 23 of each lead 5 is protruded from the main surface 6a of the encapsulation resin 6. As a result, the following can be implemented when the semiconductor module 1a is solder mounted over the mounting board PCB as in FIG. 9: it is possible to more appropriately join together (the upper surface 23a of the third portion 23 of) each lead 5 exposed from the main surface 6a of the encapsulation resin 6 and each terminal TE1 of the mounting board PCB by the solder 25. Therefore, it is possible to further enhance the mounting strength (solder mounting strength) of the semiconductor module 1a. Further, it is possible to further enhance its solder mounting reliability. It is desirable to ensure 5 μm or above of the amount of protrusion of the third portion 23 of each lead 5 from the main surface 6a of the encapsulation resin 6. (This amount of protrusion is equivalent to the difference between the following heights: the height from the under surface 2b of the wiring substrate 2 to the upper surface 23a of the third portion 23 of each lead 5; and the height from the under surface 2b of the wiring substrate 2 to the main surface 6a of the encapsulation resin 6.)

Figure 32:
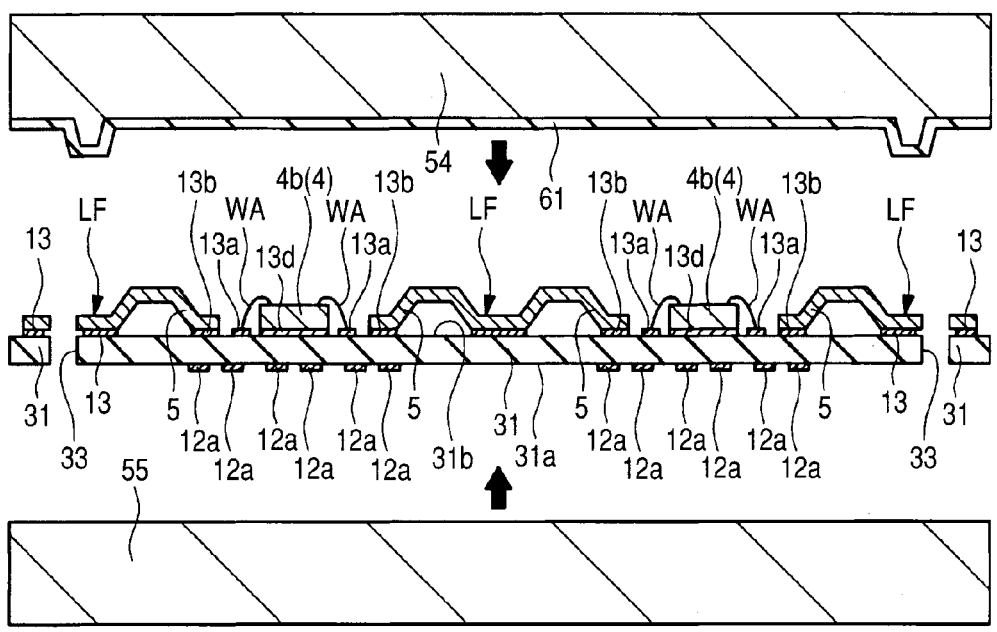
FIG. 32 is an explanatory drawing of a molding step for manufacturing the semiconductor module in FIG. 31.
Figure 33:
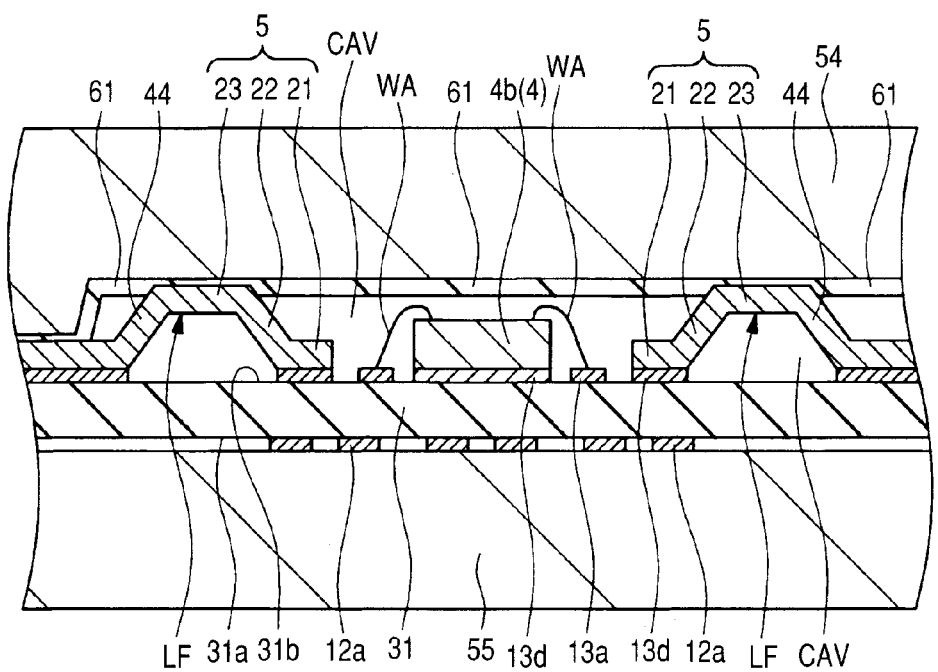
FIG. 33 is an explanatory drawing of a molding step for manufacturing the semiconductor module in FIG. 31.
Figure 34:
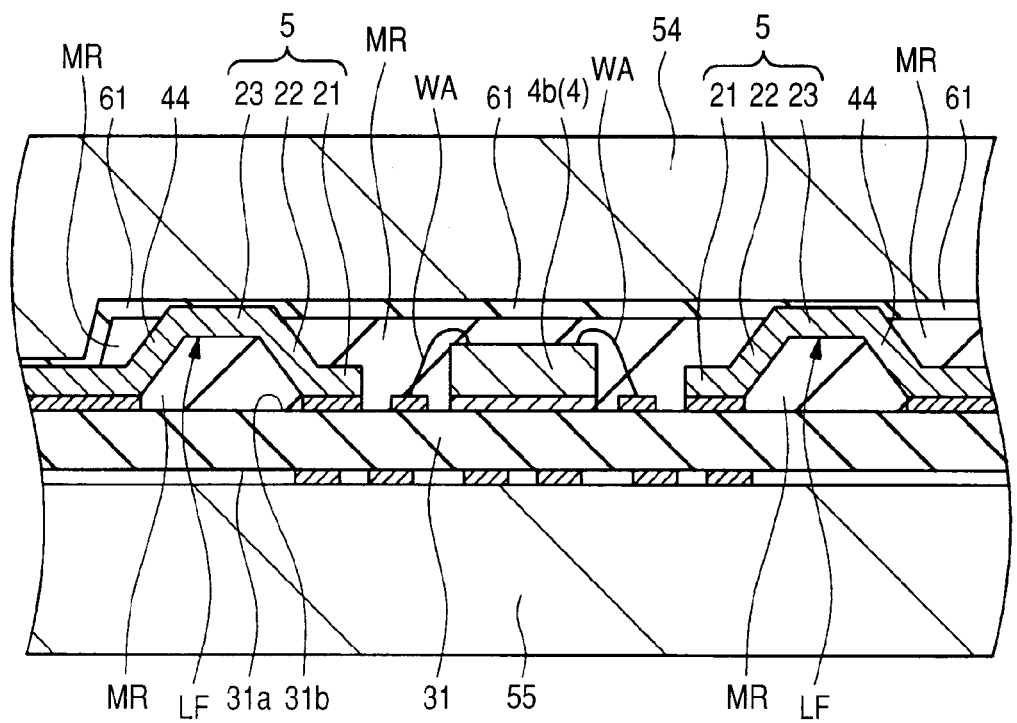
FIG. 34 is an explanatory drawing of a molding step for manufacturing the semiconductor module in FIG. 31.
Figure 35:
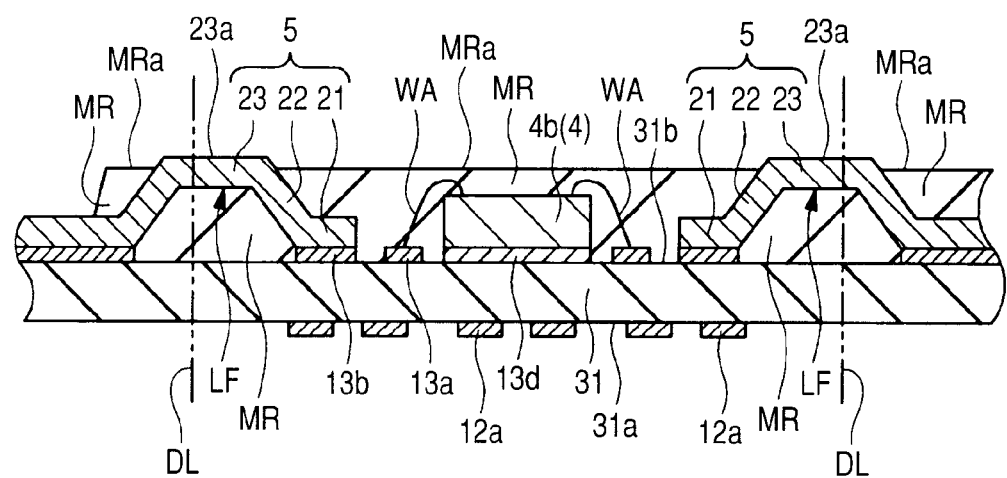
FIG. 35 is an explanatory drawing of a molding step for manufacturing the semiconductor module in FIG. 31.

This semiconductor module 1a can be manufactured, for example, as described below. With respect to the steps other than the molding step (encapsulation resin MR formation step), the semiconductor module 1a can be manufactured similarly with the semiconductor module 1. Therefore, description will be given only to the molding step. FIG. 32 to FIG. 35 are explanatory drawings (substantial part sectional views) of the molding step. FIG. 32 shows an area corresponding to FIG. 24 (area substantially corresponding to two semiconductor module regions 32); however, FIG. 33 to FIG. 35 show an area substantially corresponding to one semiconductor module region 32.

After the steps up to the step in FIG. 21 and FIG. 22 are carried out, the following processing is carried out at the molding step (encapsulation resin MR formation step) for manufacturing the semiconductor module 1a: as illustrated in FIG. 32 and FIG. 33, the wiring substrate 31 with the lead frame LF placed thereover is clamped between the upper die 54 and the lower die 55 from above and below. FIG. 32 schematically illustrates the wiring substrate 31 before it is clamped between the upper die 54 and the lower die 55; and FIG. 33 illustrates the wiring substrate 31 as is clamped between the upper die 54 and the lower die 55. When the wiring substrate 31 is clamped between the upper die 54 and the lower die 55, the following measure is taken: a resin film (resin sheet) 61 as an elastic sheet (elastic film) is placed between the wiring substrate 31 with the lead frame LF placed thereover and the upper die 54. To do this, for example, the following procedure can be used: the resin film 61 is stuck to the under surface (the surface on the side where it is opposed to the main surface 31b of the wiring substrate 31) of the upper die 54 as illustrated in FIG. 32; thereafter, the wiring substrate 31 with the lead frame LF placed thereover is clamped between the upper die 54 and the lower die 55 as illustrated in FIG. 33. The resin film 61 is a resin film (elastic film) having elasticity and, for example, a plastic film or the like can be favorably used as the material thereof. The thickness of the resin film 61 (thickness before the dies are clamped) can be set to, for example, 0.05 mm or so. Since the resin film 61 has elasticity, the following takes place as illustrated in FIG. 33 when the upper die 54 and the lower die 55 are clamped: the third portion 23 of each lead 5 of the lead frame LF is pressed against the resin film 61 and part (upper part) of the third portion 23 of each lead 5 bites (digs, is buried) into the resin film 61.

At the molding step in the manufacture of the semiconductor module 1a, as mentioned above, the wiring substrate 31 is clamped between the upper die 54 and the lower die 55 such that the following is implemented: the upper die (first die) 54 is opposed to the main surface 31b of the wiring substrate 31 with the electronic components 4 and the lead frame LF placed thereover with the resin film 61 as an elastic sheet in-between; and the lower die (second die) 55 is opposed to the main surface 31a of the wiring substrate 31. Then the resin material for the formation of the encapsulation resin MR is injected (introduced) into the cavity CAV formed between the upper die 54 and the lower die 55 and this resin material is cured (by, for example, thermal curing). As a result, the encapsulation resin MR can be formed as illustrated in FIG. 34. Thereafter, the upper die 54 and the lower die 55 are released from each other and the wiring substrate 31 with the encapsulation resin MR formed thereon is taken out as illustrated in FIG. 35. At this time, the resin film 61 is prevented from being left on the encapsulation resin MR side.

Thus the encapsulation resin MR sealing the electronic components 4 and the leads 5 is formed over the main surface 31b of the wiring substrate 31. In FIG. 35, positions that become cutting positions DL at the cutting step (step for cutting the wiring substrate 31, lead frame LF, and encapsulation resin MR) carried out later are indicated by alternate long and two short dashes lines. The subsequent steps are the same as those (steps in FIG. 26 to FIG. 30) in the manufacturing process for the semiconductor module 1.

As mentioned above, the third portion 23 of each lead 5 of the lead frame LF is brought into contact with the resin film 61 having elasticity; and with part (upper part) of the third portion 23 biting into the resin film 61, resin material is injected into the cavity CAV to form the encapsulation resin MR. For this reason, the following is implemented as illustrated in FIG. 34 and FIG. 35: the encapsulation resin MR is not formed over the upper surface 23a of the third portion 23 of each lead 5 of the lead frame LF; and, in addition, part (upper part) of the third portion 23 of each lead 5 is protruded from the main surface MRa (that becomes the main surface 6a of the encapsulation resin 6 later) of the encapsulation resin MR. That is, the upper surface 23a of the third portion 23 of each lead 5 is protruded from the main surface MRa of the encapsulation resin MR. When the encapsulation resin MR is formed with part (upper part) of the third portion 23 of each lead 5 of the lead frame LF eating into the resin film 61, the following is implemented: a resin flash is less prone to be formed on the upper surface 23a of the third portion 23 of each lead 5. This also contributes to protrusion of the upper surface 23a of the third portion 23 of each lead 5 from the main surface MRa of the encapsulation resin MR. Therefore, the structure in which part (upper part) of the third portion 23 of each lead 5 is protruded from the main surface 6a of the encapsulation resin 6 in the semiconductor module 1a as illustrated in FIG. 31 can be obtained.

Figure 36:
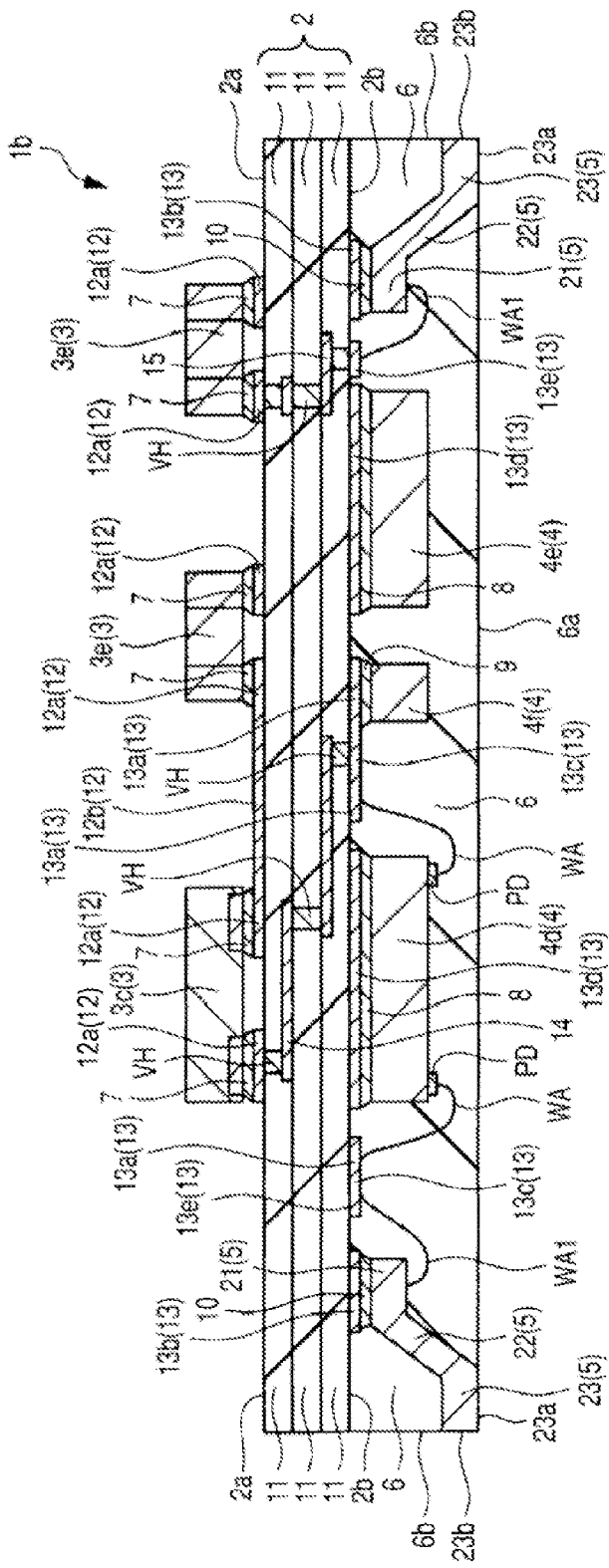
FIG. 36 is a sectional view of a second modification to a semiconductor module in an embodiment of the invention.

FIG. 36 is a sectional view (side surface sectional view) illustrating a second modification (another embodiment) of the semiconductor module 1 in this embodiment and corresponds to FIG. 4. The semiconductor module in the second modification to this embodiment illustrated in FIG. 36 will be marked with reference code 1b and will be designated as semiconductor module 1b.

In the semiconductor module 1 (Refer to FIG. 2 to FIG. 8), the electrode pads 13b to which the third portion 23 of each lead 5 is joined and electrically coupled via the joining material 10 are coupled as follows: they are electrically coupled to electrode pads 13a in the under surface 2b of the wiring substrate 2 via the wirings 13c in the under surface 2b of the wiring substrate 2; or they are electrically coupled to electrode pads 12a in the upper surface 2a of the wiring substrate 2 via vias VH, conductor patterns 14, 15, or the like in the wiring substrate 2. The electrode pads 13a in the under surface 2b of the wiring substrate 2 electrically coupled to the electrode pads 13b are electrically coupled with the following (via the wire WA or the solder 9): electrodes of the electronic components 4 placed over the under surface 2b of the wiring substrate 2. The electrode pads 12a in the upper surface 2a of the wiring substrate 2 electrically coupled to the electrode pads 13b are electrically coupled with the following (via the solder 7 or the bump electrodes BP): electrodes of the electronic components 3 placed over the upper surface 2a of the wiring substrate 2. Therefore, each lead 5 is electrically coupled to any of the electronic components 3, 4 comprising the semiconductor module 1. This electrical coupling is carried out by way of the conductive joining material 10, a conductor layer of the wiring substrate 2, a wire WA, the solder 7, 9, and a bump electrode BP as required.

The semiconductor module 1b illustrated in FIG. 36 is identical with the semiconductor module 1 in that each lead 5 is electrically coupled to any of the electronic components 3, 4 comprising the semiconductor module 1b. However, it is different from the semiconductor module 1 in that each lead 5 is electrically coupled to any of the electronic components 3, 4 comprising the semiconductor module 1b via a wire (third conductive member) WA1.

More specific description will be given. In the semiconductor module 1b illustrated in FIG. 36, the third portion 23 of each lead 5 is joined to an electrode pad 13b via the joining material 10. This is done to fix each lead 5 in the wiring substrate 2. Then the following are electrically coupled together via a conductive wire (bonding wire) WA1: the upper surface (the surface on the side opposite the side where it is opposed to an electrode pad 13b) of the first portion 21 of each lead 5; and an electrode pad 13e provided in the under surface 2b of the wiring substrate 2. That is, one end of the wire WA1 is bonded to the upper surface of the first portion 21 of the lead 5 and the other end of the wire WA1 is bonded to the electrode pad 13e. The wire WA1 is the same as the wire WA bonded to the semiconductor chips 4a, 4b, 4c, 4d, 4e and a step for bonding the wire WA1 can be carried out at the same time as a step for bonding the wire WA. When the bonding step for the wire WA1 is carried out at the same time as the bonding step for the wire WA, increase in the number of manufacturing process steps can be prevented. To facilitate bonding of the wire WA1, it is more desirable to form a plating layer such as Ag plate over each lead 5, at least its surface where a wire WA1 is to be bonded. (In this example, the surface of the lead 5 is the upper surface of the first portion 21 of the lead 5.) Since the wire WA1 is conductive, it can be considered as a conductive member for electrically coupling each lead 5 to an electrode pad 13e in the under surface 2b of the wiring substrate 2. The multiple electrode pads 12a, 13a, 13e of the wiring substrate 2 are electrically coupled together though a conductor layer (the conductor patterns 12, 13, 14, 15 and the vias VH) of the wiring substrate 2.

In the semiconductor module 1b illustrated in FIG. 36, the following measure is taken with respect to the electrode pads 13e to which the wires WA1 are bonded: they are electrically coupled to electrode pads 13a in the under surface 2b of the wiring substrate 2 via the wirings 13c in the under surface 2b of the wiring substrate 2; or they are electrically coupled to electrode pads 12a in the upper surface 2a of the wiring substrate 2 via vias VH, conductor patterns 14, 15, or the like in the wiring substrate 2. In the semiconductor module 1b illustrated in FIG. 36, therefore, each lead 5 is electrically coupled to any of the electronic components 3, 4 comprising the semiconductor module 1b as follows: it is electrically coupled by way of a wire WA1 first and in addition by way of a conductor layer in the wiring substrate 2, a wire WA, the solder 7, 9, and a bump electrode BP as required. The joining material 10 joining each lead 5 with a wire WA1 bonded thereto to an electrode pad 13d may be conductive or may be insulating. The other respects in the configuration of the semiconductor module 1b illustrated in FIG. 36 are the same as those of the semiconductor module 1 and the description thereof will be omitted.

In the semiconductor module 1b illustrated in FIG. 36, part (upper part, upper surface) of the third portion 23 of each lead 5 may be protruded from the main surface 6a of the encapsulation resin 6 as in the semiconductor module 1a illustrated in FIG. 31. A wire WA1 may be bonded to all the leads 5 provided in the semiconductor module 1b. Or, both leads 5 with a wire WA1 bonded thereto and leads 5 without a wire WA1 bonded thereto may exist together. (The leads 5 without a wire WA1 bonded thereto are identical with the leads 5 in the semiconductor module 1 in configuration and coupling relation.)

In the semiconductor module 1 (Refer to FIG. 2 to FIG. 8), the leads 5 are electrically coupled to electrode pads 13b in the under surface 2b of the wiring substrate 2 via the conductive joining material 10; and these electrode pads 13b are electrically coupled to electrodes 12a, 13a in the wiring substrate via a conductor layer in the wiring substrate 2. In the semiconductor module 1b illustrated in FIG. 36, meanwhile, the leads 5 are electrically coupled to electrode pads 13e in the under surface 2b of the wiring substrate 2 via a wire WA1; and these electrode pads 13e are electrically coupled to electrodes 12a, 13a in the wiring substrate via a conductor layer in the wiring substrate 2.

Figure 37:
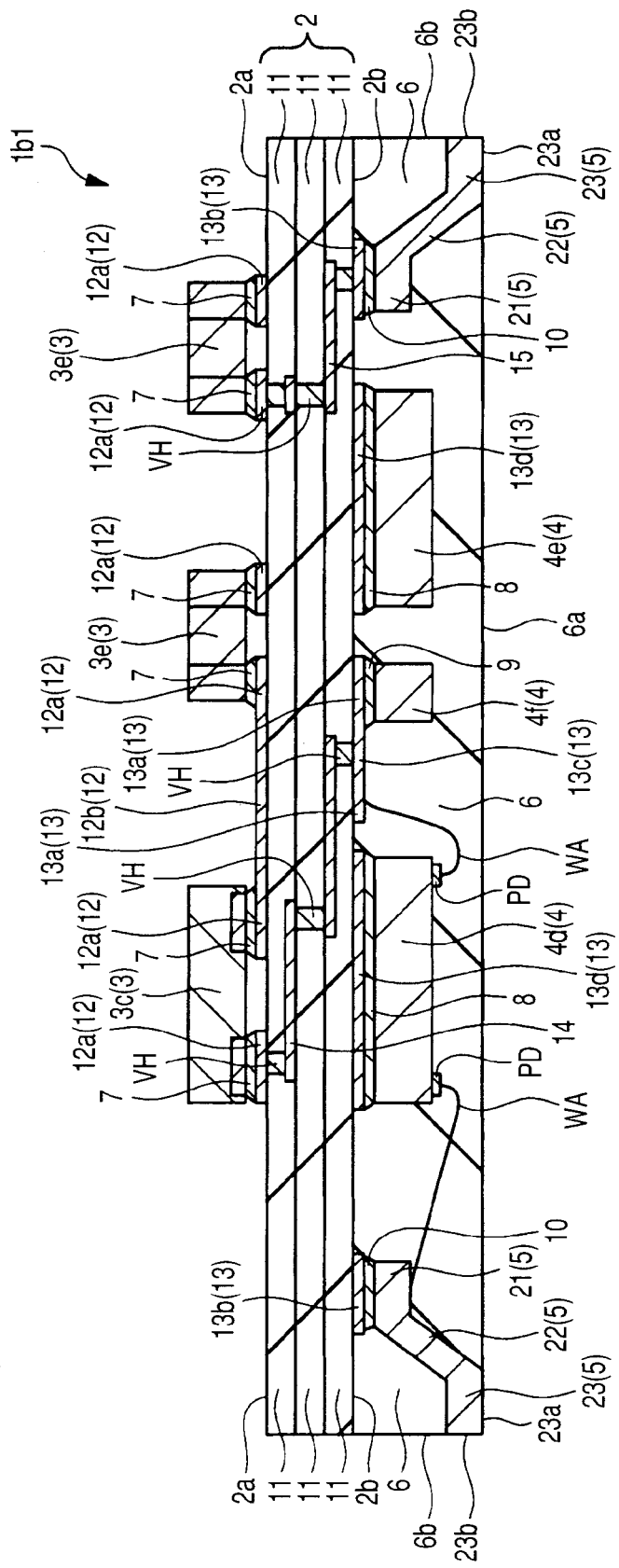
FIG. 37 is a sectional view illustrating a modification to a semiconductor module in which the electrodes of semiconductor chips and leads are directly joined together via wires.

As further another embodiment (modification), the following measure may be taken instead of the wire WA1 as in the semiconductor module 1b1 illustrated in FIG. 37: the other end of a wire WA one end of which is bonded to any electrode PD of the semiconductor chips 4a, 4b, 4c, 4d, 4e is bonded to the upper surface of the first portion 21 of each lead 5. FIG. 37 is a sectional view (side surface sectional view) of the semiconductor module 1b1 in which the electrodes PD of the semiconductor chips 4a, 4b, 4c, 4d, 4e and (the upper surface of) the first portion 21 of each lead 5 are directly joined together via a wire WA. The configuration of the semiconductor module 1b1 illustrated in FIG. 37 is the same as that of the semiconductor module 1, semiconductor module 1a, semiconductor module 1b, or the semiconductor module 1c described later, except that: (the upper surfaces of the first portions 21 of) some or all of the leads 5 are directly joined to any of the electrodes PD of the semiconductor chips 4a, 4b, 4c, 4d, 4e via a wire WA.

In the semiconductor module 1b1 illustrated in FIG. 37, some or all of the leads 5 are respectively directly coupled with the electrodes PD of the semiconductor chips 4a, 4b, 4c, 4d, 4e via wires WA. Each lead 5 with one end of a wire WA bonded thereto is electrically coupled to an electrode PD (any electrode PD of the semiconductor chips 4a, 4b, 4c, 4d, 4e) with the other end of the wire WA bonded thereto via the wire WA. (That is, each lead 5 with one end of a wire WA bonded thereto is electrically coupled to an electrode PD without intervention of a conductor layer in the wiring substrate 2.) This makes it possible to electrically couple together a lead 5 and an electrode PD via a wire WA; therefore, it is possible to suppress or prevent the production of surplus parasitic resistance and reduce the area of the wiring substrate 2, that is, the area of the semiconductor module 1b1.

Figure 38:
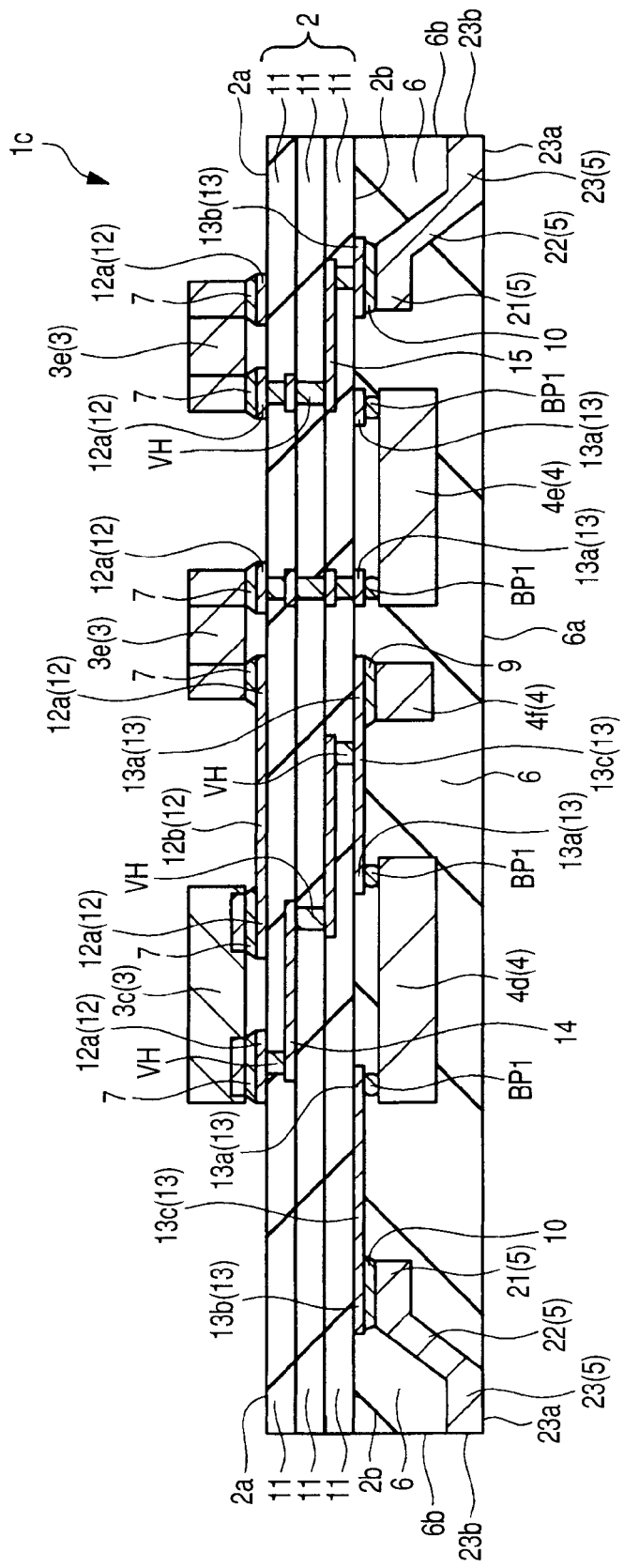
FIG. 38 is a sectional view of a third modification to a semiconductor module in an embodiment of the invention.

FIG. 38 is a sectional view (side surface sectional view) illustrating a third modification (another embodiment) of the semiconductor module 1 in this embodiment and corresponds to FIG. 4. The semiconductor module in the third modification to this embodiment illustrated in FIG. 38 will be marked with reference code 1c and will be designated as semiconductor module 1c.

In the semiconductor module 1 (Refer to FIG. 2 to FIG. 8), the following measure is taken when a semiconductor chip (the semiconductor chips 4a, 4b, 4c, 4d, 4e in this example) is placed over the under surface 2b of the wiring substrate 2: it is die bonded face up and then wire bonding (electrical coupling via a wire WA) is carried out. In the semiconductor module 1c illustrated in FIG. 38, meanwhile, the following measure is taken when a semiconductor chip (the semiconductor chips 4a, 4b, 4c, 4d, 4e in this example) is placed over the under surface 2b of the wiring substrate 2: it is die bonded face down and then flip chip coupling (electrical coupling via a bump electrode BP1) is carried out. That is, in the semiconductor module 1c illustrated in FIG. 38, the following measure is taken with respect to a semiconductor chip (the semiconductor chips 4a, 4b, 4c, 4d, 4e in this example) placed over the under surface 2b of the wiring substrate 2: it is joined (mechanically coupled) and electrically coupled to an electrode pad 13a in the under surface 2b of the wiring substrate 2 via a bump electrode (second conductive member) BP1. The bump electrode BP1 is desirably a solder bump. The other respects in the configuration of the semiconductor module 1c illustrated in FIG. 38 are the same as those of the semiconductor module 1 and the description thereof will be omitted. Since the bump electrode BP1 is conductive, it can be considered as a conductive member for electrically coupling an electronic component 4 to an electrode pad 13a in the under surface 2b of the wiring substrate 2. (The electronic component 4 is the semiconductor chips 4a, 4b, 4c, 4d, 4e in this example.)

In the semiconductor module 1c illustrated in FIG. 38, part (upper part, upper surface) of the third portion 23 of each lead 5 may be protruded from the main surface 6a of the encapsulation resin 6 as in the semiconductor module 1a illustrated in FIG. 31. In the semiconductor module 1c illustrated in FIG. 38, the leads 5 can also be coupled using a wire WA1, WA as in the semiconductor module 1b, 1b1 illustrated in FIG. 36 or FIG. 37. However, since wire bonding for the semiconductor chips 4a, 4b, 4c, 4d, 4e is not carried out, it is advantageous to suppressing increase in the number of manufacturing process steps to avoid coupling of the leads 5 with use of the wire WA1, WA.

In the semiconductor module 1c illustrated in FIG. 38, a semiconductor chip placed over the under surface 2b of the wiring substrate 2 is flip chip coupled (flip chip mounted). (The semiconductor chip is the semiconductor chips 4a, 4b, 4c, 4d, 4e in this example.) This makes it possible to reduce the thickness of the encapsulation resin 6. Since the thickness of the encapsulation resin 6 can be reduced, the height (the height from the under surface 2b of the wiring substrate 2 to the upper surface 23a of the third portion 23) of each lead 5 can be reduced. For this reason, the semiconductor module 1c can be reduced in thickness.

Figure 39:
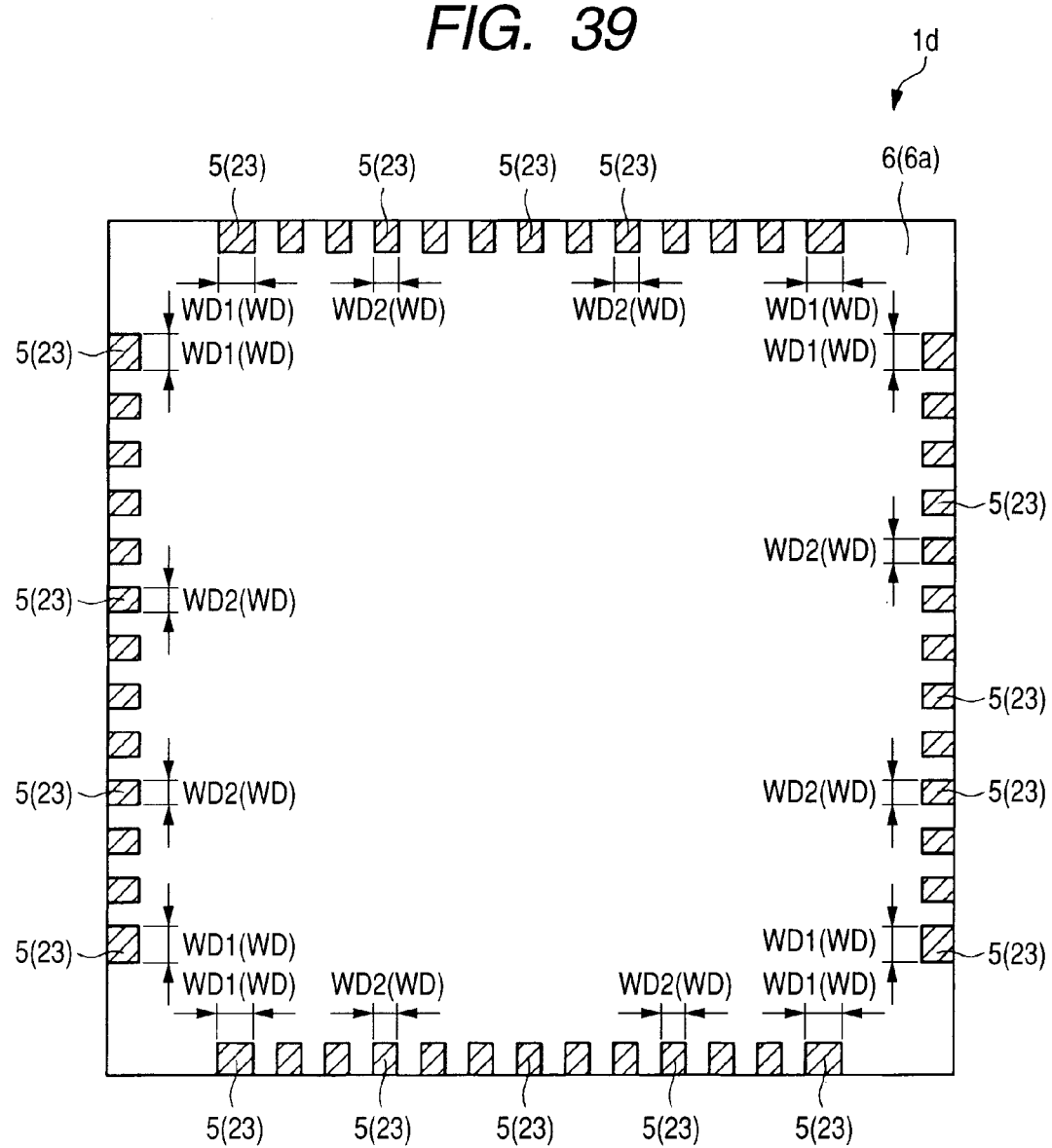
FIG. 39 is a bottom view of a fourth modification to a semiconductor module in an embodiment of the invention.
Figure 40:
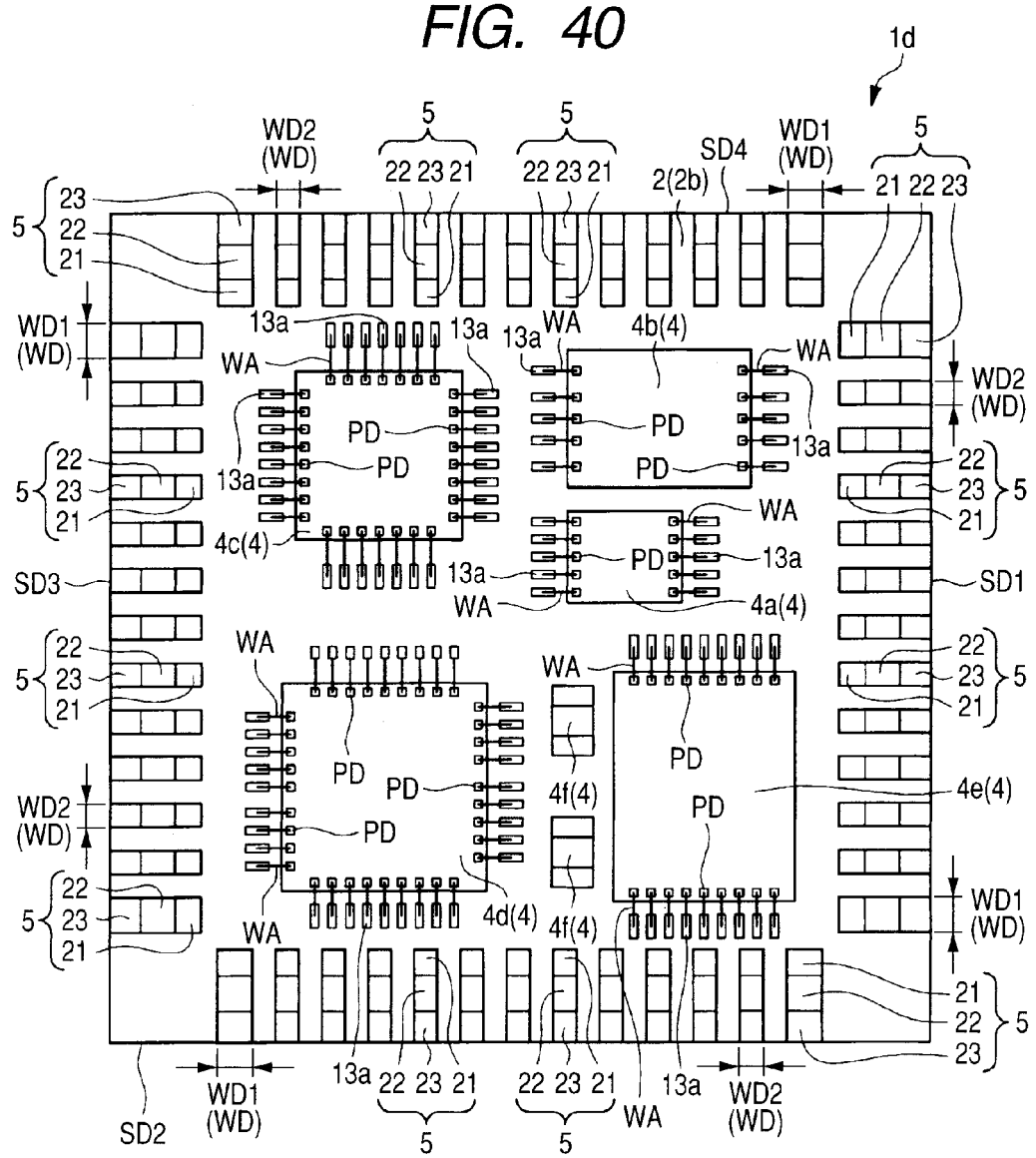
FIG. 40 is a transparent bottom view of the semiconductor module in FIG. 39.

FIG. 39 and FIG. 40 are a bottom view (plan view) and a transparent bottom view illustrating a fourth modification (another embodiment) of the semiconductor module 1 in this embodiment and respectively correspond to FIG. 3 and FIG. 6. The semiconductor module in the fourth modification to this embodiment illustrated in FIG. 39 and FIG. 40 will be marked with reference code 1d and will be designated as semiconductor module 1d. FIG. 40 shows a bottom view of the semiconductor module 1d as is seen via the encapsulation resin 6. Though FIG. 39 is a plan view, the leads 5 exposed from the encapsulation resin 6 are hatched to facilitate visualization.

In the semiconductor module 1 (Refer to FIG. 2 to FIG. 8), multiple leads 5 are placed over peripheral edge portions of the under surface 2b of the wiring substrate 2. The leads 5 are set along two opposite sides (sides SD1, SD3) of the under surface 2b of the wiring substrate 2. In the semiconductor module 1d illustrated in FIG. 39 and FIG. 40, meanwhile, multiple leads 5 are placed over peripheral edge portions of the under surface 2b of the wiring substrate 2. The leads 5 are set (arranged) along the four sides (sides SD1, SD2, SD3, SD4) of the under surface 2b of the wiring substrate 2. The other respects in the configuration of the semiconductor module 1d illustrated in FIG. 39 and FIG. 40 are the same as those of the semiconductor module 1 and the description thereof will be omitted. In the semiconductor module 1a illustrated in FIG. 31, the semiconductor module 1b illustrated in FIG. 36, the semiconductor module 1b1 illustrated in FIG. 37, and the semiconductor module 1c illustrated in FIG. 38, the following measure may be taken: multiple leads 5 may be set (arranged) along the four sides of the under surface 2b of the wiring substrate 2 as in the semiconductor module 1d illustrated in FIG. 39 and FIG. 40.

In the semiconductor module 1d illustrated in FIG. 39 and FIG. 40, as mentioned above, the number of sides on which leads 5 are arranged is increased. As a result, it is possible to suppress increase in the area of the semiconductor module 1d (wiring substrate 2) and yet increase the number of leads 5 and to increase the number of the terminals of the semiconductor module 1d.

Up to this point, concrete description has been give to the invention made by the present inventors based on embodiments thereof. However, the invention is not limited to the above embodiments and can be variously modified without departing from the subject matter thereof, needless to add.

The invention is favorably applicable to an electronic device obtained by placing an electronic component over a wiring substrate and a manufacturing method therefor.

What is claimed is:

1. An electronic device comprising:
a wiring substrate including an upper surface, a plurality of first electrode pads formed over the upper surface, and under surface opposed to the upper surface, a plurality of second electrode pads formed over the under surface, and a plurality of third electrode pads formed over the under surface;
at least one first electronic component placed over the upper surface of the wiring substrate and electrically coupled with corresponding ones of the first electrode pads via corresponding first conductive members;
at least one second electronic component placed over the under surface of the wiring substrate and electrically coupled with corresponding ones of the second electrode pads via corresponding second conductive members;
a plurality of leads placed over the under surface of the wiring substrate and electrically coupled with the third electrode pads via corresponding third conductive members; and
a sealing body formed over the under surface of the wiring substrate and sealing the second electronic component and the leads,
wherein each lead includes a first portion extended along the under surface of the wiring substrate, a second portion formed integrally with the first portion and bent from the first portion in a direction away from the under surface of the wiring substrate, and a third portion formed integrally with the second portion and bent from the second portion,
wherein the third portion is positioned closer to the peripheral edge portion side of the under surface of the wiring substrate than the first portion, and arranged at a position farther from the under surface of the wiring substrate than the first portion,
wherein each lead is covered with the sealing body such that the third portion is exposed from the front surface and side surface of the sealing body,
wherein the sealing body is not formed over the upper surface of the wiring substrate and the first electronic component is exposed,
wherein the second electronic component includes a semiconductor chip,
wherein the third portion of each lead exposed from the sealing body functions as a terminal external coupling,
wherein the third portion of each the lead exposed from the sealing body functions as a terminal for external coupling for solder mounting,
wherein the surfaces of the third portion of each lead exposed from the front surface and the side surface of the sealing body are contiguous,
wherein over the upper surface of the wiring substrate, there is placed no wire-bonded electronic component,
wherein the third portion of each lead is bent from the second portion and extended in a direction parallel with the first portion,
wherein predetermined first, second, and third electrode pads are electrically coupled together via a conductor layer in the wiring substrate,
wherein in the under surface of the wiring substrate, the third electrode pads are positioned closer to the peripheral edge portion side of the under surface than the second electrode pads,
wherein the sealing body is a resin sealing body,
wherein each of the first conductive members is solder,
wherein the first portion of each lead is coupled to a corresponding third electrode pad via the corresponding third conductive member, and
wherein each of the third conductive members is solder.

2. The electronic device according to claim 1,
wherein over the upper surface of the wiring substrate, there are placed a plurality of the first electronic components and the first electronic components are electrically coupled with corresponding ones of the first electrode pads via corresponding first conductive members,
wherein over the under surface of the wiring substrate, there are placed a plurality of the second electronic components and the second electronic components are electrically coupled with corresponding ones of the second electrode pads via corresponding second conductive members, and
wherein the sealing body seals the second electronic components.

3. The electronic device according to claim 2,
wherein the second conductive members include bonding wires.

4. The electronic device according to claim 3,
wherein part of the third portion of each lead is protruded from the front surface of the sealing body.

5. The electronic device according to claim 2,
wherein the second conductive members include bump electrodes.

6. An electronic device comprising:
a wiring substrate including an upper surface, a plurality of first electrode pads formed over the upper surface, an under surface opposed to the upper surface, a plurality of second electrode pads formed over the under surface, and a plurality of third electrode pads formed over the under surface;
at least one first electronic component placed over the upper surface of the wiring substrate and electrically coupled with corresponding ones of the first electrode pads via corresponding first conductive members;
at least one second electronic component placed over the under surface of the wiring substrate and electrically coupled with corresponding ones of the second electrode pads via corresponding second conductive members;
a plurality of leads placed over the under surface of the wiring substrate and electrically coupled with the third electrode pads via corresponding third conductive members; and
a sealing body formed over the under surface of the wiring substrate and sealing the second electronic component and the leads,
wherein each lead includes a first portion extended along the under surface of the wiring substrate, a second portion formed integrally with the first portion and bent from the first portion in a direction away from the under surface of the wiring substrate, and a third portion formed integrally with the second portion and bent from the second portion, wherein the third portion is positioned closer to the peripheral edge portion side of the under surface of the wiring substrate than the first portion, and arranged at a position farther from the under surface of the wiring substrate than the first portion, wherein each lead is covered with the sealing body such that the third portion is exposed from the front surface and side surface of the sealing body, wherein the first portion of each lead is coupled to a corresponding third electrode pad via the corresponding third conductive member, and wherein each of the third conductive members is solder.

7. The electronic device according to claim 6, wherein over the upper surface of the wiring substrate, there are placed a plurality of the first electronic components and the first electronic components are electrically coupled with corresponding ones of the first electrode pads via corresponding first conductive members, wherein over the under surface of the wiring substrate, there are placed a plurality of the second electronic components and the second electronic components are electrically coupled with corresponding ones of the second electrode pads via corresponding second conductive members, and wherein the sealing body seals the second electronic components.

8. The electronic device according to claim 7, wherein the second conductive members include bonding wires.

9. The electronic device according to claim 8, wherein part of the third portion of each lead is protruded from the front surface of the sealing body.

10. The electronic device according to claim 7, wherein the second conductive members include bump electrodes.

* * * * *